(12) United States Patent
Nonaka et al.

(10) Patent No.: US 11,239,237 B2
(45) Date of Patent: Feb. 1, 2022

(54) SEMICONDUCTOR DEVICE

(71) Applicant: Semiconductor Energy Laboratory Co., Ltd., Atsugi (JP)

(72) Inventors: Yusuke Nonaka, Atsugi (JP); Noritaka Ishihara, Koza (JP); Tomoki Hiramatsu, Koto (JP); Ryunosuke Honda, Isehara (JP); Tomoyo Kamogawa, Kako (JP); Ryota Hodo, Atsugi (JP); Katsuaki Tochibayashi, Isehara (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 8 days.

(21) Appl. No.: 16/961,976

(22) PCT Filed: Jan. 15, 2019

(86) PCT No.: PCT/IB2019/050285
§ 371 (c)(1),
(2) Date: Jul. 14, 2020

(87) PCT Pub. No.: WO2019/145819
PCT Pub. Date: Aug. 1, 2019

(65) Prior Publication Data
US 2021/0082920 A1    Mar. 18, 2021

(30) Foreign Application Priority Data

Jan. 25, 2018 (JP) .............................. JP2018-010166
Feb. 23, 2018 (JP) .............................. JP2018-030372

(51) Int. Cl.
*H01L 27/108* (2006.01)
*H01L 21/02* (2006.01)
(Continued)

(52) U.S. Cl.
CPC ...... *H01L 27/108* (2013.01); *H01L 21/02565* (2013.01); *H01L 27/1156* (2013.01); *H01L 29/78648* (2013.01)

(58) Field of Classification Search
None
See application file for complete search history.

(56) References Cited

U.S. PATENT DOCUMENTS 9,281,408 B2   3/2016   Yamazaki et al.
9,281,409 B2   3/2016   Yamazaki et al.
(Continued)

FOREIGN PATENT DOCUMENTS

CN      105190902 A      12/2015
DE      102014208859     11/2014
(Continued)

OTHER PUBLICATIONS

International Search Report (Application No. PCT/IB2019/050285) dated Apr. 9, 2019.
(Continued)

*Primary Examiner* — Anthony Ho
*Assistant Examiner* — Kevin Quinto
(74) *Attorney, Agent, or Firm* — Robinson Intellectual Property Law Office; Eric J. Robinson

(57) ABSTRACT

A semiconductor device having high operation frequency is provided. The semiconductor device includes a transistor including a first conductive layer, a first insulating layer, a second insulating layer, a first oxide, a second oxide, a third oxide, a third insulating layer, and a second conductive layer that are stacked in this order, and a fourth insulating layer. The first conductive layer and the second conductive layer include a region overlapping with the second oxide. In a channel width direction of the transistor, a level of the bottom surface of the second oxide is from more than or
(Continued)

equal to −5 nm to less than 0 nm when a level of a region of the bottom surface of the second conductive layer which does not overlap with the second oxide is regarded as a reference.

10 Claims, 21 Drawing Sheets

(51) Int. Cl.
    *H01L 27/1156*    (2017.01)
    *H01L 29/786*     (2006.01)

(56) References Cited

U.S. PATENT DOCUMENTS

| | | | |
|---|---|---|---|
| 9,337,344 | B2 | 5/2016 | Hanaoka |
| 9,431,547 | B2 | 8/2016 | Yamazaki et al. |
| 9,741,794 | B2 | 8/2017 | Yamazaki |
| 9,768,317 | B2 | 9/2017 | Ito et al. |
| 9,837,552 | B2 | 12/2017 | Yamazaki et al. |
| 9,847,429 | B2 | 12/2017 | Yamazaki et al. |
| 9,905,695 | B2 | 2/2018 | Hanaoka |
| 10,056,497 | B2 | 8/2018 | Tanaka et al. |
| 10,128,384 | B2 | 11/2018 | Yamazaki et al. |
| 10,411,136 | B2 | 9/2019 | Yamazaki et al. |
| 10,720,532 | B2 | 7/2020 | Yamazaki et al. |
| 2014/0332800 | A1 | 11/2014 | Hanaoka |
| 2014/0339560 | A1 | 11/2014 | Yamazaki et al. |
| 2014/0361293 | A1 | 12/2014 | Yamazaki et al. |
| 2015/0021596 | A1 | 1/2015 | Yamazaki et al. |
| 2015/0034949 | A1 | 2/2015 | Yamazaki |
| 2015/0179774 | A1* | 6/2015 | Yamazaki ........... H01L 21/0262 438/104 |
| 2016/0163870 | A1 | 6/2016 | Ito et al. |
| 2016/0308060 | A1 | 10/2016 | Tanaka et al. |
| 2018/0350997 | A1 | 12/2018 | Tanaka et al. |

FOREIGN PATENT DOCUMENTS

| | | |
|---|---|---|
| JP | 2014-239213 A | 12/2014 |
| JP | 2015-005740 A | 1/2015 |
| JP | 2015-015457 A | 1/2015 |
| JP | 2015-038974 A | 2/2015 |
| JP | 2015-053477 A | 3/2015 |
| JP | 2016-111369 A | 6/2016 |
| JP | 2016-208023 A | 12/2016 |
| KR | 2014-0136381 A | 11/2014 |
| KR | 2016-0006718 A | 1/2016 |
| TW | 201501313 | 1/2015 |
| TW | 201505161 | 2/2015 |
| TW | 201707204 | 2/2017 |
| WO | WO-2014/181785 | 11/2014 |

OTHER PUBLICATIONS

Written Opinion (Application No. PCT/IB2019/050285) dated Apr. 9, 2019.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn-Oxide Semiconductor and its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Amano.S et al., "Low Power LC Display Using In—Ga—Zn-Oxide TFTs Based on Variable Frame Frequency", SID Digest'10 : SID International Symposium Digest of Technical Papers, May 23, 2010, vol. 41, No. 1, pp. 626-629.

\* cited by examiner

SEMICONDUCTOR DEVICE

TECHNICAL FIELD

One embodiment of the present invention relates to a semiconductor device and a method for manufacturing the semiconductor device. Another embodiment of the present invention relates to a semiconductor wafer, a module, and an electronic device.

Note that in this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. In some cases, it can be said that a display device (e.g., a liquid crystal display device and a light-emitting display device), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition (composition of matter).

BACKGROUND ART

A silicon-based semiconductor material is widely known as a semiconductor thin film that can be used in a transistor, and as other materials, oxide semiconductors have attracted attention. As the oxide semiconductor, not only single-component metal oxides, such as indium oxide and zinc oxide, but also multi-component metal oxides are known. Among the multi-component metal oxides, in particular, an In—Ga—Zn oxide (hereinafter also referred to as IGZO) has been actively researched.

In researches on IGZO, a CAAC (c-axis aligned crystalline) structure and an nc (nanocrystalline) structure, which are not a single crystal nor amorphous, have been found in the oxide semiconductor (see Non-Patent Document 1 to Non-Patent Document 3). Non-Patent Document 1 and Non-Patent Document 2 also disclose techniques for fabricating a transistor using an oxide semiconductor having a CAAC structure. Moreover, Non-Patent Document 4 and Non-Patent Document 5 show that a fine crystal is included even in an oxide semiconductor which has lower crystallinity than the CAAC structure or the nc structure.

A transistor using IGZO for an active layer has an extremely low off-state current (see Non-Patent Document 6), and LSI and a display utilizing the feature have been reported (see Non-Patent Document 7 and Non-Patent Document 8).

REFERENCE

Non-Patent Document

[Non-Patent Document 1] S. Yamazaki et al., "SID Symposium Digest of Technical Papers", 2012, volume 43, issue 1, pp. 183-186.
[Non-Patent Document 2] S. Yamazaki et al., "Japanese Journal of Applied Physics", 2014, volume 53, Number 4S, pp. 04ED18-1-04ED18-10.
[Non-Patent Document 3] S. Ito et al., "The Proceedings of AM-FPD'13 Digest of Technical Papers", 2013, pp. 151-154.
[Non-Patent Document 4] S. Yamazaki et al., "ECS Journal of Solid State Science and Technology", 2014, volume 3, issue 9, pp. Q3012-Q3022.
[Non-Patent Document 5] S. Yamazaki, "ECS Transactions", 2014, volume 64, issue 10, pp. 155-164.
[Non-Patent Document 6] K. Kato et al., "Japanese Journal of Applied Physics", 2012, volume 51, pp. 021201-1-021201-7.
[Non-Patent Document 7] S. Matsuda et al., "2015 Symposium on VLSI Technology Digest of Technical Papers", 2015, pp. T216-T217.
[Non-Patent Document 8] S. Amano et al., "SID Symposium Digest of Technical Papers", 2010, volume 41, issue 1, pp. 626-629.

SUMMARY OF THE INVENTION

Problems to be Solved by the Invention

An object of one embodiment of the present invention is to provide a semiconductor device with a high on-state current. Another object of one embodiment of the present invention is to provide a semiconductor device with high operation frequency. Another object of one embodiment of the present invention is to provide a highly reliable semiconductor device. Another object of one embodiment of the present invention is to provide a semiconductor device that can be miniaturized or highly integrated. Another object of one embodiment of the present invention is to provide a semiconductor device having favorable electrical characteristics. Another object of one embodiment of the present invention is to provide a semiconductor device with high productivity.

An object of one embodiment of the present invention is to provide a semiconductor device capable of retaining data for along time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a semiconductor device with low power consumption. Another object of one embodiment of the present invention is to provide a novel semiconductor device.

Note that the descriptions of the objects do not disturb the existence of other objects. One embodiment of the present invention does not have to achieve all of the objects. Other objects will be apparent from and can be derived from the description of the specification, the drawings, the claims, and the like.

Means for Solving the Problems

One embodiment of the present invention is a semiconductor device a transistor, and the transistor comprises a first conductive layer, a first insulating layer over the first conductive layer, a second insulating layer over the first insulating layer, a first oxide over the second insulating layer, a second oxide over the first oxide, a third oxide over the second oxide, a third insulating layer over the third oxide, a second conductive layer over the third insulating layer, and a fourth insulating layer; the first conductive layer and the second conductive layer include a region overlapping with the second oxide; side surfaces of the second conductive layer, the third insulating layer, and the third oxide are substantially aligned; the fourth insulating layer is in contact with side surfaces of the second conductive layer, the third insulating layer, and the third oxide, and part of the top surface of the second oxide; and in the channel width direction of the transistor, the bottom surface of the second oxide is positioned below a region of the bottom surface of the second conductive layer which does not overlap with the second oxide and the first oxide, and when a level of the region of the bottom surface of the second conductive layer which does not overlap with the second oxide and the first oxide is regarded as a reference, a level of the bottom surface of the second oxide is from more than or equal to −5 nm to less than 0 nm.

Another embodiment of the present invention is a semiconductor device including a transistor, and the transistor includes a first conductive layer, a first insulating layer over the first conductive layer, a second insulating layer over the first insulating layer, a first oxide over the second insulating layer, a second oxide over the first oxide, a third oxide over the second oxide, a third insulating layer over the third oxide, a second conductive layer over the third insulating layer, a third conductive layer and a fourth conductive layer over the second oxide, a fifth conductive layer over the third conductive layer, and a sixth conductive layer over the fourth conductive layer; the first conductive layer and the second conductive layer include a region overlapping with the second oxide; the fifth conductive layer includes a region in contact with a side surface of the third conductive layer on the second conductive layer side, and in contact with the top surface of the second oxide; the sixth conductive layer includes a region in contact with a side surface of the fourth conductive layer on the second conductive layer side, and in contact with the top surface of the second oxide; and in the channel width direction of the transistor, the bottom surface of the second oxide is positioned below a region of the bottom surface of the second conductive layer which does not overlap with the second oxide and the first oxide, and when a level of the region of the bottom surface of the second conductive layer which does not overlap with the second oxide and the first oxide is regarded as a reference, a level of the bottom surface of the second oxide is from more than or equal to −5 nm to less than 0 nm.

In the above semiconductor device, in a cross section in the channel length direction of the transistor, when a level of the bottom surface of the first insulating layer is regarded as a reference, a level of the region of the bottom surface of the second conductive layer which overlaps with the second oxide, is preferably less than or equal to a level of the top surface of the third conductive layer.

In the above semiconductor device, it is preferable that the second insulating layer have a side surface which is substantially aligned with side surfaces of the first oxide and the second oxide, and the third oxide have a region in contact with the top surface of the first insulating layer and a side surface of the second insulating layer.

In the above semiconductor device, when a level of the bottom surface of the first insulating layer is regarded as a reference, a level of the region of the top surface of the second insulating layer which overlaps with the second oxide is preferably higher than a level of the region of the top surface of the second insulating layer which does not overlap with the second oxide.

Effect of the Invention

According to one embodiment of the present invention, a semiconductor device with a high on-state current can be provided. According to another embodiment of the present invention, a semiconductor device with high operation frequency can be provided. According to another embodiment of the present invention, a highly reliable semiconductor device can be provided. According to another embodiment of the present invention, a semiconductor device that can be miniaturized or highly integrated can be provided. According to another embodiment of the present invention, a semiconductor device having favorable electrical characteristics can be provided. According to another embodiment of the present invention, a semiconductor device with high productivity can be provided.

A semiconductor device capable of retaining data for a long time can be provided. A semiconductor device capable of high-speed data writing can be provided. A semiconductor device with high design flexibility can be provided. A semiconductor device with low power consumption can be provided. A novel semiconductor device can be provided.

Note that the descriptions of the effects do not disturb the existence of other effects. One embodiment of the present invention does not have to have all of the effects. Other effects will be apparent from and can be derived from the description of the specification, the drawings, the claims, and the like.

BRIEF DESCRIPTION OF THE DRAWINGS

FIGS. 19A-19F Diagrams illustrating electronic devices of one embodiment of the present invention.

MODE FOR CARRYING OUT THE INVENTION

Figure 1A:
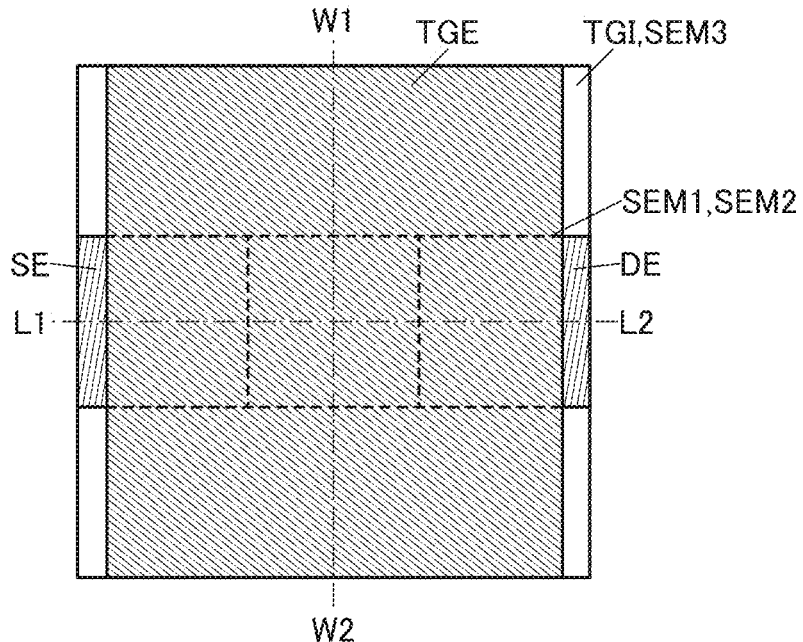
FIGS. 1A-1C A top view and cross-sectional views of a transistor of one embodiment of the present invention.

Hereinafter, embodiments will be described with reference to drawings. Note that embodiments can be implemented with many different modes, and it will be readily appreciated by those skilled in the art that modes and details thereof can be changed in various ways without departing from the spirit and scope thereof. Thus, the present invention should not be interpreted as being limited to the following descriptions of the embodiments.

In the drawings, the size, the layer thickness, or the region is exaggerated for clarity in some cases. Therefore, they are not limited to the illustrated scale. Note that the drawings are schematic views showing ideal examples, and embodiments of the present invention are not limited to shapes, values, or the like shown in the drawings. For example, in the actual manufacturing process, a layer, a resist mask, or the like might be unintentionally reduced in size by treatment such as etching, which might not be reflected in the drawings for easy understanding. In the drawings, the same reference numerals are used, in different drawings, for the same portions or portions having similar functions, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. The description of some hidden lines and the like might also be omitted.

Note that in this specification and the like, the ordinal numbers such as first and second are used for convenience and do not denote the order of steps or the stacking order of layers. Therefore, for example, description can be made even when "first" is replaced by "second", "third", or the like, as appropriate. In addition, the ordinal numbers in this specification and the like do not correspond to the ordinal numbers which are used to specify one embodiment of the present invention in some cases.

In this specification, terms for describing arrangement, such as "over" and "under", are used for convenience in describing a positional relationship between components with reference to drawings. Furthermore, the positional relation between components is changed as appropriate in accordance with a direction in which each component is described. Thus, without limitation to terms described in this specification, the description can be changed appropriately depending on the situation.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts.

Here, X and Y each denote an object (e.g., a device, an element, a circuit, wiring, an electrode, a terminal, a conductive film, or a layer).

In this specification and the like, a transistor is an element having at least three terminals of a gate, a drain, and a source. The transistor has a region where a channel is formed (hereinafter also referred to as a channel formation region) between the drain (a drain terminal, a drain region, or a drain electrode) and the source (a source terminal, a source region, or a source electrode); current can flow through the drain, the channel formation region, and the source. Note that in this specification and the like, a channel formation region refers to a region through which current mainly flows.

Functions of a source and a drain might be switched when a transistor of opposite polarity is employed or a direction of current flow changes in a circuit operation, for example. Therefore, the terms "source" and "drain" are used interchangeably in this specification and the like in some cases.

Note that in this specification and the like, depending on transistor structures, a channel width in a region where a channel is actually formed (hereinafter also referred to as an "effective channel width") is different from a channel width shown in a top view of a transistor (hereinafter also referred to as an "apparent channel width") in some cases. For example, when a gate electrode covers a side surface of a semiconductor, an effective channel width is greater than an apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, an effective channel width is greater than an apparent channel width.

In such a case, an effective channel width is difficult to estimate by actual measurement in some cases. For example, estimation of an effective channel width from a design value requires an assumption that the shape of a semiconductor is known. Accordingly, in the case where the shape of a semiconductor is not known accurately, it is difficult to measure an effective channel width accurately.

In this specification, the simple term "channel width" refers to an apparent channel width in some cases. Alternatively, in this specification, the simple term "channel width" refers to an effective channel width in some cases. Note that the values of a channel length, a channel width, an effective channel width, an apparent channel width, and the like can be determined, for example, through an analysis of a cross-sectional TEM image and the like.

Note that an impurity in a semiconductor refers to, for example, elements other than the main components of a semiconductor. For example, an element with a concentration lower than 0.1 atomic % can be regarded as an impurity. When an impurity is contained, for example, the defect-state density may be increased in the semiconductor or the crystallinity therein may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also serves as an impurity in some cases. In the case of an oxide semiconductor, oxygen vacancies are formed by entry of impurities, for example. Furthermore, when the semiconductor is silicon, examples of an impurity which changes characteristics of the semiconductor include oxygen, Group 1 elements except hydrogen, Group 2 elements, Group 13 elements, and Group 15 elements.

In this specification and the like, "silicon oxynitride" is a substance in which the oxygen content is higher than the nitrogen content in its composition. Moreover, "silicon nitride oxide" is a substance in which the nitrogen content is higher than the oxygen content in its composition.

In this specification and the like, the term "insulator" can be replaced with "insulating film" or "insulating layer". Moreover, the term "conductor" can be replaced with "conductive film" or "conductive layer". Furthermore, the term "semiconductor" can be replaced with "semiconductor film" or "semiconductor layer".

In this specification and the like, "parallel" indicates a state where two straight lines are placed such that the angle formed therebetween is greater than or equal to −10° and less than or equal to 10°. Accordingly, the case where the angle is greater than or equal to −5° and less than or equal to 5° is also included. The term "substantially parallel" indicates a state where two straight lines are placed such that the angle formed therebetween is greater than or equal to −30° and less than or equal to 30°. In addition, "perpendicular" indicates a state where two straight lines are placed such that the angle formed therebetween is greater than or equal to 800 and less than or equal to 100°. Accordingly, the case where the angle is greater than or equal to 85° and less than or equal to 95° is also included. The term "substantially perpendicular" indicates a state where two straight lines are placed such that the angle formed therebetween is greater than or equal to 60° and less than or equal to 120°.

Note that in this specification, a barrier film means a film having a function of inhibiting the transmission of oxygen and impurities such as water and hydrogen, and the barrier film having conductivity is sometimes referred to as a conductive barrier film.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, in the case where an OS transistor is mentioned, the OS FET can also be referred to as a transistor including an oxide or an oxide semiconductor.

Embodiment 1

Figure 1B:
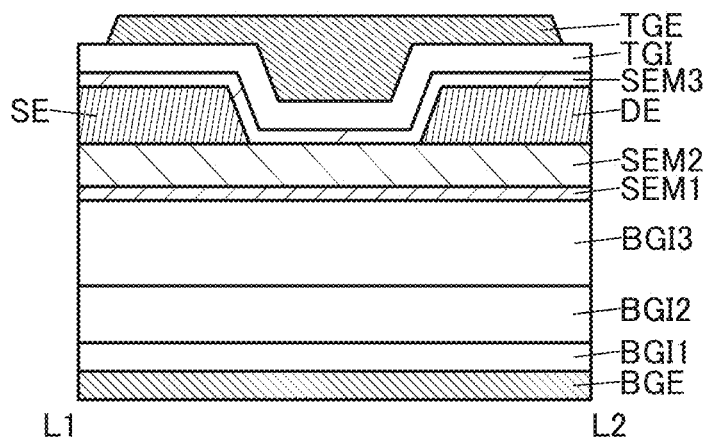
Figure 1C:
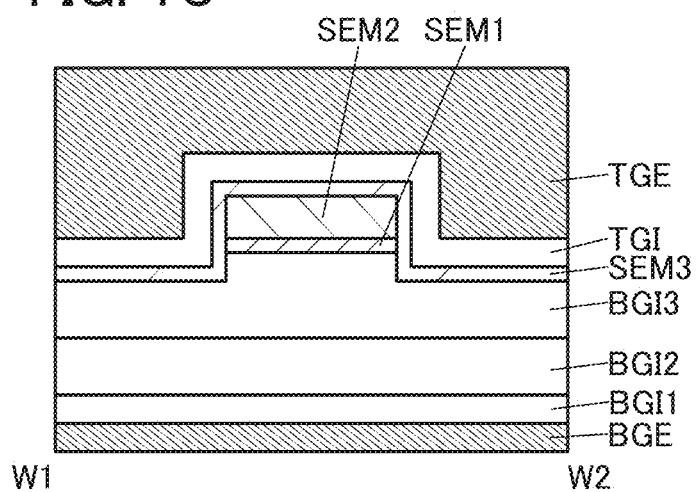

A transistor of one embodiment of the present invention is described with reference to FIG. 1 to FIG. 9 below.
<Structure Example 1 of Transistor>
FIG. 1 shows a top view and cross-sectional views of a transistor of one embodiment of the present invention. FIG. 1(A) is a top view of the transistor. FIG. 1(B) is a cross-sectional view of a portion indicated by the dashed-dotted line L1-L2 in FIG. 1(A), and is also a cross-sectional view of the transistor in the channel length direction. FIG. 1(C) is a cross-sectional view of a portion indicated by the dashed-dotted line W1-W2 in FIG. 1(A), and is also a cross-sectional view of the transistor in the channel width direction. Note that in the top view of FIG. 1(A), some components are not illustrated for clarity of the drawing.

Although in a top view or cross-sectional views in FIG. 1 or the like, end portions of a conductive layer, a semiconductor layer, an insulating layer, or the like are illustrated as having right angles, semiconductor devices shown in this embodiment are not limited thereto and can have rounded-end portions.

As shown in FIG. 1, a transistor includes a conductive layer BGE placed over a substrate (not illustrated); an insulating layer BGI1, an insulating layer BGI2, and an insulating layer BGI3 placed over the conductive layer BGE; a semiconductor layer SEM1 and a semiconductor layer SEM2 placed over the insulating layer BGI3; a conductive layer SE and a conductive layer DE placed over the semiconductor layer SEM2; a semiconductor layer SEM3 placed over the semiconductor layer SEM2, the conductive layer SE, and the conductive layer DE; an insulating layer TGI placed over the semiconductor layer SEM3; and a conductive layer TGE placed over the insulating layer TGI.

The conductive layer TGE functions as a first gate (also referred to as a top gate); the conductive layer BGE functions as a second gate (also referred to as a back gate); the insulating layer TGI functions as a first gate insulating layer (also referred to as a top gate insulating layer); the insulating layer BGI1, the insulating layer BGI2, and the insulating layer BGI3 function as second gate insulating layers (also referred to as back gate insulating layers); the semiconductor layer SEM1, the semiconductor layer SEM2, and the semiconductor layer SEM3 function as semiconductor layers; the conductive layer SE functions as one of a source and a drain; and the conductive layer DE functions as the other of the source and the drain.

The transistor described above includes a top gate and a back gate. In the transistor including a top gate and a back gate, the threshold voltage can be controlled by application of different potentials to the top gate and the back gate. Applying a negative potential to the back gate can increase the threshold voltage of the transistor, which can reduce the off-state current, for example. Thus, applying a negative potential to the back gate can reduce the drain current when the potential applied to the top gate is 0 V.

The transistor preferably includes a metal oxide functioning as semiconductor (hereinafter also referred to as an oxide semiconductor) in the channel formation region. The transistor including an oxide semiconductor in the channel formation region has an extremely small leakage current in anon-conduction state; hence, a low-power semiconductor device can be provided. An oxide semiconductor can be deposited by a sputtering method or the like and thus can be used for a transistor constituting a highly integrated semiconductor device.

In the case where an oxide semiconductor is used in the channel formation region of a transistor, an i-type (intrinsic) or substantially i-type oxide semiconductor with a low carrier concentration is preferably used. When an oxide semiconductor with a low carrier concentration is used in the channel formation region of a transistor, the off-state current of the transistor can be kept low or the reliability of the transistor can be improved. Note that an oxide semiconductor will be described in detail in Embodiment 2.

The transistor preferably has a high on-state current. In addition, the transistor preferably has high operation frequency characteristics (also referred to as frequency characteristics). In addition, the transistor preferably suppresses variation in electrical characteristics to have stable characteristics and the improved reliability.

Accordingly, the controllability of the top gate is preferably high. In this specification, the sentence "the controllability of the top gate is high" means that the electric field of the top gate exercises a strong influence on the channel formation region. In other words, the current flowing in the channel formation region easily changes even when change in the potential applied to the top gate is small. High controllability by the top gate specifically means the high on-state current of the transistor, the small subthreshold swing value (Svalue), or the like. Svalue means the amount of change in a gate voltage in the subthreshold region when the drain voltage keeps constant and the drain current changes by one digit. Improving the controllability by the top gate can improve the on-state current and Svalue of the transistor, which can improve the operation frequency of the semiconductor device including the transistor.

For example, in the channel width direction, it is preferable that the conductive layer TGE cover the top surface and the side surfaces of the semiconductor layer SEM2 in the channel formation region with the semiconductor layer SEM3 and the insulating layer TGI therebetween. As the conductive layer TGE covers larger area of the semiconductor layer SEM2 in the channel formation region, the effective channel width becomes larger, which makes the capacitance of the top gate side large. This improves the controllability by the top gate. Note that as shown in FIG. 1(C), the conductive layer TGE can be called a side gate because it faces the side surfaces of the semiconductor layer SEM2.

However, when the capacitance of the top gate side becomes large, a ratio of the capacitance of the back gate side to that of the top gate side becomes small. When a ratio of the capacitance of the back gate side to that of the top gate side becomes small, the controllability by the back gate becomes low, which will be described later. Therefore, as the conductive layer TGE covers more region of the semiconductor layer SEM2 in the channel formation region, the controllability by the back gate becomes low. The sentence "controllability by the back gate becomes low" means that, for example, the amount of change in the shift value (Vsh) is small compared to the amount of change in the potential applied to the back gate. Vsh is defined as, in the drain current-gate voltage characteristics (Id-Vg characteristics), Vg at which the tangent line at a point where the slope of the curve is the steepest intersects the straight line of Id=1 [pA].

<Correlation Between Controllability by Top Gate and Controllability by Back Gate>

The correlation between the controllability by the top gate and the controllability by the back gate will be described here. Note that Svalue is shown as an example of the controllability by the top gate and |∂Vsh/∂Vbg| is shown as an example of the controllability by the back gate. Note that |∂Vsh/∂Vbg| is the amount of change in Vsh when the back gate voltage Vbg changes by 1 V (an absolute value of the shift amount of Vsh), and expressed in the unit of [V/V]. That is, the larger |∂Vsh/∂Vbg| is, the higher the controllability by the back gate is.

As shown in Formula (1), |∂Vsh/∂Vbg| tends to depend on $C_B/C_T$, which is a ratio of the capacitance of the back gate side $C_B$ to the capacitance of the top gate side $C_T$. In other words, the controllability by the back gate tends to depend on the ratio of a capacitance of the back gate side $C_B$ to the capacitance of the top gate side $C_T$.

[Formula 1] (1)

$$\left|\frac{\partial V_{sh}}{\partial V_{bg}}\right| = \frac{C_B}{C_T}$$

As shown in Formula (2), Svalue tends to depend on $C_B/C_T$. In other words, the controllability by the top gate tends to depend on the ratio of the capacitance of the back gate side $C_B$ to the capacitance of the top gate side $C_T$.

[Formula 2] (2)

$$S_{value} = \ln(10)\frac{kT}{q} \times \left(\frac{C_B}{C_T}\right) \times \frac{1}{1 - 2\exp\left(-\frac{L}{2\lambda}\right)}$$

In Formula (2), k represents the Boltzmann constant, T represents the absolute temperature, q represents the elementary electric charge, λ represents the natural length, and L represents the channel length. Note that λ is a parameter relating to short-channel effects.

Thus, the larger $C_B/C_T$ is, the larger |∂Vsh/∂Vbg| becomes, which improves the controllability by the back gate; however, Svalue also becomes large, which impairs reliability. The smaller $C_B/C_T$ is, the smaller Svalue is, which improves reliability; however, |∂Vsh/∂Vbg| also becomes small, which impairs the controllability by the back gate. That is, there is a correlation between the controllability by the top gate and the controllability by the back gate.

Thus, it is preferable that the bottom surface of the semiconductor layer SEM2 be substantially level with a region of the bottom surface of the conductive layer TGE which does not overlap with the semiconductor layer SEM2 and the semiconductor layer SEM1. This structure can improve the controllability by the top gate and can keep the controllability by the back gate.

<Evaluation 1 of Electrical Characteristics of Transistor with Device Simulator Calculation>

The relation between the area of the side gate covering the channel formation region and electrical characteristics of the transistor was evaluated by device simulator calculation. Specifically, Svalue of the transistor and on-state current was calculated. Note that the transistor simulated in the device simulator calculation is the transistor shown in FIG. 1.

In this calculation, structures which were different with each other in how wide the conductive layer TGE covered the semiconductor layer SEM2 (a structure 1A to a structure 8A) were prepared. In the parameter-values simulated in the device simulator calculation, parameter values different among the structure 1A to the structure 8A are shown in Table 1.

TABLE 1

| Structure | H [nm] |
|---|---|
| 1A | −20 |
| 2A | −15 |
| 3A | −10 |
| 4A | −5 |
| 5A | 0 |
| 6A | 5 |
| 7A | 10 |
| 8A | 15 |

The H shown in Table 1 means the level of the bottom surface of the semiconductor layer SEM2 when the level of the region of the bottom surface of the conductive layer TGE which does not overlap with the semiconductor layer SEM2 and the semiconductor layer SEM1 is regarded as a reference. When the bottom surface of the semiconductor layer SEM2 is positioned above the region of the bottom surface of the conductive layer TGE which does not overlap with the semiconductor layer SEM2 and the semiconductor layer SEM1 (the opposite side to the conductive layer BGE side), H is a positive value. When the bottom surface of the semiconductor layer SEM2 is positioned below the region of the bottom surface of the conductive layer TGE which does not overlap with the semiconductor layer SEM2 and the semiconductor layer SEM1 (the conductive layer BGE side), H is a negative value.

Figure 2A:
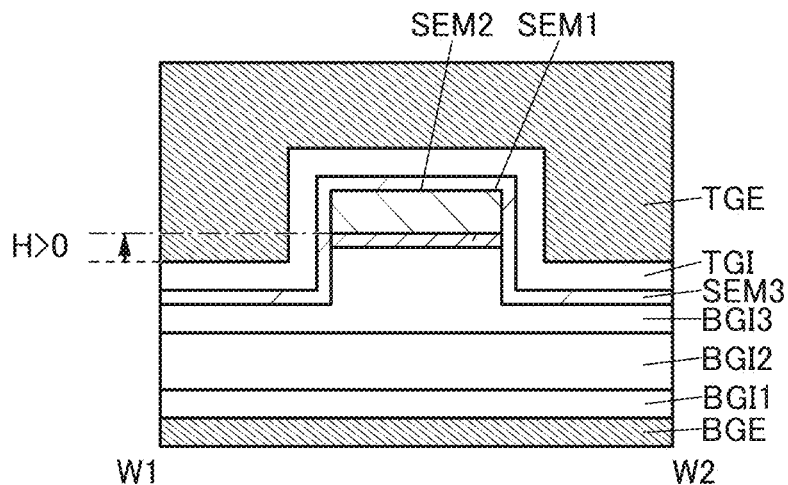
FIGS. 2A-2B Cross-sectional views of a transistor of one embodiment of the present invention.

FIG. 2(A) is a cross-sectional view of a structure (the structure 6A to the structure 8A) in the channel width direction when H is a positive value. The bottom surface of the semiconductor layer SEM2 (the position shown by a dashed-dotted line in FIG. 2(A)) is positioned above (the opposite side to the conductive layer BGE side) the region of the bottom surface of the conductive layer TGE (the position shown by a dashed line in FIG. 2(A)) which does not overlap with the semiconductor layer SEM2 and the semiconductor layer SEM1.

Figure 2B:
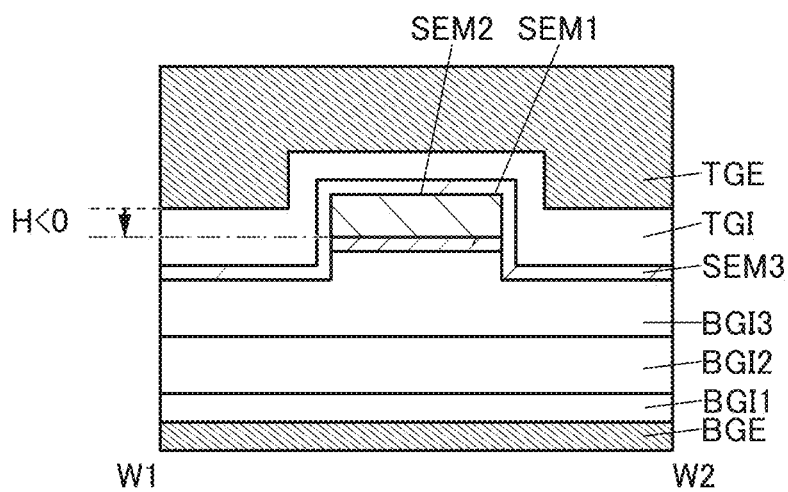

FIG. 2(B) is a cross-sectional view of a structure (the structure 1A to the structure 4A) in the channel width direction when H is a negative value. The bottom surface of the semiconductor layer SEM2 (the position shown by a dashed-dotted line in FIG. 2(B)) is positioned below (the conductive layer BGE side) the region of the bottom surface of the conductive layer TGE (the position shown by a dashed line in FIG. 2(B)) which does not overlap with the semiconductor layer SEM2 and the semiconductor layer SEM1.

The device simulator calculation was performed on the structure 1A to the structure 8A to calculate the electrical characteristics of the structures. A device simulator Atlas 3D produced by Silvaco, Inc. was used as the device simulator. Table 2 shows common-parameter values among the structure 1A to the structure 8A in the parameter values simulated in the device simulator calculation.

TABLE 2

| Structure | | Channel length L | 60 | nm |
|---|---|---|---|---|
| | | Channel width W | 60 | nm |
| SEM1 | IGZO(134) | Electron affinity | 4.5 | eV |
| | | Band gap | 3.4 | eV |
| | | Electron mobility | 0.1 | cm$^2$/(Vs) |
| | | Hole mobility | 0.01 | cm$^2$/(Vs) |
| | | Thickness | 5 | nm |
| SEM2 | IGZO(423) | Electron affinity | 4.8 | eV |
| SEM3 | | Band gap | 2.9 | eV |
| | | Electron mobility | 15 | cm$^2$/(Vs) |
| | | Hole mobility | 0.01 | cm$^2$/(Vs) |
| | | Thickness (SEM2) | 15 | nm |
| | | Thickness (SEM3) | 5 | nm |
| SEM | | Dielectric constant | 15 | |
| | | Effective density of states Nc in the conduction band | 5 × 10$^{18}$ | cm$^{-3}$ |
| | | Effective density of states Nv in the valence band | 5 × 10$^{18}$ | cm$^{-3}$ |
| TGE | | Work function | 5.9 | eV |
| | | Thickness | 20 | nm |
| TGI | | Dielectric constant | 4.1 | |
| | | Thickness | 10 | nm |
| SE, DE | | Work function | 4.8 | eV |
| | | Thickness | 20 | nm |
| BGI3 | | Dielectric constant | 4.1 | |
| | | Thickness | 30 | nm |
| BGI2 | | Dielectric constant | 16.4 | |
| | | Thickness | 20 | nm |
| BGI1 | | Dielectric constant | 4.1 | |
| | | Thickness | 10 | nm |
| BGE | | Work function | 5.0 | eV |
| | | Thickness | 20 | nm |

IGZO (134) shown in Table 2 is assumed to be an In—Ga—Zn oxide with a composition of In:Ga:Zn=1:3:4. IGZO (423) shown in Table 2 is assumed to be an In—Ga—Zn oxide with a composition of In:Ga:Zn=4:2:3. The parameters of the SEM shown in Table 2 are common parameters in the semiconductor layer SEM1, the semiconductor layer SEM2, and the semiconductor layer SEM3.

The Id-Vg characteristics of the structure 1A to the structure 8A at the drain voltage Vd of 1.2 V and the back gate voltage Vbg of −6.0 V were calculated to calculate Svalue and the on-state current Ion. Here, Ion was a current value when the gate voltage Vg was Vsh+2.5 V.

Figure 3A:
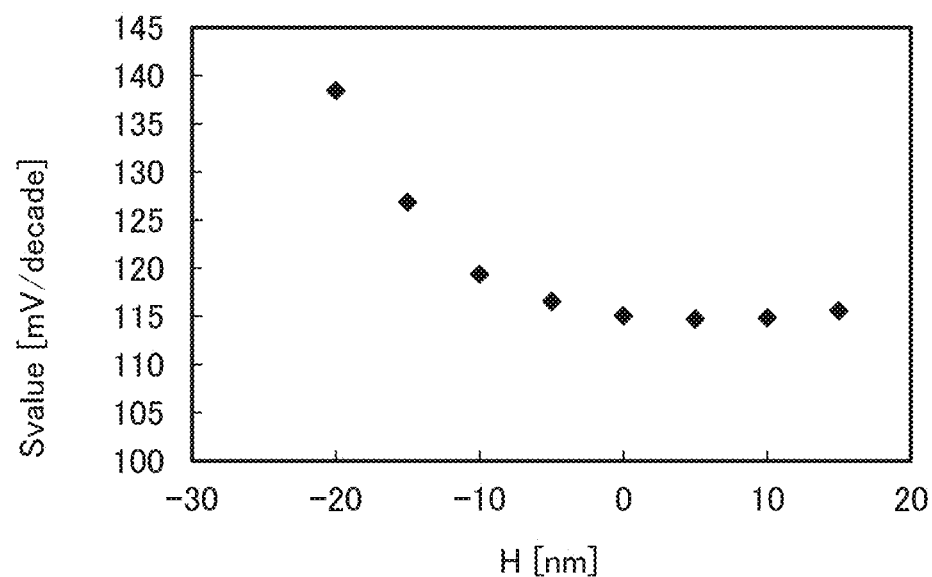
FIGS. 3A-3B Graphs showing electrical characteristics of a transistor of one embodiment of the present invention.

FIG. 3(A) shows calculated Svalues of the structure 1A to the structure 8A. In FIG. 3(A), the horizontal axis represents H [nm] and the vertical axis represents Svalue [mV/decade]. It is found from FIG. 3(A) that as the value of H becomes small (near to zero), Svalue becomes small when the H value is in the negative range. It is also found that Svalue hardly changes when the H value is in the positive range.

Figure 3B:
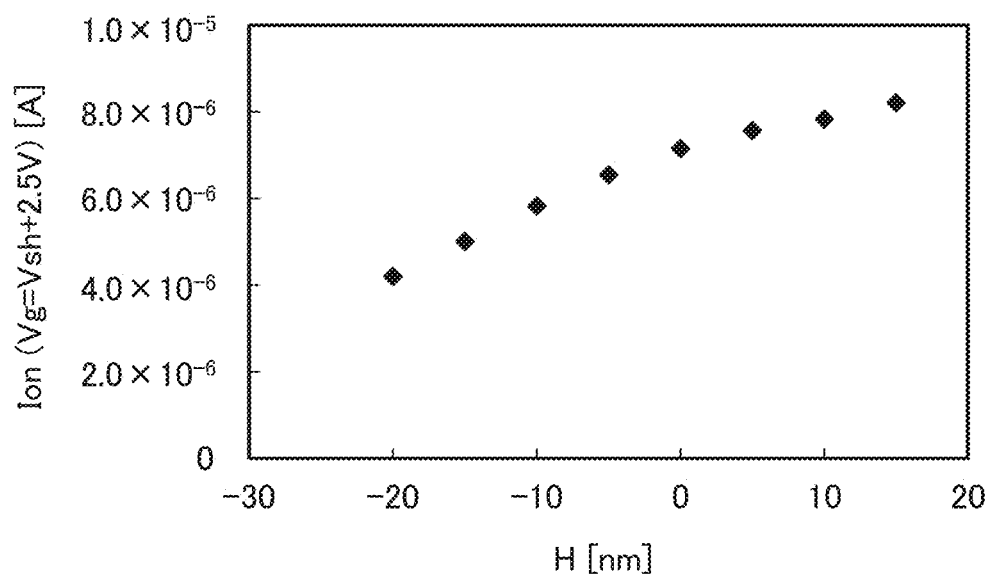

FIG. 3(B) shows calculated Ions of the structure 1A to the structure 8A. In FIG. 3(B), the horizontal axis represents H [nm] and the vertical axis represents Ion (Vg=Vsh+2.5 V) [A]. It is found from FIG. 3(B) that as the value of H becomes small (near to zero), Ion becomes large when the value of H is in the negative range. It is also found that the amount of change in Ion is small when the value of H is in the positive range compared to the case where the value of H is in the negative range.

[Estimation of Semiconductor-Device-Operation Frequency Using Device Simulator Calculation]

Operation frequency of a semiconductor device including transistors was estimated using device simulator calculation. Specifically, the estimation result of the operation frequency of the semiconductor device of one embodiment of the present invention will be described with reference to FIG. 4.

Note that the semiconductor device in this section is a DRAM using memory cells with one OS transistor and one capacitor. Note that the DRAM using memory cells with one OS transistor and one capacitor is sometimes referred to as a DOSRAM (registered trademark) (Dynamic Oxide Semiconductor Random Access Memory). The detail about the DOSRAM will be described in the following embodiments.

The data retention time of the DOSRAM can be regarded as a time needed for charges stored in a storage capacitor of the DOSRAM to decrease from "the amount of charge after data is written" to "the predetermined amount of charge". In this embodiment, the predetermined amount of charge is defined as the time needed for the potential applied to the capacitor of the DOSRAM (with a storage capacitance of 3.5 fF) to decrease by 0.2 V from the potential when data is written. For example, in this embodiment, when the data retention time of the DOSRAM is 1 hour, it takes an hour for the potential applied to the capacitor of the DOSRAM to decrease by 0.2 V from the potential when data is written.

The data retention time of the DOSRAM depends on the amount of off-leakage current of the transistor included in the DOSRAM. Here, the off-leakage current of the transistor can be referred to as Id when Vg of the transistor is 0 V (i.e., Icut). For example, in the case where data retention characteristics of the DOSRAM depend only on the amount of Icut of the transistor included in the DOSRAM, the data retention time of the DOSRAM is inversely proportional to the amount of Icut of the transistor included in the DOSRAM.

Note that Icut can be estimated by extrapolation using Formula (3) below based on Vsh and Svalue. Note that Formula (3) is a formula that holds when the off-state current of the transistor is assumed to monotonically decrease in accordance with Svalue obtained by the Vg-Id measurement until Vg reaches to 0 V.

[Formula 3] (3)

$$I_{cut} = (1\ \text{pA}) \times 10^{-\frac{V_{sh}}{S_{value}}}$$

Therefore, the data retention time of the DOSRAM can be estimated by calculation of Vsh and Svalue obtained from the Id-Vg characteristics.

The DOSRAM operation frequency is defined as a reciprocal of a data-write-cycle time of the DOSRAM. The data-write-cycle time of the DOSRAM is a parameter set by a charging time of the capacitor included in the DOSRAM, for example. In this embodiment, the time corresponding to 40% of the data-write-cycle time of the DOSRAM (the reciprocal of the DOSRAM operation frequency) is set as the charging time of the capacitor included in the DOSRAM.

As stated above, the DOSRAM operation frequency depends on the charging time of the capacitor included in DOSRAM. Therefore, when estimating the DOSRAM operation frequency, first, it is necessary to know the charging time of the capacitor included in the DOSRAM in advance. In this embodiment, a state where a potential of 0.55 V or higher is applied to the capacitor (with a storage capacitance of 3.5 fF) included in the DOSRAM is defined as a "charged state" of the capacitor. Accordingly, in this embodiment, the time from when a DOSRAM data write operation starts until when the potential applied to the capacitor reaches 0.55 V corresponds to the charging time of the capacitor included in the DOSRAM.

When charges stored in the capacitor that is included in the DOSRAM and that has a storage capacitance Cs [F] are Q [C], the charging time is t [sec], a potential applied to the capacitor by charging is Vcs (=Vs) [V], and the drain current of the transistor included in the DOSRAM is Id [A], the relation shown by Formula (4) below is established among the parameters.

[Formula 4] (4)

$$I_d = \frac{dQ}{dt} = \frac{d}{dt}(C_s \times V_{cs}) = C_s \frac{dV_{cs}}{dt}$$

Thus, by modification of Formula (4), the charging time t of the capacitor included in the DOSRAM can be represented with Formula (5) below.

[Formula 5] (5)

$$t = \int_0^{V_{cs}} \frac{C_s \times dV_{cs}}{I_d}$$

As stated above, in this embodiment, the state where a potential of 0.55 V or higher is applied to the capacitor with a storage capacitance of 3.5 fF is defined as a "charged state" of the capacitor. Therefore, in Formula (5), if 3.5 fF is substituted for Cs, +0.55 V is substituted for Vsc, and a measurement value or a calculated value of the transistor of one embodiment of the present invention is substituted for Id, the charging time t of the capacitor included in the DOSRAM can be calculated.

The charging time of the capacitor included in the DOSRAM depends on the amount of Id of the transistor included in the DOSRAM at the time of DOSRAM data writing. In other words, the DOSRAM operation frequency can be estimated by obtaining Id-Vs characteristics.

Hence, in this section, a potential assumed to be applied to the transistor included in the DOSRAM at the time of DOSRAM data writing is actually applied to the transistor of one embodiment of the present invention to reproduce the DOSRAM data write operation, and Id of the transistor at that time was measured. On the transistors having the structure 1A to the structure 8A, the Id measurement was performed at a fixed gate potential Vg of +2.97 V, a fixed drain potential Vd of +1.08 V, a given back gate potential Vbg, and the source potential Vs swept from 0 V to 0.55 V. The measurement temperature was set at 27° C.

The Id-Vg characteristics and the Id-Vs characteristics of the structure 1A to the structure 8A were calculated with a device simulator using the above conditions, so that the data retention time and operation frequency of the DOSRAM were calculated. The parameter values simulated in the device simulator calculation are shown in Table 1 and Table 2. Note that in calculating the data retention time, leakage and degradation of element characteristics due to long-time storing are not considered.

Figure 4:
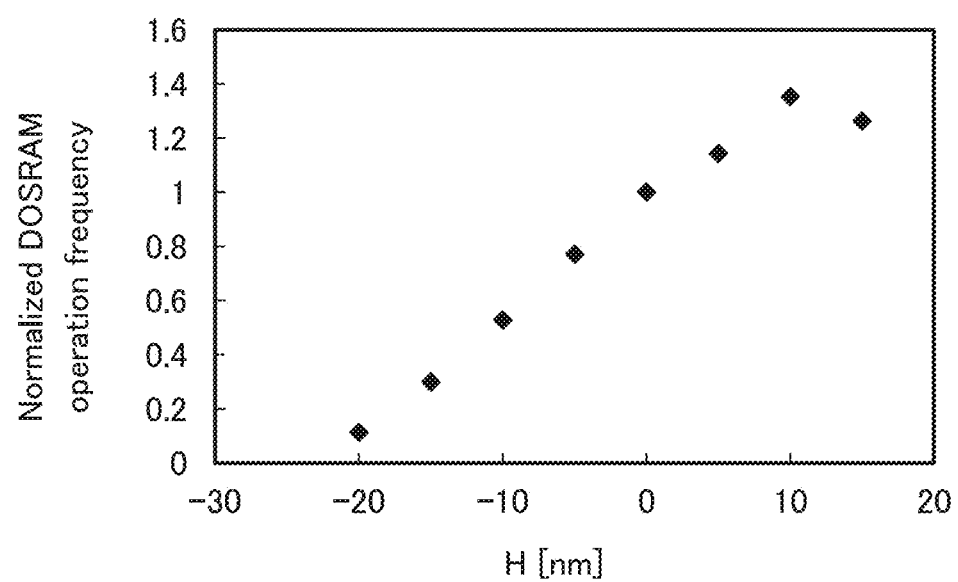
FIG. 4 A graph showing operation frequency of a semiconductor device of one embodiment of the present invention.

The estimation of the DOSRAM operation frequency of the DOSRAM including any one of the structure 1A to the structure 8A with the power supply voltage of 3.3 V at 27° C. is shown in FIG. 4. Note that the DOSRAM operation frequency shown in FIG. 4 is normalized so that the DOSRAM operation frequency of the structure 5A is 1. In FIG. 4, the horizontal axis represents H [nm] and the vertical axis represents the normalized DOSRAM operation frequency. FIG. 4 shows that the DOSRAM operation frequency increases as the value of H increases. That is, as the value of H increases, the operation frequency of the semiconductor device including the transistor is improved.

<Controllability by Back Gate>

Next, controllability by the back gate was evaluated using device simulator calculation. To evaluate the controllability by the back gate, the voltage dependency of Id-Vg characteristics of the transistor was calculated to calculate |∂Vsh/∂Vbg|.

The Id-Vg characteristics of the structure 1A to the structure 8A were calculated to calculate |∂Vsh/∂Vbg| by device simulator calculation. The parameter values simulated in the device simulator calculation were values shown in Table 1 and Table 2.

Figure 5:
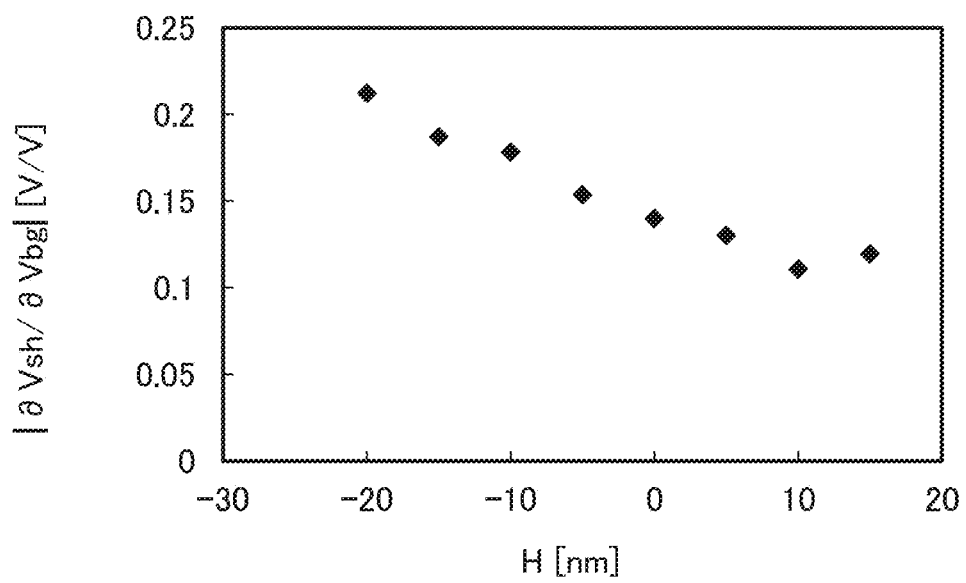
FIG. 5 A graph showing |∂Vsh/∂Vbg| of a transistor of one embodiment of the present invention.

FIG. 5 shows the values of |∂Vsh/∂Vbg| of the structure 1A to the structure 8A. In FIG. 5, the horizontal axis represents H [nm], and the vertical axis represents |∂Vsh/∂Vbg| [V/V]. It is found from FIG. 5 that as the value of H increases, |∂Vsh/∂Vbg| decreases. Thus, it is found that as the value of H increases, controllability by the back gate decreases.

Thus, when the conductive layer TGE covers the top surface and the side surfaces of the semiconductor layer SEM2 in the channel formation region with the semiconductor layer SEM3 and the insulating layer TGI therebetween, the electric field of the conductive layer TGE is easily applied to the entire semiconductor layer SEM2 in the channel formation region. This can increase the on-state current of the transistor and improve the operation frequency of the semiconductor device including the transistor.

Thus, the transistor in which the bottom surface of the semiconductor layer SEM2 is substantially level with the region of the bottom surface of the conductive layer TGE which does not overlap with the semiconductor layer SEM2 and the semiconductor layer SEM1 has small Svalue and a high on-state current, shows favorable electrical characteristics, and can keep controllability by the back gate. For example, H is preferably greater than or equal to −15 nm and less than or equal to 15 nm, further preferably greater than or equal to −10 nm and less than or equal to 10 nm, still further preferably greater than or equal to −5 nm and less than or equal to 5 nm, or greater than or equal to −5 nm and less than or equal to 0 nm.

The back gate voltage Vbg is preferably low. When the back gate voltage Vbg is high, the Id-Vg characteristics of the transistor might be degraded. Note that the degradation of the Id-Vg characteristics of the transistor means, for example, that Svalue becomes high or the on-state current becomes small.

To decrease the back gate voltage Vbg, for example, controllability by the back gate needs to be improved. When controllability by the back gate is low, the back gate voltage Vbg needs to be high to store data. Note that to improve controllability by the back gate, |∂Vsh/∂Vbg| is made to be high, for example.

Controllability by the back gate depends on the thicknesses of the back gate insulating layers (the insulating layer BGI1, the insulating layer BGI2, and the insulating layer BGI3), the thicknesses of the semiconductor layers (the semiconductor layer SEM1, the semiconductor layer SEM2, and the semiconductor layer SEM3), or the like. In order to increase the operation frequency of the transistor while data is held, it is important to optimize the thicknesses of the back gate insulating layer and the semiconductor layer. The optimization for the thicknesses can enable a transistor structure with high operation frequency while data is held.

<Optimization for Thicknesses of Back Gate Insulating Layer and Semiconductor Layer>

The optimization for the thicknesses of the back gate insulating layer and the semiconductor layer to make a transistor structure with high operation frequency while data is held will be described with reference to FIG. 6.

First, controllability by the back gate is determined from the back gate voltage Vbg needed for an actual operation. On the assumption that a transistor which shows electrical characteristics of Vsh=0 V at Vbg=0 V, to shift Vsh to 1.2 V at 27° C. in the state in which a voltage is less than or equal to −5 V is applied to the back gate, ∂Vsh/∂Vbg| is preferably 0.24 V/V or more. Alternatively, to shift Vsh to 0.83 V at 27° C. in the state in which a voltage is less than or equal to −3 V is applied to the back gate, |∂Vsh/∂Vbg| is preferably 0.28 V/V or more.

Next, the optimal thicknesses of the back gate insulating layer and the semiconductor layer which suits the determined controllability by the back gate are investigated. First, to find out the optimal thicknesses of the back gate insulating layer and the semiconductor layer when |∂Vsh/∂Vbg| is 0.24 V/V or more, a plurality of transistors with different thicknesses of the back gate insulating layer and the semiconductor layer is prepared, for example. Then, the Id-Vg characteristics of the transistors are calculated and |∂Vsh/∂Vbg| is calculated. The thicknesses of the back gate insulating layer and the semiconductor layer are optimal thicknesses when the calculated |∂Vsh/∂Vbg| becomes 0.24 V/V or more. Since the thicknesses of the back gate insulating layer and the semiconductor layer are set independently, the optimal thickness may not be fixed to one but a plurality of optimal thicknesses may exist.

Next, the DOSRAM operation frequency including the transistor having the above optimal thickness is calculated. The transistor structure with the highest operation frequency is chosen from the calculated DOSRAM operation frequencies to determine the transistor structure with high operation frequency while data is retained.

The example shows the investigation for the optimal thicknesses of the back gate insulating layer and the semiconductor layer using device simulator calculation. In this calculation, the structures (a structure 1B to a structure 4B) of the transistor shown in FIG. 1 in which the thicknesses of the insulating layer BGI1, the insulating layer BGI2, the insulating layer BGI3, the semiconductor layer SEM1, and the semiconductor layer SEM2 are different were prepared. In the parameter-values simulated in the device simulator calculation, parameter values different among the structure 1B to the structure 4B are shown in Table 3.

TABLE 3

| Structure | Thickness [nm] | | | | | |
| --- | --- | --- | --- | --- | --- | --- |
| | BGI1 | BGI2 | BGI3 | SEM1 | SEM2 | H [nm] |
| 1B | 10 | 20 | 30 | 5 | 15 | +5 |
| 2B | 0 | 10 | 5 | 20 | 15 | +10 |
| 3B | 0 | 10 | 10 | 10 | 15 | +5 |
| 4B | 0 | 10 | 15 | 5 | 15 | +5 |

The H shown in Table 3 means the level of the bottom surface of the semiconductor layer SEM2 when the level of the region of the bottom surface of the conductive layer TGE which does not overlap with the semiconductor layer SEM2 and the semiconductor layer SEM1 is regarded as a reference. In the structure 1B to the structure 4B, H has a positive value; and the DOSRAM operation frequency is assumed to be high according to FIG. 4.

The device simulator calculation was performed on the structure 1B to the structure 4B. A device simulator Atlas 3D produced by Silvaco, Inc. was used as the device simulator. Table 4 shows common parameter values among the structure 1B to the structure 4B in the parameter values simulated in the device simulator calculation.

TABLE 4

| Structure | | Channel length L | 60 | nm |
| --- | --- | --- | --- | --- |
| | | Channel width W | 45 | nm |
| SEM1 | IGZO(134) | Electron affinity | 4.5 | eV |
| | | Band gap | 3.4 | eV |
| | | Electron mobility | 0.1 | cm$^2$/(Vs) |
| | | Hole mobility | 0.01 | cm$^2$/(Vs) |
| SEM2 | IGZO(423) | Electron affinity | 4.8 | eV |
| SEM3 | | Band gap | 2.9 | eV |
| | | Electron mobility | 15 | cm$^2$/(Vs) |
| | | Hole mobility | 0.01 | cm$^2$/(Vs) |
| | | Thickness (SEM3) | 5 | nm |
| SEM | | Dielectric constant | 15 | |
| | | Effective density of states Nc in the conduction band | 5 × 10$^{18}$ | cm$^{-3}$ |
| | | Effective density of states Nv in the valence band | 5 × 10$^{18}$ | cm$^{-3}$ |
| TGE | | Work function | 5.4 | eV |
| | | Thickness | 20 | nm |
| TGI | | Dielectric constant | 4.1 | |
| | | Thickness | 10 | nm |
| SE, DE | | Work function | 4.8 | eV |
| | | Thickness | 20 | nm |
| BGI3 | | Dielectric constant | 4.1 | |
| BGI2 | | Dielectric constant | 16.4 | |
| BGI1 | | Dielectric constant | 4.1 | |
| BGE | | Work function | 5.0 | eV |
| | | Thickness | 20 | nm |

The result of the device simulator calculation shows that |∂Vsh/∂Vbg| in the structure 1B was 0.1 V/V or more, and |∂Vsh/∂Vbg| in the structure 2B to the structure 4B were 0.24 V/V or more. Thus, it is found that controllability by the back gate in the structure 2B to the structure 4B is higher than that in the structure 1B.

The Id-Vg characteristics and the Id-Vs characteristics of the structure 1B to the structure 4B were calculated with device simulator calculation, so that the data retention time and operation frequency of the DOSRAM were calculated. Parameter values simulated in the device simulator calculation are shown in Table 3 and Table 4. Note that in calculating the data retention time, leakage and degradation of element characteristics due to long-time storing are not considered.

Figure 6:
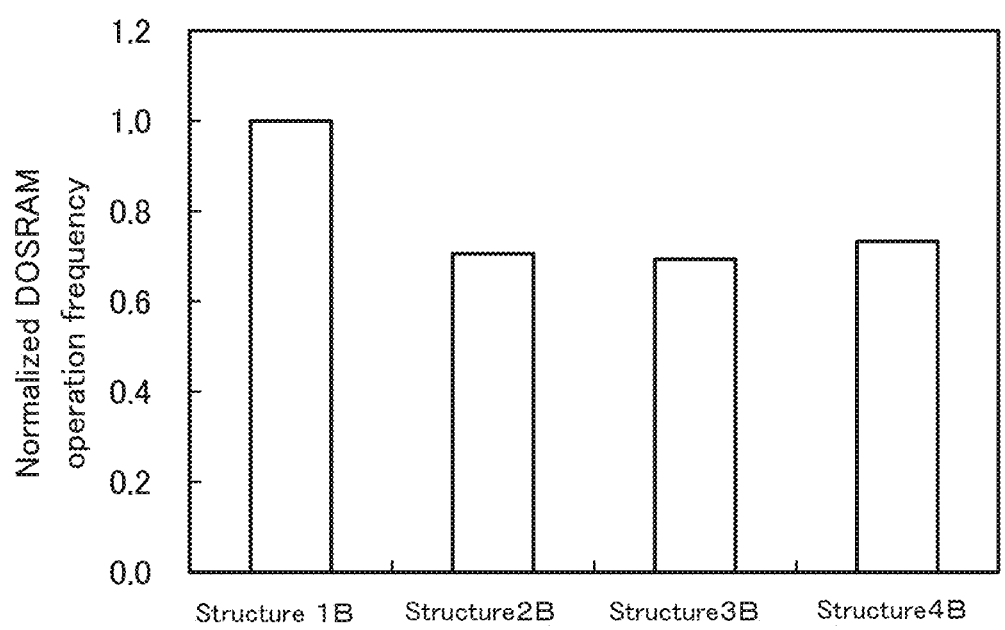
FIG. 6 A chart illustrating operation frequency of a semiconductor device of one embodiment of the present invention.

The estimation of the DOSRAM operation frequency of the DOSRAM including any one of the structure 1B to the structure 4B with the power supply voltage of 3.3 V at 27° C. is shown in FIG. 6. Note that the DOSRAM operation frequency shown in FIG. 6 is normalized so that the DOSRAM operation frequency of the structure 1B is 1. In FIG. 6, the vertical axis represents the normalized DOSRAM operation frequency. FIG. 6 shows that the structure 4B has the highest DOSRAM operation frequency among the structure 2B to the structure 4B.

Note that in the above calculation, the optimal thickness is investigated after controllability by the back gate is fixed; however, the present invention is not limited thereto. For example, it is acceptable that the optimal thicknesses to suit the required DOSRAM operation frequency are investigated, and then the transistor structure with the highest controllability by the back gate is chosen from the optimal thicknesses, which enable a transistor structure with high operation frequency while data is held.

The transistor structure is not limited to that shown in FIG. 1, and a transistor can have small Svalue and a high on-state current, show favorable electrical characteristics, and keep the controllability by the back gate as long as it has the structure in which the bottom surface of the semiconductor layer SEM2 is substantially level with the region of the bottom surface of the conductive layer TGE which does not overlap with the semiconductor layer SEM2 and the semiconductor layer SEM1.

<Structure Example 2 of Transistor>

Figure 7A:
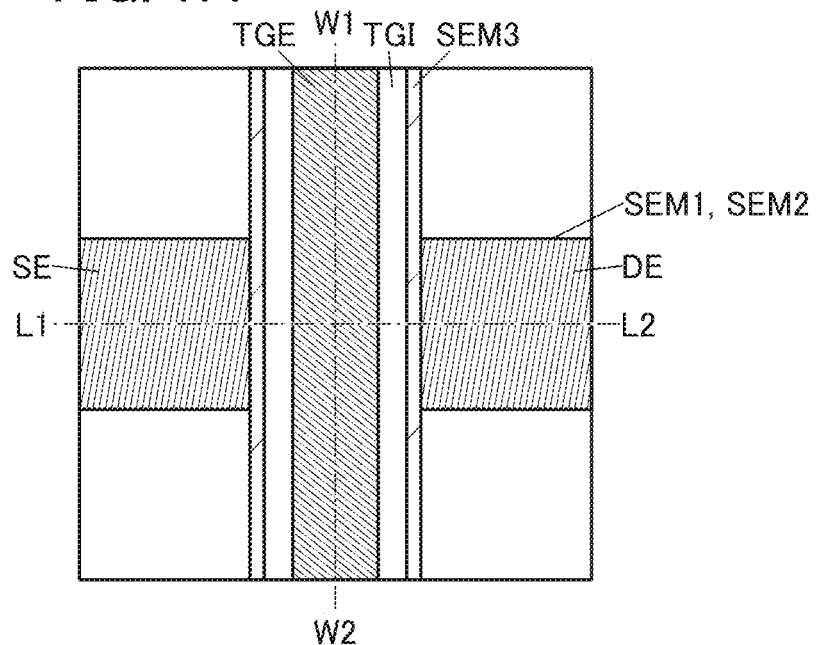
FIGS. 7A-7C A top view and cross-sectional views of a transistor of one embodiment of the present invention.
Figure 7B:
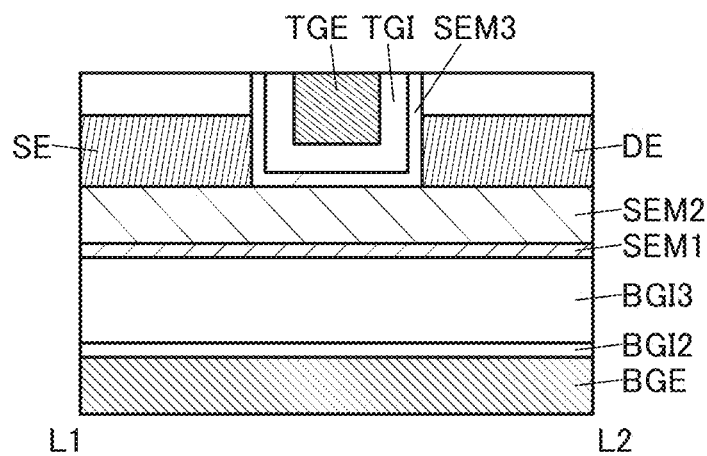
Figure 7C:
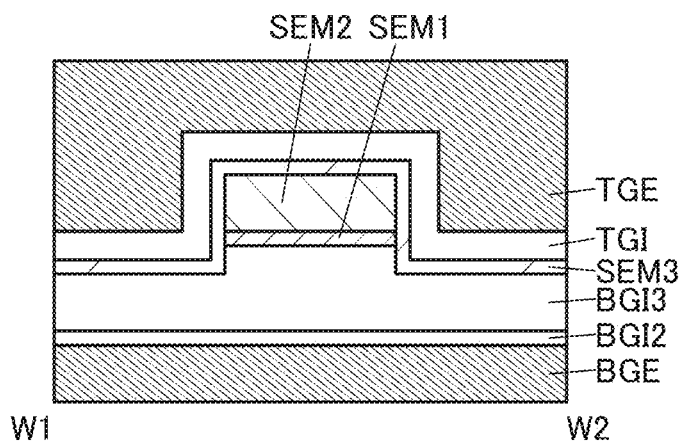

FIG. 7 shows a plan view and cross-sectional views illustrating a transistor of one embodiment of the present invention. FIG. 7(A) is a top view of the transistor. FIG. 7(B) is a cross-sectional view of a portion indicated by a dashed-dotted line L1-L2 in FIG. 7(A), and is also a cross-sectional view in the channel length direction of the transistor. FIG. 7(C) is a cross-sectional view of a portion indicated by a dashed-dotted line W1-W2 in FIG. 7(A), and is a cross-sectional view in the channel width direction of the transistor. Note that for simplification of the drawing, some components are not illustrated in the top view of FIG. 7(A).

The transistor shown in FIG. 7 is a modification example of the transistor shown in FIG. 1. Therefore, differences from the transistor shown in FIG. 1 will be mainly described to avoid repeated description.

As shown in FIG. 7, the transistor includes the conductive layer BGE placed over a substrate (not illustrated); the insulating layer BGI2, and the insulating layer BGI3 placed over the conductive layer BGE; the semiconductor layer SEM1 and the semiconductor layer SEM2 placed over the insulating layer BGI3; the conductive layer SE and the conductive layer DE placed over the semiconductor layer SEM2; the semiconductor layer SEM3 placed over the semiconductor layer SEM2 and in contact with side surfaces of the conductive layer SE and the conductive layer DE; the insulating layer TGI placed over the semiconductor layer SEM3; and the conductive layer TGE placed over the insulating layer TGI.

<Evaluation 2 of Electrical Characteristics of Transistor with Device Simulator Calculation>

Svalue and the on-state current of the transistor shown in FIG. 7 were calculated below.

In this calculation, structures which were different with each other in how wide the conductive layer TGE covered the semiconductor layer SEM2 (a structure 1C to a structure 10C) were prepared. In the parameter-values simulated in the device simulator calculation, parameter values different among the structure 1C to the structure 10C are shown in Table 5.

TABLE 5

| Structure | H [nm] |
|---|---|
| 1C | −25 |
| 2C | −20 |
| 3C | −15 |
| 4C | −10 |
| 5C | −5 |
| 6C | 0 |
| 7C | 5 |
| 8C | 10 |
| 9C | 15 |
| 10C | 20 |

Figure 8A:
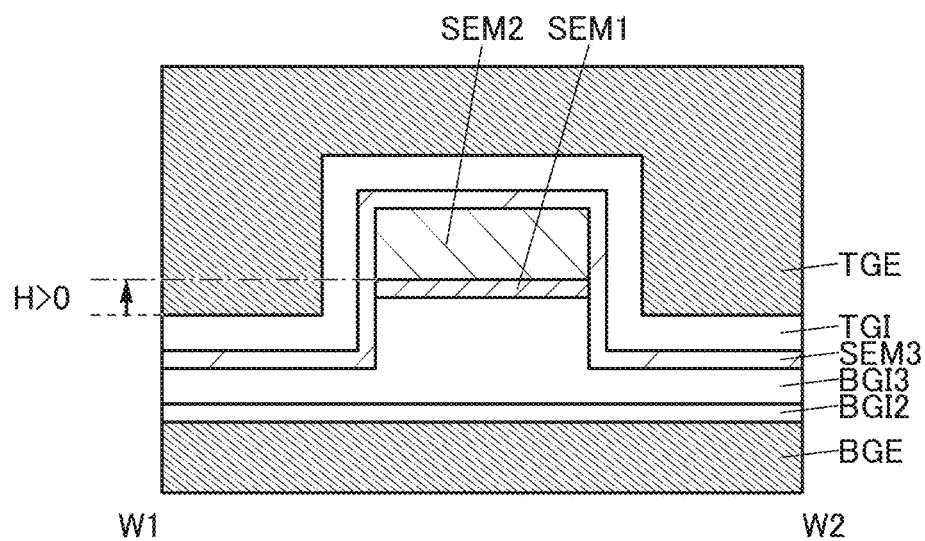
FIGS. 8A-8B Cross-sectional views of a transistor of one embodiment of the present invention.
Figure 8B:
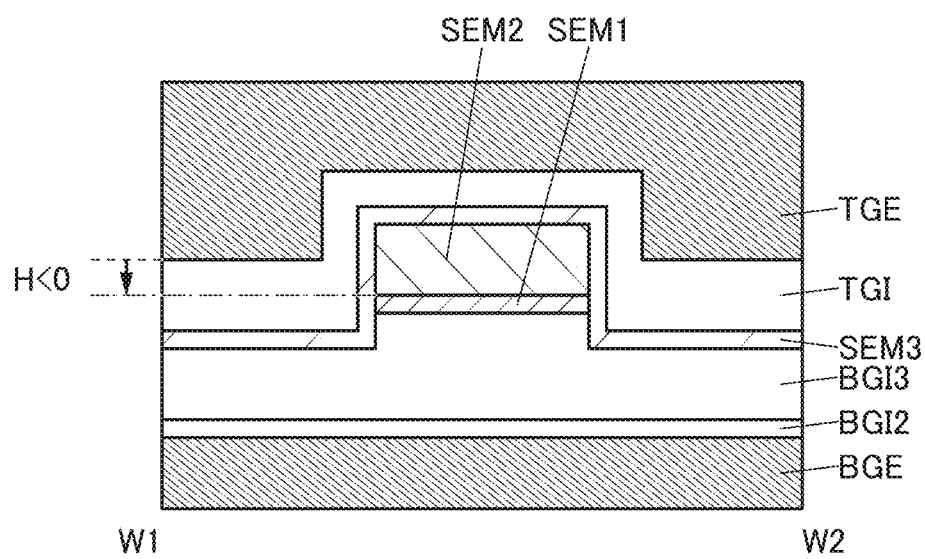

FIG. 8(A) is a cross-sectional view of the structures (the structure 7C to the structure 10C) in the channel width direction when H is a positive value. FIG. 8(B) is a cross-sectional view of structures (the structure 1C to the structure 5C) in the channel width direction when H is a negative value.

The device simulator calculation was performed on the structure 1C to the structure 10C. A device simulator Atlas 3D produced by Silvaco, Inc. was used as the device simulator. Table 6 shows common-parameter values among the structure 1C to the structure 10C in the parameter values simulated in the device simulator calculation.

TABLE 6

| Structure | | Channel length L | 60 | nm |
|---|---|---|---|---|
| | | Channel width W | 60 | nm |
| SEM1 | IGZO(134) | Electron affinity | 4.5 | eV |
| | | Band gap | 3.4 | eV |
| | | Electron mobility | 0.1 | $cm^2/(Vs)$ |
| | | Hole mobility | 0.01 | $cm^2/(Vs)$ |
| | | Thickness | 5 | nm |
| SEM2 | IGZO(423) | Electron affinity | 4.8 | eV |
| SEM3 | | Band gap | 2.9 | eV |
| | | Electron mobility | 15 | $cm^2/(Vs)$ |
| | | Hole mobility | 0.01 | $cm^2/(Vs)$ |
| | | Thickness (SEM2) | 20 | nm |
| | | Thickness (SEM3) | 5 | nm |
| SEM | | Dielectric constant | 15 | |
| | | Effective density of states Nc in the conduction band | $5 \times 10^{18}$ | $cm^{-3}$ |
| | | Effective density of states Nv in the valence band | $5 \times 10^{18}$ | $cm^{-3}$ |
| TGE | | Work function | 5.4 | eV |
| | | Thickness | 50 | nm |
| TGI | | Dielectric constant | 4.1 | |
| | | Thickness | 10 | nm |
| SE, DE | | Work function | 4.8 | eV |
| | | Thickness | 25 | nm |
| BGI3 | | Dielectric constant | 4.1 | |
| | | Thickness | 30 | nm |

TABLE 6-continued

| | | | |
|---|---|---|---|
| BGI2 | Dielectric constant | 16.4 | |
| | Thickness | 5 | nm |
| BGE | Work function | 5.0 | eV |
| | Thickness | 20 | nm |

The Id-Vg characteristics of the structure 1C to the structure 10C at the drain voltage Vd of 1.2 V and the back gate voltage Vbg of −6.0 V were calculated to calculate Svalue and the on-state current Ion. Here, Ion was a current value when the gate voltage Vg was Vsh+2.5 V.

Figure 9A:
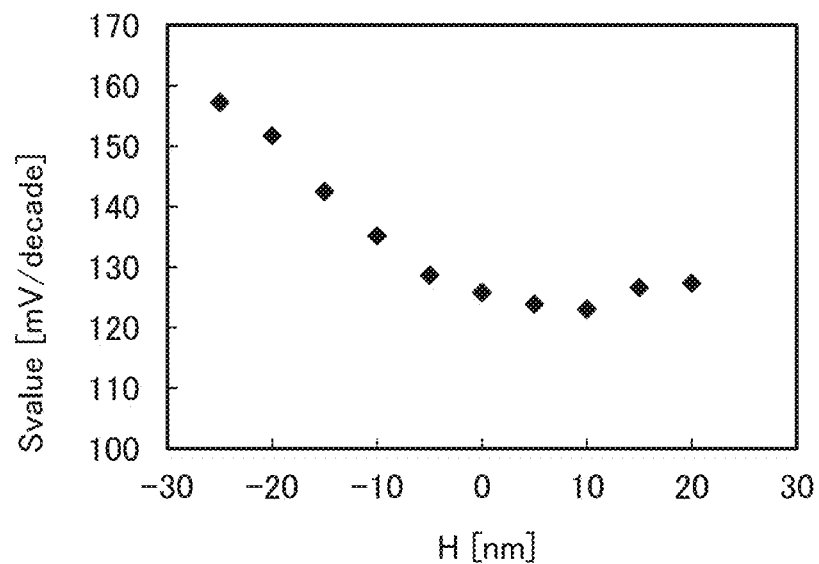
FIGS. 9A-9B Graphs showing electrical characteristics of a transistor of one embodiment of the present invention.

FIG. 9(A) shows calculated Svalues of the structure 1C to the structure 10C. In FIG. 9(A), the horizontal axis represents H [nm] and the vertical axis represents Svalue [mV/decade]. It is found from FIG. 9(A) that as the value of H becomes small (near to zero), Svalue becomes small when the H value is in the negative range. It is also found that Svalue hardly changes when the H value is in the positive range.

Figure 9B:
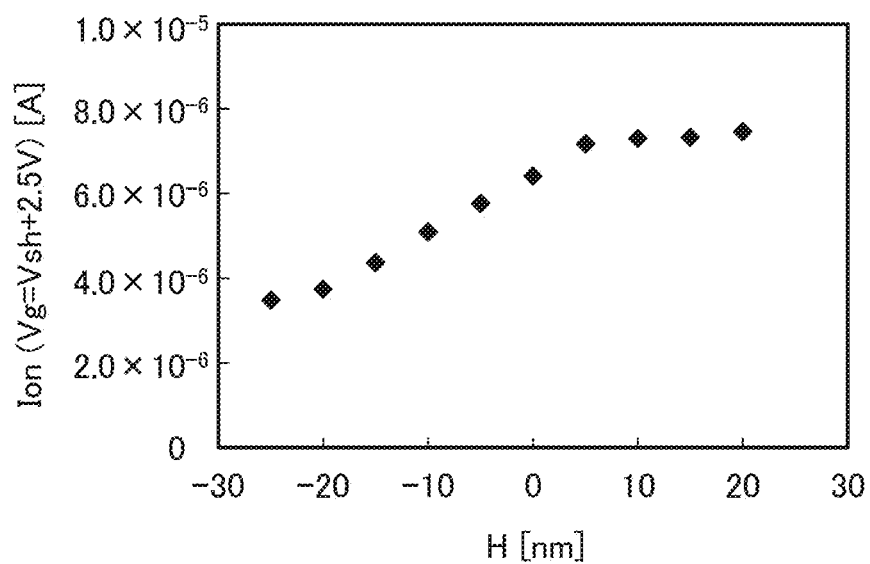

FIG. 9(B) shows calculated Ions of the structure 1C to the structure 10C. In FIG. 9(B), the horizontal axis represents H [nm] and the vertical axis represents Ion (Vg=Vsh+2.5 V) [A]. It is found from FIG. 9(B) that as the value of H becomes small (near to zero), Ion becomes large when the value of H is in the negative range. It is also found that Ion hardly changes when the value of H is in the positive range.

Therefore, the transistor in which the bottom surface of the semiconductor layer SEM2 is substantially level with the region of the bottom surface of the conductive layer TGE which does not overlap with the semiconductor layer SEM2 and the semiconductor layer SEM1 has small Svalue and a high on-state current, shows favorable electrical characteristics, and can keep controllability by the back gate.

Note that the details of the transistor of one embodiment of the present invention will be described in the following embodiment.

In order to fabricate the transistor in which the bottom surface of the semiconductor layer SEM2 is substantially level with the region of the bottom surface of the conductive layer TGE which does not overlap with the semiconductor layer SEM2 and the semiconductor layer SEM1, the thicknesses of the semiconductor layer SEM1, the semiconductor layer SEM2, the semiconductor layer SEM3, the insulating layer TGI, and the insulating layer BGI3 are needed to be considered. Note that the thicknesses of the semiconductor layer SEM1, the semiconductor layer SEM2, the semiconductor layer SEM3, and the insulating layer TGI are almost equal to the thicknesses when these are deposited.

The insulating layer BGI3 may be etched to decrease the thickness (so-called reduction in thickness) in the process of processing the semiconductor layer SEM2 and the semiconductor layer SEM1 with an etching method. In that step, a polymer which is an etching protection film may be deposited over the insulating layer BGI3. If the insulating layer BGI3 is processed with an etching method after this step, the polymer deposited over the insulating layer BGI3 inhibits the etching reaction of the insulating layer BGI3. Thus, it is difficult to control the thickness of the insulating layer BGI3 using processing with an etching method.

Thus, it is preferable to perform oxygen plasma treatment after the semiconductor layer SEM2 and the semiconductor layer SEM1 are processed with an etching method, or before the insulating layer BGI3 is processed with an etching method. The oxygen plasma treatment can remove the polymer deposited over the insulating layer BGI3. The insulating layer BGI3 is processed with an etching method after the polymer is removed by the oxygen plasma treatment, so that the thickness of the insulating layer BGI3 can be controlled. Thus, the transistor can be miniaturized or highly integrated in some cases. Alternatively, the productivity of the transistor can be increased in some cases.

Through the above steps, for example, the region of the insulating layer BGI3 which does not overlap with the semiconductor layer SEM2 and the semiconductor layer SEM1 can be removed and the semiconductor layer SEM3 can include a region in contact with the top surface of the insulating layer BGI2. Alternatively, part of the region of the insulating layer BGI3 which does not overlap with the semiconductor layer SEM2 and the semiconductor layer SEM1 can be removed, and the level of the region of the top surface of the insulating layer BGI3 which overlaps with the semiconductor layer SEM2 and the semiconductor layer SEM1 can be higher than the level of the region of the top surface of the insulating layer BGI3 which does not overlap with the semiconductor layer SEM2 and the semiconductor layer SEM1.

The oxygen plasma treatment means that an object is irradiated with plasma generated in an atmosphere containing an oxygen gas. The oxygen gas is an oxidizing gas containing oxygen, such as oxygen, ozone, or dinitrogen monoxide. It is particularly preferable to use oxygen or ozone as the oxygen gas. Note that a rare gas may be added in the oxygen plasma treatment. The oxygen plasma treatment with the addition of a rare gas can reduce impurities such as hydrogen and carbon in the surface of the irradiated object or the vicinity thereof.

In the above manner, the thicknesses of the oxide semiconductor layer SEM1, the semiconductor layer SEM2, the semiconductor layer SEM3, the insulating layer TGI, and the insulating layer BGI3 are controlled, so that the transistor can be fabricated in which the bottom surface of the semiconductor layer SEM2 is substantially level with the region of the bottom surface of the conductive layer TGE which does not overlap with the semiconductor layer SEM2 and the semiconductor layer SEM1.

With one embodiment of the present invention, a semiconductor device with a high on-state current can be provided. In addition, a semiconductor device with high operation frequency can be provided. In addition, a highly reliable semiconductor device can be provided. In addition, a semiconductor device that can be miniaturized or highly integrated can be provided. In addition, a semiconductor device having favorable electrical characteristics can be provided. In addition, a semiconductor device with high productivity can be provided.

The structure, method, and the like described above in this embodiment can be used in appropriate combination with structures, methods, and the like described in the other embodiments and the example.

Embodiment 2

In this embodiment, structure examples of the transistor shown in the above embodiment will be described.

<Transistor Structure Example 1>

Figure 10A:
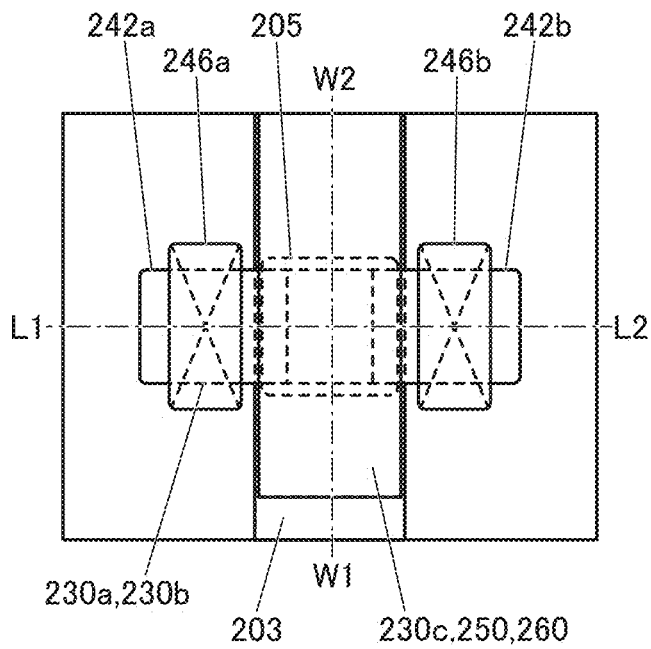
FIGS. 10A-10C Diagrams showing a structure example of a transistor of one embodiment of the present invention.
Figure 10C:
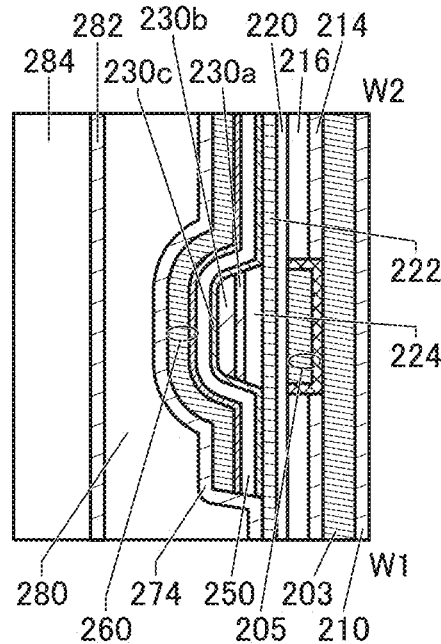
Figure 10B:
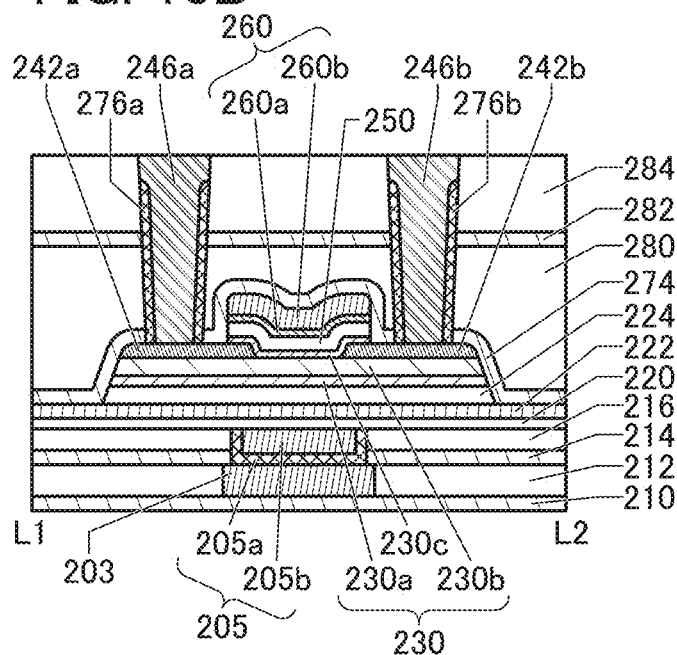

A structure example of a transistor 200A is described with reference to FIG. 10(A) to FIG. 10(C). FIG. 10(A) is atop view of the transistor 200A. FIG. 10(B) is a cross-sectional view of a portion indicated by a dashed-dotted line L1-L2 in FIG. 10(A). FIG. 10(C) is a cross-sectional view of a portion indicated by a dashed-dotted line W1-W2 in FIG. 10(A). Note that for clarity of the drawing, some components are not illustrated in the top view of FIG. 10(A).

FIG. 10(A) to FIG. 10(C) show the transistor 200A and an insulating layer 210, an insulating layer 212, an insulating layer 214, an insulating layer 216, an insulating layer 280, an insulating layer 282, and an insulating layer 284 that function as interlayer films. In addition, a conductive layer 246 (a conductive layer 246a and a conductive layer 246b) that is electrically connected to the transistor 200A and functions as a contact plug, and a conductive layer 203 functioning as a wiring are illustrated.

The transistor 200A includes a conductive layer 260 (a conductive layer 260a and a conductive layer 260b) functioning as a first gate (also referred to as a top gate), a conductive layer 205 (a conductive layer 205a and a conductive layer 205b) functioning as a second gate (also referred to as a bottom gate), an insulating layer 250 functioning as a first gate insulating layer, an insulating layer 220, an insulating layer 222, and an insulating layer 224 functioning as a second gate insulating layer, an oxide 230 (an oxide 230a, an oxide 230b, and an oxide 230c) including a region where a channel is formed, a conductive layer 242a functioning as one of a source and a drain, a conductive layer 242b functioning as the other of the source and the drain, and an insulating layer 274.

As the interlayer films, a single layer or a stacked layer of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used, for example. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

For example, the insulating layer 210 preferably functions as a barrier film that inhibits impurities such as water and hydrogen from entering the transistor 200A from a substrate side. Accordingly, for the insulating layer 210, it is preferable to use an insulating material having a function of inhibiting diffusion of impurities such as hydrogen atoms, hydrogen molecules, water molecules, and copper atoms (through which the above impurities are less likely to pass). Alternatively, it is preferable to use an insulating material that has a function of inhibiting diffusion of oxygen (e.g., at least one of oxygen atoms, oxygen molecules, and the like) (through which the above oxygen is less likely to pass). For example, aluminum oxide, silicon nitride, or the like may be used for the insulating layer 210. With this structure, impurities such as hydrogen and water can be inhibited from diffusing into the transistor 200A side from the side closer to the substrate than the insulating layer 210.

For example, the dielectric constant of the insulating layer 212 is preferably lower than that of the insulating layer 210. When a material with a low dielectric constant is used for the interlayer film, the parasitic capacitance generated between wirings can be reduced.

The conductive layer 203 is formed to be embedded in the insulating layer 212. Here, the level of the top surface of the conductive layer 203 and the level of the top surface of the insulating layer 212 can be substantially the same. Note that although the conductive layer 203 has a single layer, the present invention is not limited thereto. For example, the conductive layer 203 may have a multilayer structure of two or more layers. Note that for the conductive layer 203, a conductive material that has high conductivity and contains tungsten, copper, or aluminum as its main component is preferably used.

In the transistor 200A, the conductive layer 260 functions as the first gate in some cases. The conductive layer 205 functions as the second gate in some cases. In such cases, a potential applied to the conductive layer 205 is changed not in synchronization with but independently of a potential applied to the conductive layer 260, whereby the threshold voltage of the transistor 200A can be controlled. In particular, the threshold voltage of the transistor 200A can become higher and the off-state current can be reduced by applying a negative potential to the conductive layer 205. Thus, a drain current at the time when a potential applied to the conductive layer 260 is 0 V can be lower in the case where a negative potential is applied to the conductive layer 205 than in the case where a negative potential is not applied to the conductive layer 205.

For example, when the conductive layer 205 and the conductive layer 260 are provided to overlap with each other, in the case where a potential is applied to the conductive layer 260 and the conductive layer 205, an electric field generated from the conductive layer 260 and an electric field generated from the conductive layer 205 are connected and can cover a channel formation region formed in the oxide 230.

That is, the channel formation region can be electrically surrounded by the electric field of the conductive layer 260 having a function of the first gate and the electric field of the conductive layer 205 having a function of the second gate. In this specification, a transistor structure in which a channel formation region is electrically surrounded by electric fields of the first gate and the second gate is referred to as a surrounded channel (S-channel) structure.

Like the insulating layer 210 or the insulating layer 212, the insulating layer 214 and the insulating layer 216 function as interlayer films. For example, the insulating layer 214 preferably functions as a barrier film that inhibits impurities such as water and hydrogen from entering the transistor 200A from the substrate side. This structure can inhibit diffusion of impurities such as hydrogen and water to the transistor 200A side from the substrate side of the insulating layer 214. Moreover, for example, the insulating layer 216 preferably has a lower dielectric constant than the insulating layer 214. When a material with a low dielectric constant is used for the interlayer film, the parasitic capacitance generated between wirings can be reduced.

In the conductive layer 205 functioning as the second gate, the conductive layer 205a is formed in contact with an inner wall of an opening in the insulating layer 214 and the insulating layer 216, and the conductive layer 205b is formed further inside. Here, the top surfaces of the conductive layer 205a and the conductive layer 205b and the top surface of the insulating layer 216 can be substantially level with each other. Although the transistor 200A having a structure in which the conductive layer 205a and the conductive layer 205b are stacked is illustrated, the present invention is not limited thereto. For example, the conductive layer 205 may have a single-layer structure or a stacked-layer structure of three or more layers.

Here, for the conductive layer 205a, a conductive material that has a function of inhibiting diffusion of impurities such as hydrogen atoms, hydrogen molecules, water molecules, and copper atoms (through which the above impurities are less likely to pass) is preferably used. Alternatively, a conductive material having a function of inhibiting diffusion of oxygen (e.g., at least one of oxygen atoms, oxygen molecules, and the like) (through which the above oxygen is not easily pass) is preferably used. Note that in this specification, a function of inhibiting diffusion of impurities or oxygen means a function of inhibiting diffusion of any one or all of the impurities and the oxygen.

For example, when the conductive layer 205a has a function of inhibiting diffusion of oxygen, a reduction in conductivity of the conductive layer 205b due to oxidation can be inhibited.

In the case where the conductive layer 205 also functions as a wiring, the conductive layer 205b is preferably formed using a conductive material that has high conductivity and contains tungsten, copper, or aluminum as its main component. In that case, the conductive layer 203 is not necessarily provided. Note that the conductive layer 205b is illustrated as a single layer but may have a stacked-layer structure: for example, a stack of any of the above conductive materials and titanium or titanium nitride.

Here, it is preferable that oxygen be released from the insulating layer 224 in contact with the oxide 230 by heating. In this specification, oxygen that is released by heating is referred to as excess oxygen in some cases. For example, for the insulating layer 224, silicon oxide, silicon oxynitride, or the like is appropriately used. When an insulator containing oxygen is provided in contact with the oxide 230, oxygen vacancies in the oxide 230 can be reduced and the reliability of the transistor 200A can be improved.

As the insulating layer 224, specifically, an oxide material from which part of oxygen is released by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, more preferably greater than or equal to $2.0 \times 10^{19}$ atoms/cm$^3$ or greater than or equal to $3.0 \times 10^2$ atoms/cm$^3$ in thermal desorption spectroscopy analysis method (TDS). Note that the temperature of the film surface in the TDS analysis is preferably higher than or equal to 100° C. and lower than or equal to 700° C., or higher than or equal to 100° C. and lower than or equal to 400° C.

FIG. 10 shows a structure where the insulating layer 224 is positioned in a region which overlaps with the oxide 230a and the oxide 230b; however, the structure is not limited thereto, and the insulating layer 224 may be positioned in a region which does not overlap with the oxide 230a or the oxide 230b. That is, in the region which does not overlap with the oxide 230a or the oxide 230b, the insulating layer 224 may be positioned between the insulating layer 222 and the oxide 230c, and between the insulating layer 222 and the insulating layer 274.

The insulating layer 222 preferably has a barrier property. The insulating layer 222 having a barrier property functions as a layer that inhibits entry of impurities such as hydrogen to the transistor 200A from the peripheral portion of the transistor 200A.

For example, a single layer or a stacked layer of an insulator containing what is called a high-k material such as aluminum oxide, hafnium oxide, oxide containing aluminum and hafnium (hafnium aluminate), tantalum oxide, zirconium oxide, lead zirconate titanate (PZT), strontium titanate (SrTiO$_3$), or (Ba,Sr)TiO$_3$ (BST) is preferably used for the insulating layer 222. As miniaturization and high integration of transistors progress, a problem such as leakage current may arise because of a thinner gate insulating layer. When a high-k material is used for an insulator functioning as a gate insulating layer, a gate potential during operation of the transistor can be reduced while the physical thickness of the gate insulating layer is maintained.

For example, it is preferable that the insulating layer 220 be thermally stable. For example, silicon oxide and silicon oxynitride, which have thermal stability, are preferable. Furthermore, combination of an insulator which is a high-k material and silicon oxide or silicon oxynitride enables formation of an insulating layer 220 with a stacked-layer structure with thermal stability and a high dielectric constant.

The second gate insulating layer may have a single-layer structure or a stacked-layer structure of two layers or four or more layers, although a three-layer structure is illustrated in FIG. 10. In that case, without limitation to a stacked-layer structure formed of the same material, a stacked-layer structure formed of different materials may be employed.

The oxide 230 having a region functioning as the channel formation region includes the oxide 230a, the oxide 230b over the oxide 230a, and the oxide 230c over the oxide 230b. Including the oxide 230a below the oxide 230b makes it possible to inhibit diffusion of impurities into the oxide 230b from the components formed below the oxide 230a. Moreover, including the oxide 230c over the oxide 230b makes it possible to inhibit diffusion of impurities into the oxide 230b from the components formed above the oxide 230c. As the oxide 230, an oxide semiconductor shown below, which is one kind of metal oxide, can be used.

The transistor 200A shown in FIG. 10 includes a region where the conductive layer 242 (the conductive layer 242a and the conductive layer 242b), the oxide 230c, the insulating layer 250, and the conductive layer 260 overlap with each other. With this structure, a transistor having a high on-state current can be provided. Moreover, a transistor having high controllability can be provided.

A metal such as aluminum, titanium, chromium, nickel, copper, yttrium, zirconium, molybdenum, silver, tantalum, or tungsten or an alloy containing any of the metals as its main component can be used for the conductive layer 242. In particular, a metal nitride film of tantalum nitride or the like is preferable because it has a barrier property against hydrogen or oxygen and its oxidation resistance is high.

Although a single-layer structure for the conductive layer 242 is shown in FIG. 10, a stacked-layer structure of two or more layers may be employed. For example, a tantalum nitride film and a tungsten film may be stacked. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

A three-layer structure consisting of a titanium film or a titanium nitride film, an aluminum film or a copper film stacked over the titanium film or the titanium nitride film, and a titanium film or a titanium nitride film formed thereover; a three-layer structure consisting of a molybdenum film or a molybdenum nitride film, an aluminum film or a copper film stacked over the molybdenum film or the molybdenum nitride film, and a molybdenum film or a molybdenum nitride film formed thereover; or the like may be employed. Note that a transparent conductive material containing indium oxide, tin oxide, or zinc oxide may be used.

A barrier layer may be provided over the conductive layer 242. The barrier layer is preferably formed using a material having a barrier property against oxygen or hydrogen. This structure can inhibit oxidation of the conductive layer 242 at the time of forming the insulating layer 274.

For example, a metal oxide can be used for the above barrier layer. In particular, an insulating film of aluminum oxide, hafnium oxide, gallium oxide, or the like, which has a barrier property against oxygen and hydrogen, is preferably used. Alternatively, silicon nitride formed by a CVD method may be used.

When the above barrier layer is included, the range of choices for the materials of the conductive layer 242 can be expanded. For example, a material having a low oxidation resistance and high conductivity, such as tungsten or aluminum, can be used for the conductive layer 242. Moreover, for example, a conductor that can be easily deposited or processed can be used.

As miniaturization and high integration of transistors progress, a problem such as leakage current may arise because of a thinner gate insulating layer. In that case, the insulating layer 250 may have a stacked-layer structure like the second gate insulating layer. When the insulator functioning as the gate insulating layer has a stacked-layer structure of a high-k material and a thermally stable material, a gate potential during operation of the transistor can be reduced while the physical thickness of the gate insulating layer is maintained. Furthermore, the stacked-layer structure can be thermally stable and have a high dielectric constant.

The conductive layer 260 functioning as the first gate includes the conductive layer 260a and the conductive layer 260b over the conductive layer 260a. Like the conductive layer 205a, the conductive layer 260a is preferably formed using a conductive material having a function of inhibiting diffusion of impurities such as hydrogen atoms, hydrogen molecules, water molecules, and copper atoms. Alternatively, it is preferable to use a conductive material having a function of inhibiting diffusion of oxygen (e.g., at least one of oxygen atoms, oxygen molecules, and the like).

When the conductive layer 260a has a function of inhibiting oxygen diffusion, the range of choices for the materials of the conductive layer 260b can be expanded. That is, having the conductive layer 260a inhibits oxidation of the conductive layer 260b, thereby preventing the decrease in conductivity of the conductive layer 260b.

As a conductive material having a function of inhibiting diffusion of oxygen, for example, tantalum, tantalum nitride, ruthenium, ruthenium oxide, or the like is preferably used. The oxide semiconductor that can be used for the oxide 230 can be used for the conductive layer 260a. In that case, when the conductive layer 260b is formed by a sputtering method, the electric resistance of the conductive layer 260a is lowered so that the conductive layer 260a can become a conductive layer. The conductive layer 260a formed in such a manner can be referred to as an OC (Oxide Conductor) electrode.

The conductive layer 260 functions as a wiring and thus is preferably formed using a conductor having high conductivity. For example, for the conductive layer 260b, a conductive material containing tungsten, copper, or aluminum as its main component can be used. The conductive layer 260b may have a stacked-layer structure: a stack of any of the above conductive materials and titanium or titanium nitride, for example.

The insulating layer 274 is preferably provided to cover the top surface and the side surface of the conductive layer 260, the side surface of the insulating layer 250, and the side surface of the oxide 230c. Note that the insulating layer 274 is preferably formed using an insulating material having a function of inhibiting diffusion of impurities such as water and hydrogen, and oxygen. For example, aluminum oxide or hafnium oxide is preferably used. In addition, other insulating materials, for example, a metal oxide such as magnesium oxide, gallium oxide, germanium oxide, yttrium oxide, zirconium oxide, lanthanum oxide, neodymium oxide, or tantalum oxide; silicon nitride oxide; silicon nitride; or the like can be used.

Providing the insulating layer 274 can inhibit oxidation of the conductive layer 260. Moreover, when the insulating layer 274 is included, diffusion of impurities such as water and hydrogen included in the insulating layer 280 into the transistor 200A can be inhibited.

Like the insulating layer 214, the insulating layer 282 preferably functions as a barrier insulating film that inhibits entry of impurities such as water or hydrogen into the transistor 200A from the outside.

Like the insulating layer 216, the insulating layer 280 and the insulating layer 284 preferably have a lower dielectric constant than the insulating layer 282. When a material with a low dielectric constant is used for the interlayer film, the parasitic capacitance generated between wirings can be reduced.

The transistor 200A may be electrically connected to another component through a plug or a wiring such as the conductive layer 246 embedded in the insulating layer 274, the insulating layer 280, the insulating layer 282, and the insulating layer 284.

As a material for the conductive layer 246, a single layer or a stacked layer of a conductive material such as a metal material, an alloy material, a metal nitride material, or a metal oxide material can be used as in the conductive layer 205. For example, it is preferable to use a high-melting-point material that has both heat resistance and conductivity, such as tungsten or molybdenum. Alternatively, it is preferable to use a low-resistance conductive material such as aluminum or copper. The use of a low-resistance conductive material can reduce wiring resistance.

For example, when the conductive layer 246 has a stacked-layer structure of tantalum nitride or the like, which is a conductor having a barrier property against hydrogen and oxygen, and tungsten, which has high conductivity, diffusion of impurities from the outside can be inhibited while the conductivity of a wiring is maintained.

An insulating layer 276 (an insulating layer 276a and an insulating layer 276b) having a barrier property may be provided between the conductive layer 246 and the insulating layer 280. Providing the insulating layer 276 can prevent oxygen in the insulating layer 280 from reacting with the conductive layer 246 and oxidizing the conductive layer 246.

Furthermore, with the insulating layer 276 having a barrier property, the range of choices for the materials of the conductor used as the plug or the wiring can be expanded. The use of a metal material having an oxygen absorbing property and high conductivity for the conductive layer 246, for example, can provide a semiconductor device with low power consumption. Specifically, a material having a low oxidation resistance and high conductivity, such as tungsten or aluminum, can be used. Moreover, for example, a conductor that can be easily deposited or processed can be used.

With the above structure, a semiconductor device including a transistor having a high on-state current can be provided. In addition, a semiconductor device including a transistor having a low off-state current can be provided. Alternatively, a semiconductor device that has small variations in electrical characteristics, stable electrical characteristics, and high reliability can be provided.

<Composing Materials>

[Substrate]

Although there is no particular limitation on a material used for a substrate, it is required to have heat resistance high enough to withstand at least heat treatment performed later. For example, a single crystal semiconductor substrate or a polycrystalline semiconductor substrate using silicon, silicon carbide, or the like as a material or a compound semiconductor substrate using silicon germanium or the like as a material can be used as the substrate. Furthermore, an SOI substrate, a substrate on which a semiconductor element such as a strained transistor or a FIN-type transistor is provided, or the like can be used. Alternatively, gallium arsenide, aluminum gallium arsenide, indium gallium arsenide, gallium nitride, indium phosphide, silicon germanium, or the like that can be used for a high electron mobility transistor (HEMT) may be used. That is, the substrate is not limited to a simple supporting substrate and may be a substrate where a device such as another transistor is formed.

Furthermore, a glass substrate of barium borosilicate glass, aluminoborosilicate glass, or the like, a ceramic substrate, a quartz substrate, a sapphire substrate, or the like can be used as the substrate. Note that a flexible substrate may be used as the substrate. In the case where a flexible substrate is used, a transistor, a capacitor, or the like may be directly fabricated over the flexible substrate, or a transistor, a capacitor, or the like may be fabricated over another fabrication substrate and then separated therefrom and transferred onto the flexible substrate. Note that to perform separation from the fabrication substrate and transfer to the flexible substrate, a separation layer is preferably provided between the fabrication substrate and the transistor, the capacitor, or the like.

For the flexible substrate, for example, a metal, an alloy, a resin, glass, or fiber thereof can be used. The flexible substrate used as the substrate preferably has a lower coefficient of linear expansion because deformation due to an environment is inhibited. For the flexible substrate used as the substrate, for example, a material whose coefficient of linear expansion is lower than or equal to $1\times10^{-3}$/K, lower than or equal to $5\times10^{-5}$/K, or lower than or equal to $1\times10^{-5}$/K is used. Examples of the resin include polyester, polyolefin, polyamide (e.g., nylon and aramid), polyimide, polycarbonate, and acrylic. In particular, aramid is suitable for the flexible substrate because of its low coefficient of linear expansion.

[Insulating Layer]

For the insulating layer, a single layer or a stack of a material selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like is used. A material in which a plurality of materials selected from an oxide material, a nitride material, an oxynitride material, and a nitride oxide material are mixed may be used.

Note that in this specification and the like, a nitride oxide refers to a compound in which the nitrogen content is higher than the oxygen content. An oxynitride refers to a compound in which the oxygen content is higher than the nitrogen content. The content of each element can be measured by Rutherford backscattering spectrometry (RBS), for example.

When an oxide semiconductor, which is one kind of metal oxide, is used for the semiconductor layer, the hydrogen concentration in the insulating layer is preferably lowered in order to prevent an increase in the hydrogen concentration in the semiconductor layer. Specifically, the hydrogen concentration in the insulating layer is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$ in secondary ion mass spectrometry (SIMS). It is particularly preferable to lower the hydrogen concentration in the insulating layer in contact with the semiconductor layer.

Furthermore, the nitrogen concentration in the insulating layer is preferably lowered in order to prevent an increase in the nitrogen concentration in the semiconductor layer. Specifically, the nitrogen concentration in the insulating layer is lower than or equal to $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$ in SIMS.

It is preferred that at least a region of the insulating layer in contact with the semiconductor layer has few defects and typically has as few signals observed by electron spin resonance (ESR) spectroscopy as possible. An example of the signals is an E' center observed at a g-factor of 2.001. Note that the E' center is due to the dangling bond of silicon. For example, in the case where a silicon oxide layer or a silicon oxynitride layer is used as the insulating layer, a silicon oxide layer or a silicon oxynitride layer whose spin density due to the E' center is lower than or equal to $3\times10^{17}$ spins/cm$^3$, preferably lower than or equal to $5\times10^{16}$ spins/cm$^3$ is used.

In addition to the above-described signal, a signal due to nitrogen dioxide (NO$_2$) may be observed. The signal is divided into the following three signals according to the nitride's nuclear spin: a signal observed at ag-factor of greater than or equal to 2.037 and less than or equal to 2.039 (referred to as a first signal), a signal observed at a g-factor of greater than or equal to 2.001 and less than or equal to 2.003 (referred to as a second signal), and a signal observed at a g-factor of greater than or equal to 1.964 and less than or equal to 1.966 (referred to as a third signal).

For example, as the insulating layer, it is suitable to use an insulating layer whose spin density of a signal due to nitrogen dioxide (NO$_2$) is higher than or equal to $1\times10^{17}$ spins/cm$^3$ and lower than $1\times10^{18}$ spins/cm$^3$.

Note that nitrogen oxide (NOx) including nitrogen dioxide (NO$_2$) forms a state in the insulating layer. The state is positioned in the energy gap of the oxide semiconductor layer. Thus, when nitrogen oxide (NOx) diffuses to the interface between the insulating layer and the oxide semiconductor layer, electrons may be trapped by the state on the insulating layer side. As a result, the trapped electrons remain in the vicinity of the interface between the insulating layer and the oxide semiconductor layer; hence, the threshold voltage of the transistor is shifted in the positive direction. Therefore, a shift in the threshold voltage of the transistor can be reduced when a film with a low nitrogen oxide content is used as the insulating layer.

As an insulating layer that releases a small amount of nitrogen oxide (NOx), for example, a silicon oxynitride layer can be used. The silicon oxynitride layer is a film of which the released amount of ammonia is larger than the released amount of nitrogen oxide (NOx) in TDS; the released amount of ammonia is typically greater than or equal to $1\times10^{18}$ molecules/cm$^3$ and less than or equal to $5\times10^{19}$ molecules/cm$^3$. Note that the released amount of ammonia is the total amount in the range of the heat treatment temperature in TDS from 50° C. to 650° C. or from 50° C. to 550° C.

Since nitrogen oxide (NOx) reacts with ammonia and oxygen in heat treatment, the use of an insulating layer that releases a large amount of ammonia reduces nitrogen oxide (NOx).

At least one of the insulating layers in contact with the oxide semiconductor layer is preferably formed using an insulating layer from which oxygen is released by heating. Specifically, it is preferable to use an insulating layer in which the amount of released oxygen converted into oxygen atoms is $1.0\times10^{18}$ atoms/cm$^3$ or more, $1.0\times10^{19}$ atoms/cm$^3$ or more, or $1.0\times10^{20}$ atoms/cm$^3$ or more in TDS performed with heat treatment where the surface temperature of the insulating layer is higher than or equal to 100° C. and lower than or equal to 700° C., preferably higher than or equal to 100° C. and lower than or equal to 500° C.

Furthermore, an insulating layer containing excess oxygen can also be formed by the process of performing treatment for adding oxygen to an insulating layer. The treatment for adding oxygen can be performed by heat treatment, plasma treatment, or the like in an oxidizing atmosphere. Alternatively, oxygen may be added by an ion implantation method, an ion doping method, a plasma immersion ion implantation method, or the like. Examples of a gas used in the treatment for adding oxygen include an oxygen gas such as $^{16}O_2$ or $^{18}O_2$ and a gas containing oxygen, such as a nitrous oxide gas or an ozone gas. Note that in this specification, the treatment for adding oxygen is also referred to as "oxygen doping treatment". The oxygen doping treatment may be performed while the substrate is heated.

For the insulating layer, a heat-resistant organic material such as polyimide, an acrylic-based resin, a benzocyclobutene-based resin, polyamide, or an epoxy-based resin can be used. Other than the above organic materials, it is also possible to use a low-dielectric constant material (a low-k material), a siloxane-based resin, PSG (phosphosilicate glass), BPSG (borophosphosilicate glass), or the like. Note that the insulating layer may be formed by stacking a plurality of insulating layers formed of these materials.

Note that the siloxane-based resin corresponds to a resin including a Si—O—Si bond formed using a siloxane-containing material as a starting material. The siloxane-based resin may include an organic group (e.g., an alkyl group or an aryl group) or a fluoro group as a substituent. In addition, the organic group may include a fluoro group.

There is no particular limitation on the method for forming the insulating layer. Note that a baking step is necessary in some cases depending on a material used for the insulating layer. In this case, when the baking step of the insulating layer also serves as another heat treatment step, the transistor can be manufactured efficiently.

[Electrode]

As a conductive material for forming the electrode, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like can be used. A semiconductor having high electrical conductivity, typified by polycrystalline silicon containing an impurity element such as phosphorus, or silicide such as nickel silicide may be used.

A conductive material containing the above metal element and oxygen may be used. A conductive material containing the above metal element and nitrogen may be used. For example, a conductive material containing nitrogen, such as titanium nitride or tantalum nitride, may be used. Indium tin oxide (ITO), indium oxide containing tungsten oxide, indium zinc oxide containing tungsten oxide, indium oxide containing titanium oxide, indium tin oxide containing titanium oxide, indium zinc oxide, indium gallium zinc oxide, or indium tin oxide to which silicon is added may be used. Furthermore, indium gallium zinc oxide containing nitrogen may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed. A stacked-layer structure combining a conductive material containing nitrogen and a conductive material containing oxygen may be employed.

Note that in the case where an oxide semiconductor is used for the semiconductor layer and the gate electrode employs a stacked-layer structure combining a material containing the above metal element and a conductive material containing oxygen, the conductive material containing oxygen is preferably provided on the semiconductor layer side. By providing the conductive material containing oxygen on the semiconductor layer side, oxygen released from the conductive material is easily supplied to the semiconductor layer.

For the electrode, a conductive material with high embeddability, such as tungsten or polysilicon, can be used, for example. A conductive material with high embeddability and a barrier layer (a diffusion prevention layer) such as a titanium layer, a titanium nitride layer, or a tantalum nitride layer may be used in combination. Note that the electrode may be referred to as a "contact plug".

In particular, the electrode in contact with the gate insulating layer is preferably formed using a conductive material through which impurities are less likely to pass. An example of the conductive material through which impurities are less likely to pass is tantalum nitride.

When an insulating material through which impurities are less likely to pass is used for the insulating layer and a conductive material through which impurities are less likely to pass is used for the electrode, diffusion of impurities to the transistor can be further inhibited. Thus, the reliability of the transistor can be further increased. That is, the reliability of the memory device can be further increased.

[Semiconductor Layer]

For the semiconductor layer, a single crystal semiconductor, a polycrystalline semiconductor, a microcrystalline semiconductor, an amorphous semiconductor, or the like can be used alone or in combination. For a semiconductor material, silicon, germanium, or the like can be used, for example. Furthermore, an organic semiconductor, a compound semiconductor such as silicon germanium, silicon carbide, gallium arsenide, an oxide semiconductor, or a nitride semiconductor, or the like can be used.

In the case of using an organic semiconductor for the semiconductor layer, a low molecular organic material having an aromatic ring, a π-electron conjugated conductive polymer, or the like can be used. For example, rubrene, tetracene, pentacene, perylenediimide, tetracyanoquinodimethane, polythiophene, polyacetylene, or polyparaphenylene vinylene can be used.

Note that semiconductor layers may be stacked. In the case of stacking semiconductor layers, semiconductor materials having different crystal states may be used or different semiconductor materials may be used.

The bandgap of an oxide semiconductor, which is one kind of metal oxide, is greater than or equal to 2 eV; thus, the use of the oxide semiconductor for the semiconductor layer can achieve a transistor with an extremely low off-state current. Specifically, the off-state current per micrometer of channel width at room temperature (typically 25° C.) at a voltage between a source and a drain of 3.5 V can be lower than $1\times10^{-20}$ A, lower than $1\times10^{-22}$ A, or lower than $1\times10^{-24}$ A. That is, the on/off ratio can be greater than or equal to 20 digits. In addition, a transistor using an oxide semiconductor for the semiconductor layer (an OS transistor) has high withstand voltage between its source and drain. Thus, a transistor with high reliability can be provided. A transistor with high output voltage and high withstand voltage can be provided. A memory device or the like with high reliability can be provided. A memory device with high output voltage and high withstand voltage can be provided.

In this specification and the like, a transistor in which silicon having crystallinity is used for a semiconductor layer where a channel is formed is also referred to as a "crystalline Si transistor".

The crystalline Si transistor tends to have relatively high mobility compared with the OS transistor. On the other hand, the crystalline Si transistor has difficulty in obtaining an extremely low off-state current unlike the OS transistor. Thus, it is important that the semiconductor material used for the semiconductor layer be properly selected depending on the purpose and the usage. For example, depending on the purpose and the usage, the OS transistor and the crystalline Si transistor and the like may be used in combination.

In the case where an oxide semiconductor layer is used as the semiconductor layer, the oxide semiconductor layer is preferably formed by a sputtering method. The oxide semiconductor layer is preferably formed by a sputtering method, in which case the density of the oxide semiconductor layer can be increased. When the oxide semiconductor layer is formed by a sputtering method, a rare gas (typically argon), oxygen, or a mixed gas of a rare gas and oxygen is used as a sputtering gas. In addition, increasing the purity of a sputtering gas is necessary. For example, as an oxygen gas or a rare gas used as a sputtering gas, a gas that is highly purified to have a dew point of −60° C. or lower, preferably −100° C. or lower is used. When the highly purified sputtering gas is used for the deposition, entry of moisture or the like into the oxide semiconductor layer can be prevented as much as possible.

Furthermore, in the case where the oxide semiconductor layer is formed by a sputtering method, moisture in a deposition chamber of a sputtering apparatus is preferably removed as much as possible. For example, with an adsorption vacuum evacuation pump such as a cryopump, the deposition chamber is preferably evacuated to be a high vacuum state (to a degree of approximately $5\times10^{-7}$ Pa to $1\times10^{-4}$ Pa). In particular, the partial pressure of gas molecules corresponding to $H_2O$ (gas molecules corresponding to m/z=18) in the deposition chamber in the standby mode of the sputtering apparatus is preferably lower than or equal to $1\times10^{-4}$ Pa, further preferably lower than or equal to $5\times10^{-5}$ Pa.

[Metal Oxide]

The oxide semiconductor, which is one kind of metal oxide, preferably contains at least indium or zinc. In particular, indium and zinc are preferably contained. Aluminum, gallium, yttrium, tin, or the like is preferably contained in addition to them. Furthermore, one or a plurality of kinds selected from boron, titanium, iron, nickel, germanium, zirconium, molybdenum, lanthanum, cerium, neodymium, hafnium, tantalum, tungsten, magnesium, and the like may be contained.

Here, the case where the oxide semiconductor contains indium, an element M, and zinc is considered. Note that the element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, magnesium, and the like. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride.

[Structure of Metal Oxide]

An oxide semiconductor, which is one type of metal oxide, is classified into a single crystal oxide semiconductor and anon-single-crystal oxide semiconductor. Examples of the non-single-crystal oxide semiconductor include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as a grain boundary) even in the vicinity of the distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M in the (M, Zn) layer is replaced with indium, the layer can also be referred to as an (In, M, Zn) layer. Furthermore, when indium in the In layer is replaced with the element M, the layer can also be referred to as an (In, M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Furthermore, entry of impurities, formation of defects, or the like might decrease the crystallinity of a metal oxide, which means that the CAAC-OS is a metal oxide having small amounts of impurities and defects (e.g., oxygen vacancies). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

An a-like OS is a metal oxide having a structure between those of the nc-OS and an amorphous oxide semiconductor. The a-like OS contains a void or a low-density region. That is, the a-like OS has low crystallinity compared with the nc-OS and the CAAC-OS.

An oxide semiconductor (metal oxide) can have various structures which show different properties. The oxide semiconductor may include two or more of an amorphous oxide semiconductor, a polycrystalline oxide semiconductor, an a-like OS, an nc-OS, and a CAAC-OS.

[Transistor Including Metal Oxide]

Next, the case where the above metal oxide is used in a channel formation region for a transistor will be described.

Note that when the above metal oxide is used in a channel formation region for a transistor, a transistor having high field-effect mobility can be achieved. In addition, a transistor having high reliability can be achieved.

Furthermore, a metal oxide with a low carrier density is preferably used for the transistor. In the case where the carrier density of a metal oxide film is reduced, the impurity concentration in the metal oxide film is reduced to reduce the density of defect states. In this specification and the like, a state with a low impurity concentration and a low density of defect states is referred to as a highly purified intrinsic or substantially highly purified intrinsic state. For example, a metal oxide has a carrier density lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$.

A highly purified intrinsic or substantially highly purified intrinsic metal oxide film has a low density of defect states and accordingly may have a low density of trap states.

Charges trapped by the trap states in the metal oxide take a long time to be released and may behave like fixed charges. Thus, a transistor whose channel formation region includes a metal oxide having a high density of trap states has unstable electrical characteristics in some cases.

Accordingly, in order to obtain stable electrical characteristics of the transistor, it is effective to reduce the impurity concentration in the metal oxide. In addition, in order to reduce the impurity concentration in the metal oxide, the impurity concentration in an adjacent film is also preferably reduced. Examples of impurities include hydrogen, nitrogen, an alkali metal, an alkaline earth metal, iron, nickel, and silicon.

[Impurities]

Here, the influence of each impurity in the metal oxide will be described.

When silicon or carbon, which is a Group 14 element, is contained in the metal oxide, defect states are formed in the metal oxide. Thus, the concentration of silicon or carbon in the metal oxide and the concentration of silicon or carbon in the vicinity of an interface with the metal oxide (the concentration obtained by SIMS) are set to lower than or equal to $2 \times 10^{18}$ atoms/cm$^3$, preferably lower than or equal to $2 \times 10^{17}$ atoms/cm$^3$.

When the metal oxide contains an alkali metal or an alkaline earth metal, defect states are formed and carriers are generated in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS is set lower than or equal to $1 \times 10^{18}$ atoms/cm$^3$, preferably lower than or equal to $2 \times 10^{16}$ atoms/cm$^3$.

When containing nitrogen, the metal oxide easily becomes n-type by generation of electrons serving as carriers and an increase in carrier density. As a result, a transistor using a metal oxide that contains nitrogen for its channel formation region is likely to have normally-on characteristics. Thus, nitrogen in the channel formation region in the metal oxide is preferably reduced as much as possible. For example, the nitrogen concentration in the metal oxide is set lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$ in SIMS.

Hydrogen contained in a metal oxide reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using the metal oxide that contains hydrogen for its channel formation region is likely to have normally-on characteristics. Accordingly, hydrogen in the metal oxide is preferably reduced as much as possible. Specifically, the hydrogen concentration of the metal oxide obtained by SIMS is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

When a metal oxide in which impurities are sufficiently reduced is used in a channel formation region of a transistor, stable electrical characteristics can be given.

Note that as a metal oxide used for a semiconductor of a transistor, a thin film having high crystallinity is preferably used. With the use of the thin film, the stability or the reliability of the transistor can be improved. Examples of the thin film include a thin film of a single-crystal metal oxide and a thin film of a polycrystalline metal oxide. However, to form the thin film of a single-crystal metal oxide or the thin film of a polycrystalline metal oxide over a substrate, a high-temperature process or a laser heating process is needed. Thus, the manufacturing cost is increased, and in addition, the throughput is decreased.

Non-Patent Document 1 and Non-Patent Document 2 have reported that an In—Ga—Zn oxide having a CAAC structure (referred to as CAAC-IGZO) was found in 2009. It has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, in 2013, an In—Ga—Zn oxide having an nc structure (referred to as nc-IGZO) was found (see Non-Patent Document 3). It has been reported that nc-IGZO has periodic atomic arrangement in a microscopic region (for example, a region with a size greater than or equal to 1 nm and less than or equal to 3 nm) and there is no regularity of crystal orientation between different regions.

Non-Patent Document 4 and Non-Patent Document 5 have shown a change in average crystal size due to electron beam irradiation to thin films of the above CAAC-IGZO, the above nc-IGZO, and IGZO having low crystallinity. In the thin film of IGZO having low crystallinity, crystalline IGZO of approximately 1 nm was observed even before the electron beam irradiation. Thus, it has been reported that the existence of a completely amorphous structure was not observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used for a semiconductor of a transistor.

Non-Patent Document 6 shows that a transistor using a metal oxide has an extremely low leakage current in an off state; specifically, the off-state current per micrometer in the channel width of the transistor is of the order of yA/μm ($10^{-24}$ A/m). For example, a low-power-consumption CPU applying a characteristic of low leakage current of the transistor using a metal oxide is disclosed (see Non-Patent Document 7).

Furthermore, an application of a transistor using a metal oxide to a display device that utilizes the characteristic of a low leakage current of the transistor has been reported (see Non-Patent Document 8). In the display device, a displayed image is changed several tens of times per second. The number of times an image is changed per second is referred to as a refresh rate. The refresh rate is also referred to as driving frequency. Such high-speed screen change that is hard for human eyes to recognize is considered as a cause of eyestrain. Thus, it is proposed that the refresh rate of the display device is lowered to reduce the number of times of image rewriting. Moreover, driving with a lowered refresh rate enables the power consumption of the display device to be reduced. Such a driving method is referred to as idling stop (IDS) driving.

The discovery of the CAAC structure and the nc structure has contributed to an improvement in electrical characteristics and reliability of a transistor using a metal oxide having the CAAC structure or the nc structure, a reduction in manufacturing cost, and an improvement in throughput. Furthermore, applications of the transistor to a display device and an LSI utilizing the characteristics of a low leakage current of the transistor have been studied.

<Film Formation Method>

An insulating material for forming the insulating layer, a conductive material for forming the electrode, or a semiconductor material for forming the semiconductor layer can be formed by a sputtering method, a spin coating method, a CVD (Chemical Vapor Deposition) method (including a thermal CVD method, an MOCVD (Metal Organic Chemical Vapor Deposition) method, a PECVD (Plasma Enhanced CVD) method, a high density plasma CVD method, an LPCVD (low pressure CVD) method, an APCVD (atmospheric pressure CVD) method, and the like), an ALD (Atomic Layer Deposition) method, an MBE (Molecular Beam Epitaxy) method, a PLD (Pulsed Laser Deposition) method, a dipping method, a spray coating method, a droplet discharging method (e.g., an inkjet method), a printing method (e.g., screen printing or offset printing), or the like.

By a plasma CVD method, a high-quality film can be obtained at a relatively low temperature. With the use of a film formation method that does not use plasma at the time of film formation, such as an MOCVD method, an ALD method, or a thermal CVD method, damage is not easily caused on a surface where the film is formed. For example, a wiring, an electrode, an element (e.g., a transistor or a capacitor), or the like included in a memory device might be charged up by receiving charges from plasma. In that case, accumulated charges might break the wiring, electrode, element, or the like included in the memory device. By contrast, in the case of a film formation method not using plasma, such plasma damage is not caused; thus, the yield of memory devices can be increased. Moreover, since plasma damage during film formation is not caused, a film with few defects can be obtained.

Unlike a film formation method in which particles ejected from a target or the like are deposited, a CVD method and an ALD method are film formation methods in which a film is formed by reaction at a surface of an object. Thus, a CVD method and an ALD method are film formation methods that enable favorable step coverage almost regardless of the shape of an object. In particular, an ALD method enables excellent step coverage and excellent thickness uniformity and can be favorably used to cover a surface of an opening with a high aspect ratio, for example. On the other hand, an ALD method has a relatively low deposition rate, and thus is preferably used in combination with another film formation method with a high deposition rate, such as a CVD method, in some cases.

When a CVD method or an ALD method is used, the composition of a film to be formed can be controlled with a flow rate ratio of source gases. For example, by a CVD method or an ALD method, a film with a certain composition can be formed depending on the flow rate ratio of the source gases. Moreover, with a CVD method or an ALD method, by changing the flow rate ratio of the source gases while forming the film, a film whose composition is continuously changed can be formed. In the case of forming a film while changing the flow rate ratio of the source gases, as compared with the case of forming a film with the use of a plurality of deposition chambers, the time taken for the film formation can be shortened because the time taken for transfer and pressure adjustment is omitted. Thus, memory devices can be manufactured with improved productivity in some cases.

Note that in the case of forming a film by an ALD method, a gas that does not contain chlorine is preferably used as a material gas.

<Transistor Structure Example 2>

Figure 11A:
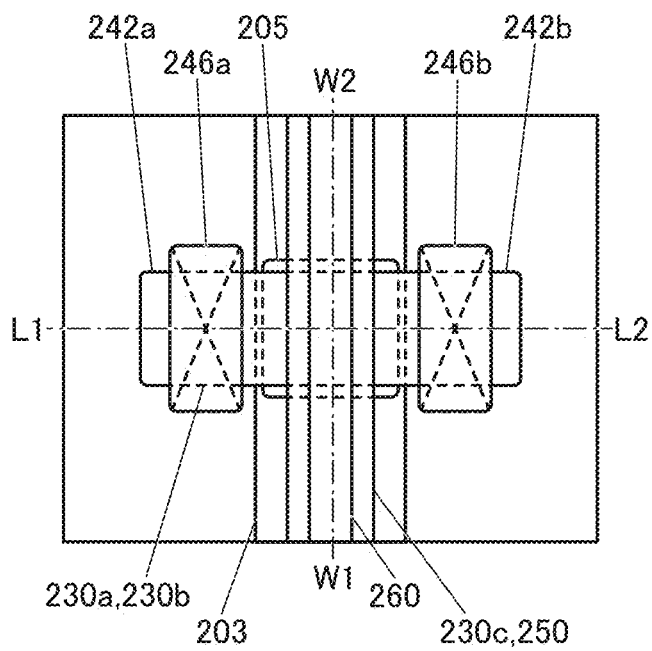
FIGS. 11A-11C Diagrams showing a structure example of a transistor of one embodiment of the present invention.
Figure 11C:
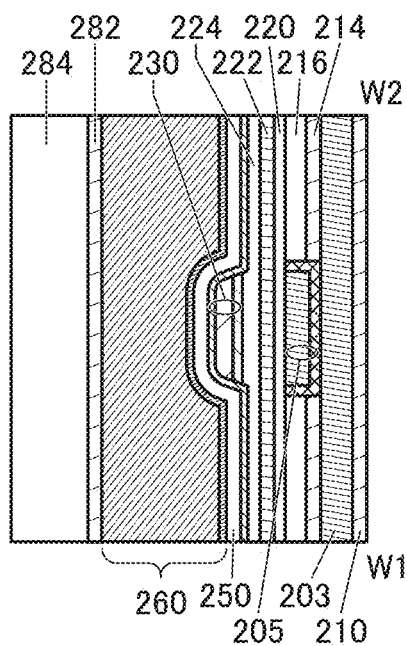
Figure 11B:
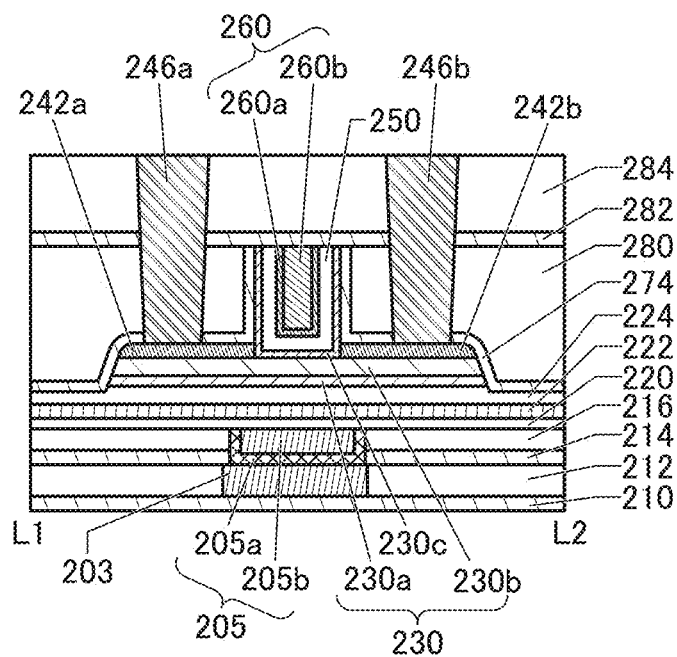

A structure example of a transistor 200B is described with reference to FIGS. 11(A) to 11(C). FIG. 11(A) is a top view of the transistor 200B. FIG. 11(B) is a cross-sectional view of a portion indicated by a dashed-dotted line L1-L2 in FIG. 11(A). FIG. 11(C) is a cross-sectional view of a portion indicated by a dashed-dotted line W1-W2 in FIG. 11(A). Note that for clarity of the drawing, some components are not illustrated in the top view of FIG. 11(A).

The transistor 200B is a variation example of the transistor 200A. Therefore, differences from the transistor 200A will be mainly described to avoid repeated description.

In the transistor 200B shown in FIG. 11, the oxide 230*c*, the insulating layer 250, and the conductive layer 260 are placed in an opening portion provided in the insulating layer 280 with the insulating layer 274 positioned therebetween. The oxide 230c, the insulating layer 250, and the conductive layer 260 are placed between the conductive layer 242a and the conductive layer 242b.

Note that the oxide 230c is preferably provided in the opening in the insulating layer 280 with the insulating layer 274 positioned therebetween. When the insulating layer 274 has a barrier property, diffusion of impurities from the insulating layer 280 into the oxide 230 can be prevented.

The insulating layer 250 is preferably provided in the opening in the insulating layer 280 with the oxide 230c and the insulating layer 274 therebetween.

The insulating layer 274 is positioned between the insulating layer 280 and the transistor 200B. The insulating layer 274 is preferably formed using an insulating material having a function of inhibiting diffusion of impurities such as water and hydrogen, and oxygen. For example, aluminum oxide, hafnium oxide, or the like is preferably used. Alternatively, for example, a metal oxide such as magnesium oxide, gallium oxide, germanium oxide, yttrium oxide, zirconium oxide, lanthanum oxide, neodymium oxide, or tantalum oxide, silicon nitride oxide, silicon nitride, or the like can be used.

When the insulating layer 274 is included, impurities such as water and hydrogen included in the insulating layer 280 can be inhibited from diffusing into the oxide 230b through the oxide 230c and the insulating layer 250. The excess oxygen contained by the insulating layer 280 can inhibit oxidation of the conductive layer 260.

<Transistor Structure Example 3>

Figure 12A:
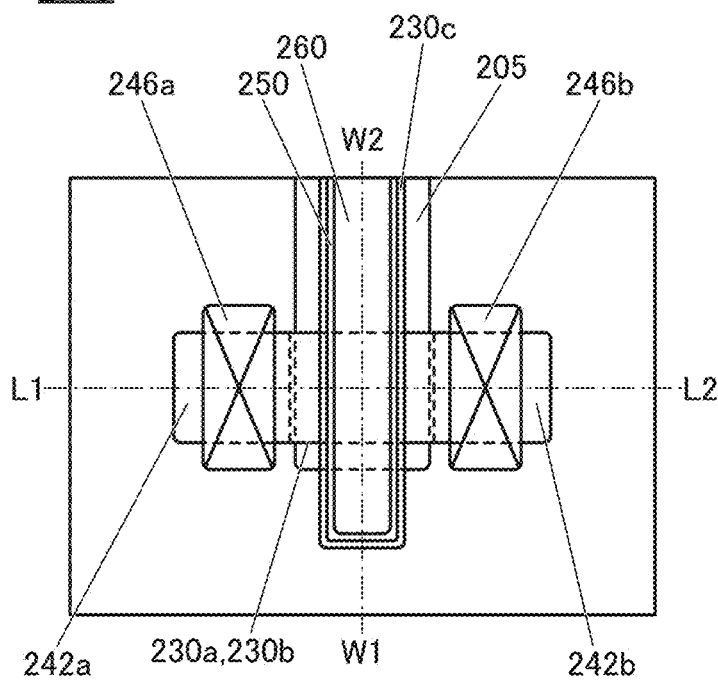
FIGS. 12A-12C Diagrams showing a structure example of a transistor of one embodiment of the present invention.
Figure 12C:
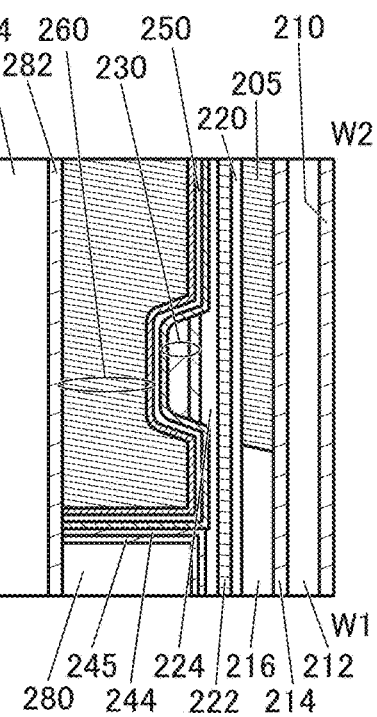
Figure 12B:
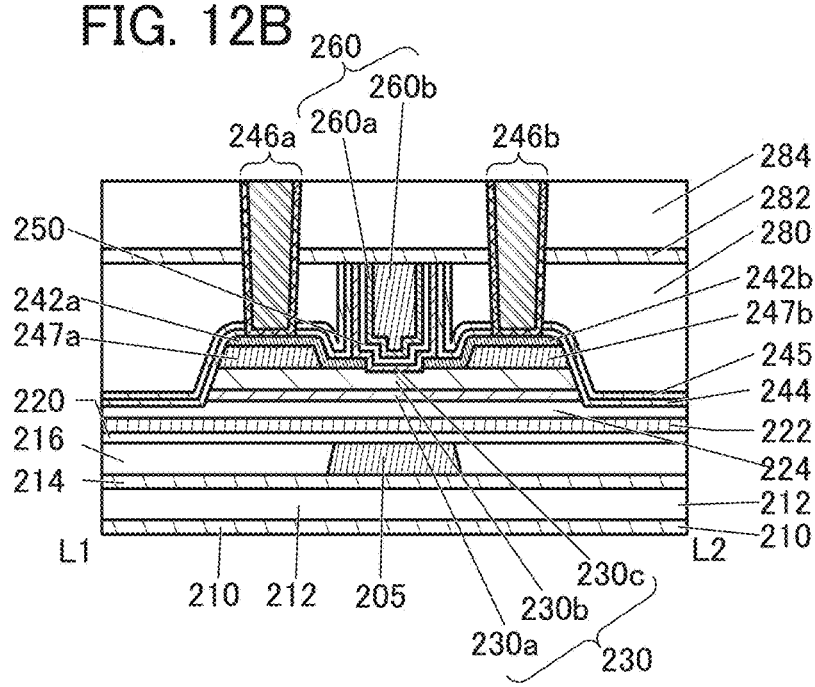

A structure example of a transistor 200C is described with reference to FIG. 12(A) to FIG. 12(C). FIG. 12(A) is a top view of the transistor 200C. FIG. 12(B) is a cross-sectional view of a portion indicated by a dashed-dotted line L1-L2 in FIG. 12(A). FIG. 12(C) is a cross-sectional view of a portion indicated by a dashed-dotted line W1-W2 in FIG. 12(A). Note that for clarity of the drawing, some components are not illustrated in the top view of FIG. 12(A).

The transistor 200C is a variation example of the transistor 200B. Therefore, differences from the transistor 200B will be mainly described to avoid repeated description.

The transistor 200C shown in FIG. 12 is provided with a conductive layer 247a between the conductive layer 242a and the oxide 230b, and a conductive layer 247b between the conductive layer 242b and the oxide 230b. Here, the conductive layer 242a (the conductive layer 242b) has a region that extends beyond the top surface and a side surface on the conductive layer 260 side of the conductive layer 247a (the conductive layer 247b) and is in contact with the top surface of the oxide 230b. Here, the conductive layer 247 (the conductive layer 247a and the conductive layer 247b) may be formed using the conductor that can be used for the conductive layer 242 (the conductive layer 242a and the conductive layer 242b). It is preferable that the thickness of the conductive layer 247 be at least greater than that of the conductive layer 242.

Because of the above structure, the conductive layer 242 in the transistor 200C shown in FIG. 12 can be closer to the conductive layer 260 than in the transistor 200B. Alternatively, the conductive layer 260 can overlap with an end portion of the conductive layer 242a and an end portion of the conductive layer 242b each other. Accordingly, the effective channel length of the transistor 200C can be shortened, and the on-state current and the frequency characteristics can be improved.

The conductive layer 247a (the conductive layer 247b) is preferably provided to overlap with the conductive layer 242a (the conductive layer 242b). With such a structure, in etching for forming an opening in which the conductive layer 246a (the conductive layer 246b) is to be embedded, the conductive layer 247a (the conductive layer 247b) functions as a stopper, thereby preventing over-etching of the oxide 230b.

In the transistor 200C shown in FIG. 12, the insulating layer 245 may be positioned on and in contact with the insulating layer 244. The insulating layer 244 preferably functions as a barrier insulating film that inhibits entry of impurities such as water or hydrogen and excess oxygen into the transistor 200C from the insulating layer 280 side. The insulating layer 244 can be formed using an insulator that can be used for the insulating layer 245. In addition, the insulating layer 245 may be formed using a nitride insulator such as aluminum nitride, titanium nitride, silicon nitride, or silicon nitride oxide, for example.

Unlike in the transistor 200B shown in FIG. 11, in the transistor 200C shown in FIG. 12, the conductive layer 205 with a single-layer structure may be provided. In this case, an insulating film to be the insulating layer 216 is formed over the patterned conductive layer 205, and an upper portion of the insulating film is removed by a chemical mechanical polishing (CMP) method or the like until the top surface of the conductive layer 205 is exposed. Preferably, the planarity of the top surface of the conductive layer 205 is made favorable. For example, the average surface roughness (Ra) of the top surface of the conductive layer 205 is less than or equal to 1 nm, preferably less than or equal to 0.5 nm, further preferably less than or equal to 0.3 nm. This allows the improvement in planarity of the insulating layer formed over the conductive layer 205 and the increase in crystallinity of the oxide 230b and the oxide 230c.

<Transistor Structure Example 4>

Figure 13A:
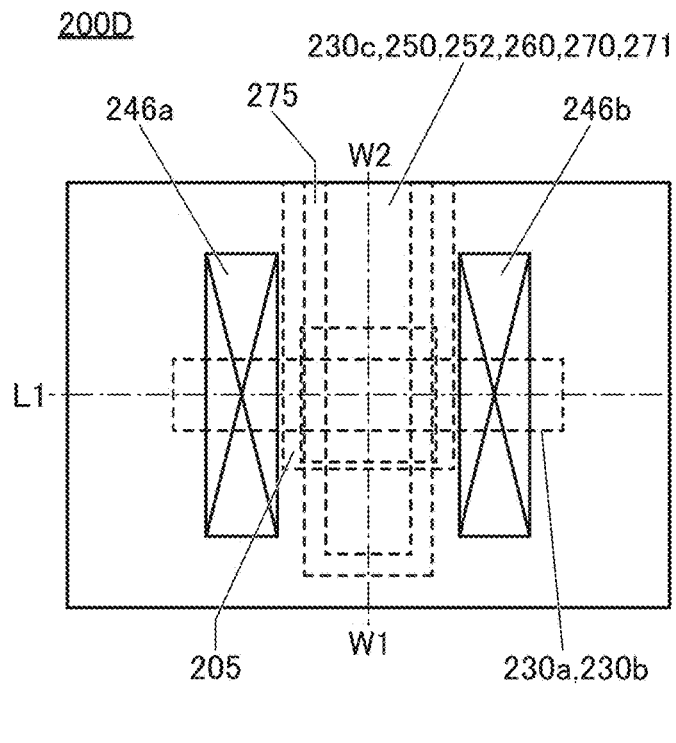
FIGS. 13A-13C Diagrams showing a structure example of a transistor of one embodiment of the present invention.
Figure 13C:
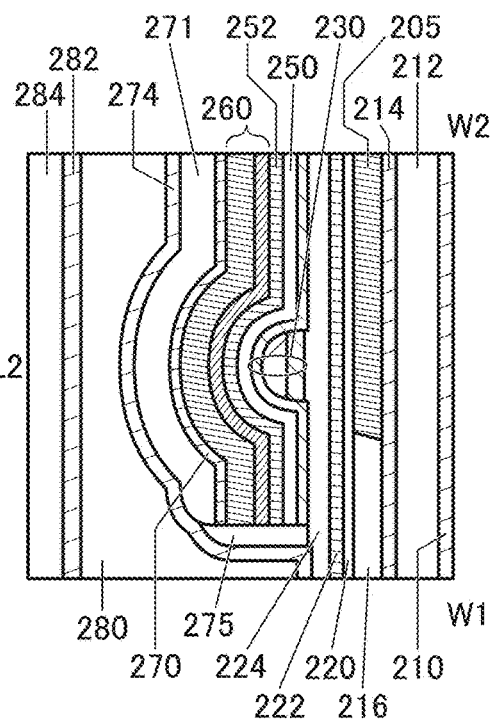
Figure 13B:
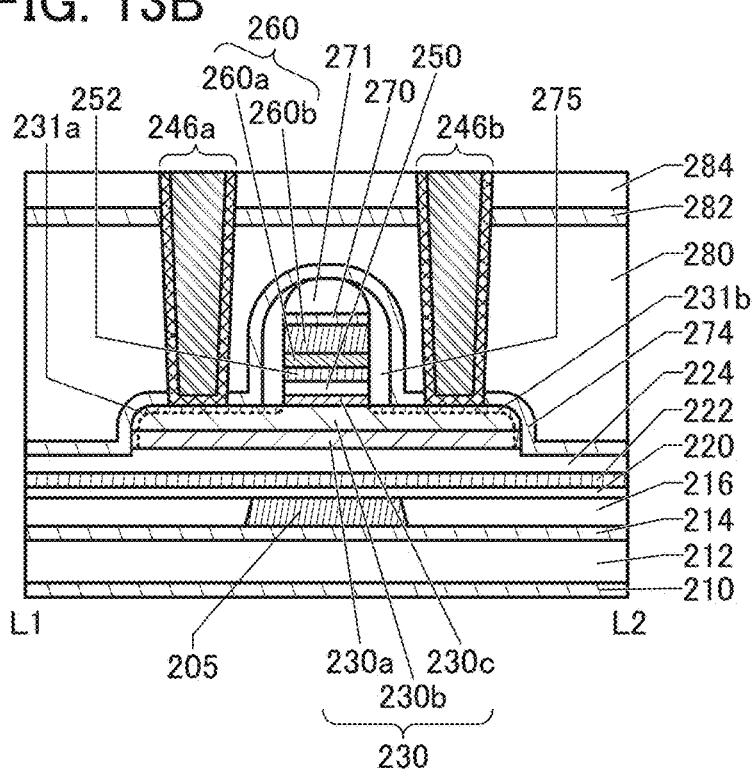

A structure example of a transistor 200D is described with reference to FIG. 13(A) to FIG. 13(C). FIG. 13(A) is a top view of the transistor 200D. FIG. 13(B) is a cross-sectional view of a portion indicated by a dashed-dotted line L1-L2 in FIG. 13(A). FIG. 13(C) is a cross-sectional view of a portion indicated by a dashed-dotted line W1-W2 in FIG. 13(A). Note that for clarity of the drawing, some components are not illustrated in the top view of FIG. 13(A).

The transistor 200D is a variation example of the above transistors. Therefore, differences from the above transistors will be mainly described to avoid repeated description.

In FIG. 13(A) to FIG. 13(C), the conductive layer 203 is not provided and the conductive layer 205 that functions as a second gate is made to function as a wiring. Furthermore, the insulating layer 250 is provided over the oxide 230c and a metal oxide 252 is provided over the insulating layer 250. The conductive layer 260 is provided over the metal oxide 252, and the insulating layer 270 is provided over the conductive layer 260. The insulating layer 271 is over the insulating layer 270.

Thus, the metal oxide 252 preferably has a function of inhibiting diffusion of oxygen. When the metal oxide 252 that inhibits diffusion of oxygen is provided between the insulating layer 250 and the conductive layer 260, diffusion of excess oxygen to the conductive layer 260 is inhibited. That is, a reduction in the amount of excess oxygen supplied to the oxide 230 can be inhibited. Moreover, oxidization of the conductive layer 260 due to oxygen can be inhibited.

Note that the metal oxide 252 may function as part of the first gate. For example, an oxide semiconductor that can be used for the oxide 230 can be used for the metal oxide 252. In this case, when the conductive layer 260 is deposited by a sputtering method, the metal oxide 252 can have a reduced electric resistance to be a conductive layer.

Note that the metal oxide 252 functions as part of the first gate insulating layer in some cases. Thus, when silicon oxide, silicon oxynitride, or the like is used for the insulating layer 250, a metal oxide that is a high-k material with a high dielectric constant is preferably used for the metal oxide 252. With such a stacked-layer structure, the stacked-layer structure can be thermally stable and have a high dielectric constant. Thus, agate potential that is applied during operation of the transistor can be reduced while the physical thickness is kept. In addition, the equivalent oxide thickness (EOT) of an insulating layer functioning as the gate insulating layer can be reduced.

Although the metal oxide 252 in the transistor 200D is shown as a single layer, the metal oxide 252 may have a stacked-layer structure of two or more layers. For example, a metal oxide functioning as part of the first gate and a metal oxide functioning as part of the first gate insulating layer may be stacked.

With the metal oxide 252 functioning as a first gate, the on-state current of the transistor 200D can be increased without a reduction in the influence of the electric field generated from the conductive layer 260. With the metal oxide 252 functioning as a first gate insulator, the distance between the conductor conductive layer 260 and the oxide 230 is kept owing to the physical thicknesses of the insulating layer 250 and the metal oxide 252, so that leakage current between the conductive layer 260 and the oxide 230 can be reduced. Thus, with the stacked-layer structure of the insulating layer 250 and the metal oxide 252, the physical distance between the conductive layer 260 and the oxide 230 and the intensity of electric field applied from the conductive layer 260 to the oxide 230 can be easily adjusted as appropriate.

Specifically, the oxide semiconductor that can be used for the oxide 230 can also be used for the metal oxide 252 when the resistance thereof is reduced. Alternatively, a metal oxide containing one kind or two or more kinds selected from hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, such as aluminum oxide, hafnium oxide, or an oxide containing aluminum and hafnium (hafnium aluminate). In particular, hafnium aluminate has higher heat resistance than hafnium oxide. Therefore, hafnium aluminate is preferable because it is less likely to be crystallized by heat treatment in a later step. Note that the metal oxide 252 is not an essential structure. Design is appropriately set in consideration of required transistor characteristics.

For the insulating layer 270, an insulating material having a function of inhibiting the passage of oxygen and impurities such as water and hydrogen is preferably used. For example, aluminum oxide, hafnium oxide, or the like is preferably used. Thus, oxidization of the conductive layer 260 due to oxygen from above the insulating layer 270 can be inhibited. Moreover, entry of impurities such as water and hydrogen from above the insulating layer 270 into the oxide 230 through the conductive layer 260 and the insulating layer 250 can be inhibited.

The insulating layer 271 functions as a hard mask. By providing the insulating layer 271, the conductive layer 260 can be processed to have the side surface that is substantially vertical; specifically, an angle formed by the side surface of the conductive layer 260 and a surface of the substrate can be greater than or equal to 75 and less than or equal to 100°, preferably greater than or equal to 800 and less than or equal to 95°.

An insulating material having a function of inhibiting the passage of oxygen and impurities such as water and hydrogen may be used for the insulating layer 271 so that the insulating layer 271 also functions as a barrier layer. In that case, the insulating layer 270 does not have to be provided.

Parts of the insulating layer 270, the conductive layer 260, the metal oxide 252, the insulating layer 250, and the oxide 230c are selectively removed using the insulating layer 271 as a hard mask, whereby their side surfaces can be substantially aligned with each other and a surface of the oxide 230b can be partly exposed.

The transistor 200D includes a region 231a and a region 231b on part of the exposed surface of the oxide 230b. One of the region 231a and the region 231b functions as a source region and the other functions as a drain region.

The region 231a and the region 231b can be formed by adding an impurity element such as phosphorus or boron to the exposed surface of the oxide 230b by an ion implantation method, an ion doping method, a plasma immersion ion implantation method, or plasma treatment, for example. Note that an "impurity element" in this embodiment and the like refers to an element other than main constituent components.

Alternatively, the region 231a and the region 231b can be formed in such manner that, after part of the surface of the oxide 230b is exposed, a metal film is formed and then heat treatment is performed so that the element contained in the metal film is diffused into the oxide 230b.

The electrical resistivity of regions of the oxide 230b to which the impurity element is added decreases. For that reason, the region 231a and the region 231b are sometimes referred to as "impurity regions" or "low-resistance regions".

The region 231a and the region 231b can be formed in a self-aligned manner by using the insulating layer 271 or the conductive layer 260 as a mask. Accordingly, the conductor 260 does not overlap with the region 231a and the region 231b, so that the parasitic capacitance can be reduced. Moreover, an offset region is not formed between a channel formation region and the source or drain region (the region 231a or the region 231b). The formation of the region 231a and the region 231b in a self-aligned manner can achieve an increase in on-state current, a reduction in threshold voltage, an improvement in operating frequency, and the like.

Note that an offset region may be provided between the channel formation region and the source or drain region in order to further reduce the off-state current. The offset region is a region where the electrical resistivity is high and a region where the above-described addition of the impurity element is not performed. The offset region can be formed through the above-described addition of the impurity element after the formation of an insulating layer 275. In this case, the insulating layer 275 serves as a mask like the insulating layer 271 or the like. Thus, the impurity element is not added to a region of the oxide 230b overlapping with the insulating layer 275, so that the electrical resistivity of the region can be kept high.

The transistor 200D includes the insulating layer 275 on the side surfaces of the insulating layer 270, the conductive layer 260, the metal oxide 252, the insulating layer 250, and the oxide 230c. The insulating layer 275 is preferably an insulator with a low dielectric constant. For example, the insulating layer 275 is preferably silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide, silicon oxynitride, silicon nitride oxide, or porous silicon oxide is preferably used for the insulating layer 275 because an excess-oxygen region can be easily formed in the insulating layer 275 in a later step. Furthermore, silicon oxide and silicon oxynitride, which have thermal stability, are preferable. The insulating layer 275 preferably has a function of diffusing oxygen.

The transistor 200D includes the insulating layer 274 over the insulating layer 275 and the metal oxide 230. The insulating layer 274 is preferably deposited by a sputtering method. When a sputtering method is used, an insulator containing few impurities such as water and hydrogen can be deposited. For example, for the insulating layer 274, aluminum oxide is preferably used.

Note that, in some cases, an oxide film formed by a sputtering method extracts hydrogen from the structure body over which the oxide film is deposited. Thus, the hydrogen concentrations in the oxide 230 and the insulating layer 275 can be reduced when hydrogen and water are absorbed from the oxide 230 and the insulating layer 275 into the insulating layer 274.

<Transistor Structure Example 5>

Figure 14A:
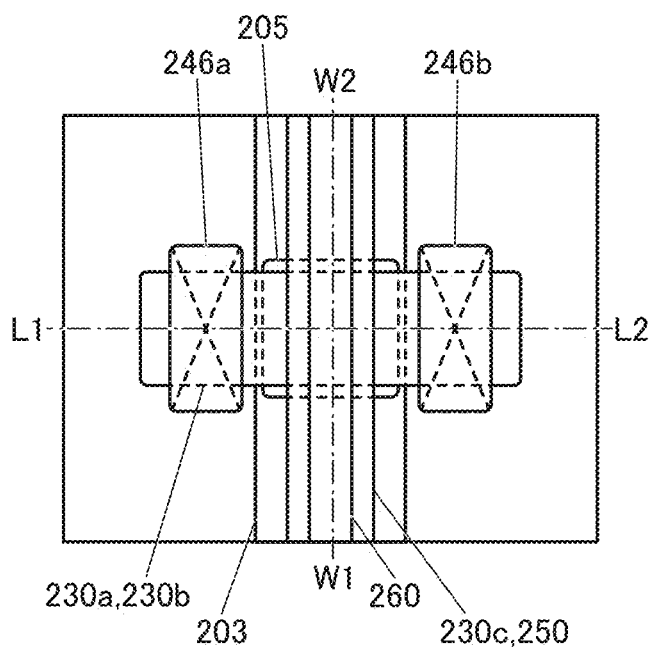
FIGS. 14A-14C Diagrams showing a structure example of a transistor of one embodiment of the present invention.
Figure 14C:
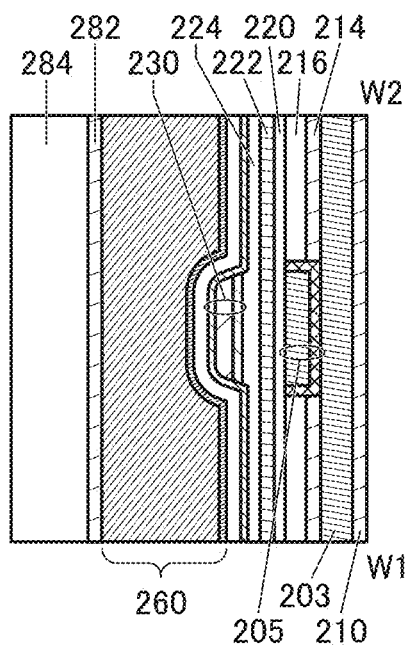
Figure 14B:
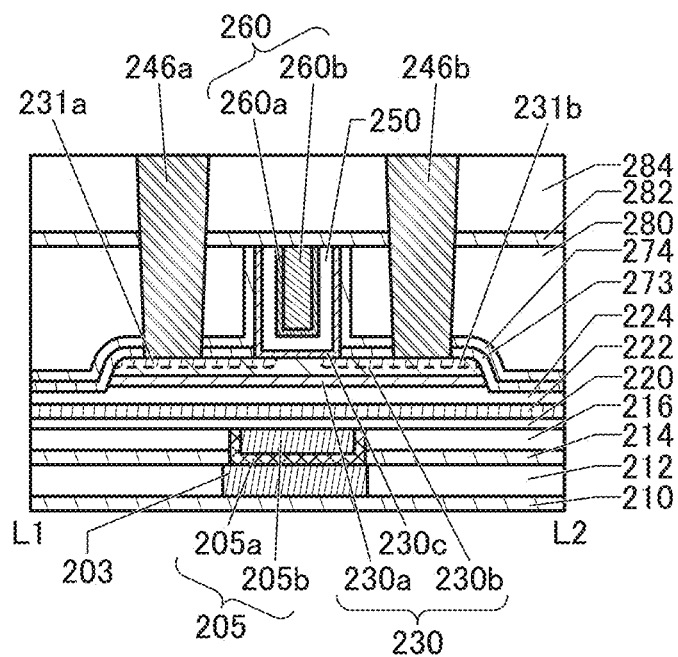

A structure example of a transistor 200E is described with reference to FIG. 14(A) to FIG. 14(C). FIG. 14(A) is a top view of the transistor 200E. FIG. 14(B) is a cross-sectional view of a portion indicated by a dashed-dotted line L1-L2 in FIG. 14(A). FIG. 14(C) is a cross-sectional view of a portion indicated by a dashed-dotted line W1-W2 in FIG. 14(A). Note that for clarity of the drawing, some components are not illustrated in the top view of FIG. 14(A).

The transistor 200E is a variation example of the transistor 200B. Therefore, differences from the transistor 200B will be mainly described to avoid repeated description.

In FIG. 14(A) to FIG. 14(C), the conductive layer 242 is not provided, and a region 231*a* and a region 231*b* are included in part of the exposed top surface of the oxide 230*b*. One of the region 231*a* and the region 231*b* functions as a source region and the other functions as a drain region. Moreover, an insulating layer 273 is provided between the oxide 230*b* and the insulating layer 274.

The region 231 (the region 231*a* and the region 231*b*), which is shown in FIG. 14 is the region of the oxide 230*b* to which an element that reduces the resistance of the oxide 230*b* is added. The region 231 can be formed using a dummy gate, for example.

Specifically, the dummy gate is provided over the oxide 230*b*, and an element that reduces the resistance of the oxide 230*b* is preferably added using the dummy gate as a mask. That is, the element is added to the region of the oxide 230 which does not overlap with the dummy gate, so that the region 231 is formed. For the addition of the element, an ion implantation method in which an ionized source gas is subjected to mass separation and then added, an ion doping method in which an ionized source gas is added without mass separation, a plasma immersion ion implantation method, or the like can be used.

As the element that reduces the resistance of the oxide 230, boron or phosphorus is typically used. Hydrogen, carbon, nitrogen, fluorine, sulfur, chlorine, titanium, a rare gas element, or the like can also be used. Typical examples of the rare gas include helium, neon, argon, krypton, and xenon. The concentration of the element is measured with SIMS or the like.

Boron and phosphorus are particularly preferable because an apparatus in a manufacturing line for amorphous silicon or low-temperature polysilicon can be used. Since the existing facility can be used, capital investment can be reduced.

Next, an insulating film to be the insulating layer 273 and an insulating film to be the insulating layer 274 may be formed over the oxide 230*b* and the dummy gate. The insulating film to be the insulating layer 273 and the insulating film to be the insulating layer 274 are stacked and provided, whereby a region where the region 231, the oxide 230*c* and the insulating layer 250 overlap with each other can be provided.

Specifically, after an insulating film to be the insulating layer 280 is provided over the insulating film to be the insulating layer 274, the insulating film to be the insulating layer 280 is subjected to CMP (Chemical Mechanical Polishing) treatment, whereby part of the insulating film to be the insulating layer 280 is removed and the dummy gate is exposed. Then, when the dummy gate is removed, part of the insulating film to be the insulating layer 273 in contact with the dummy gate is preferably also removed. Thus, the insulating layer 274 and the insulating layer 273 are exposed at the side surface of the opening provided in the insulating layer 280, and the region 231 provided in the oxide 230*b* is partly exposed at the bottom surface of the opening. Next, an oxide film to be the oxide 230*c*, an insulating film to be the insulating layer 250, and a conductive film to be the insulating layer 260 are formed in this order in the opening, and then, the oxide film to be the oxide 230*c*, the insulating film to be the insulating layer 250, and the conductive film to be the conductive layer 260 are partly removed by CMP treatment or the like until the insulating layer 280 is exposed; thus, the transistor 200E shown in FIG. 14 can be formed.

Note that the insulating layer 273 and the insulating layer 274 are not essential components. Design is appropriately set in consideration of required transistor characteristics.

For the transistor 200E shown in FIG. 14, existing apparatuses can be used, and the conductive layer 242 is not provided; thus, the cost can be reduced.

This embodiment can be implemented in an appropriate combination with the structures described in the other embodiments, other examples, and the like.

Embodiment 3

In this embodiment, a memory device of one embodiment of the present invention including a transistor in which an oxide is used for a semiconductor (hereinafter referred to as an OS transistor in some cases) and a capacitor (hereinafter, such a memory device is also referred to as an OS memory device in some cases), is described with reference to FIG. 15 and FIG. 16. The OS memory device includes at least a capacitor and an OS transistor that controls charging and discharging of the capacitor. Since the OS transistor has an extremely low off-state current, the OS memory device has excellent retention characteristics and thus can function as a nonvolatile memory.

<Structure Example of Memory Device>

Figure 15A:
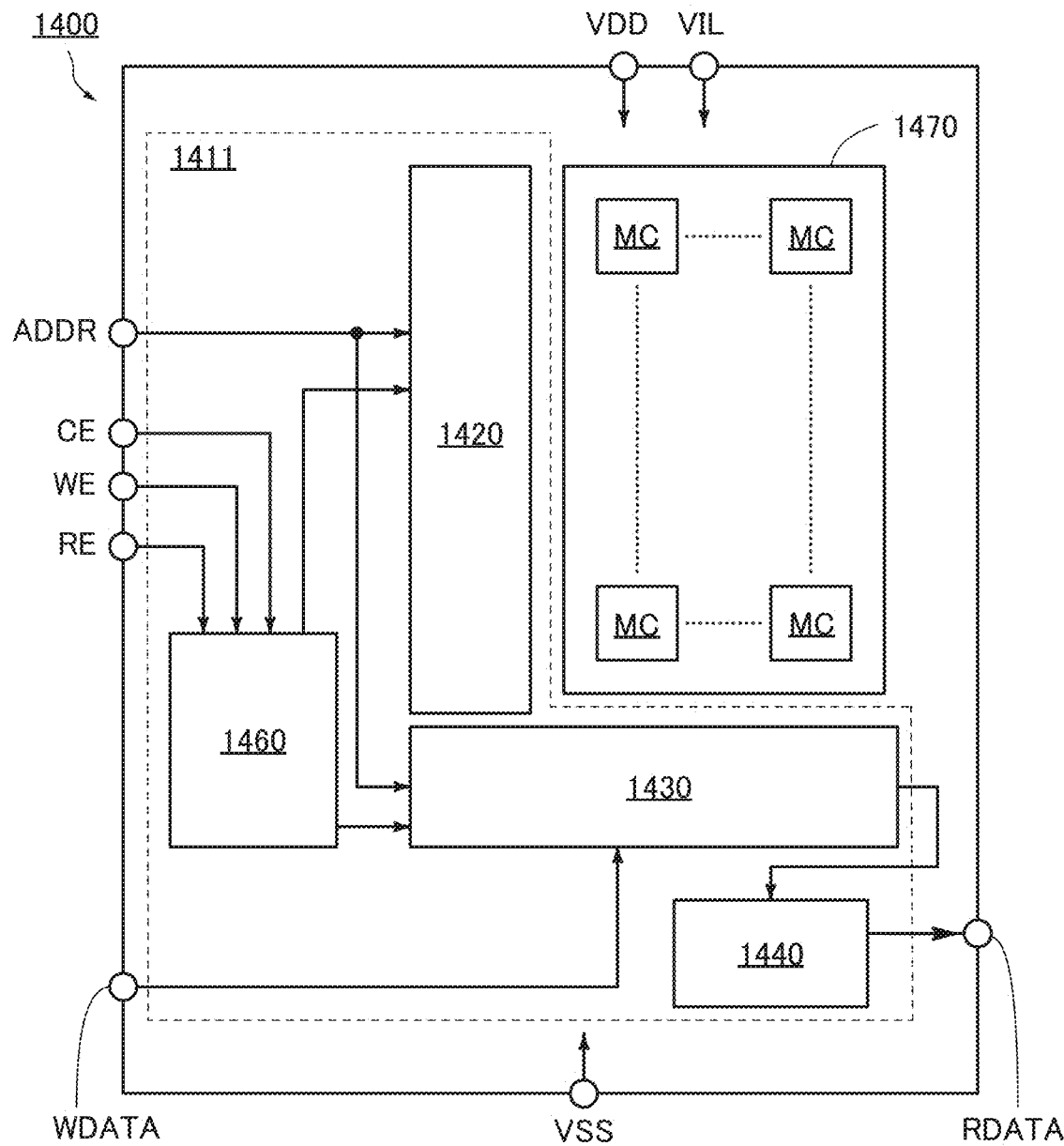
FIGS. 15A-15B Block diagrams showing a structure example of a memory device of one embodiment of the present invention.

FIG. 15(A) shows a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and will be described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and the data signal WDATA is input to the write circuit.

The control logic circuit 1460 processes the control signals (CE, WE, and RE) input from the outside, and generates control signals for the row decoder and the column decoder. The control signal CE is a chip enable signal, the control signal WE is a write enable signal, and the control signal RE is a read enable signal. Signals processed by the control logic circuit 1460 are not limited thereto, and other control signals may be input as necessary.

The memory cell array 1470 includes a plurality of memory cells MC and a plurality of wirings arranged in a matrix. Note that the number of the wirings that connect the memory cell array 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 15B:
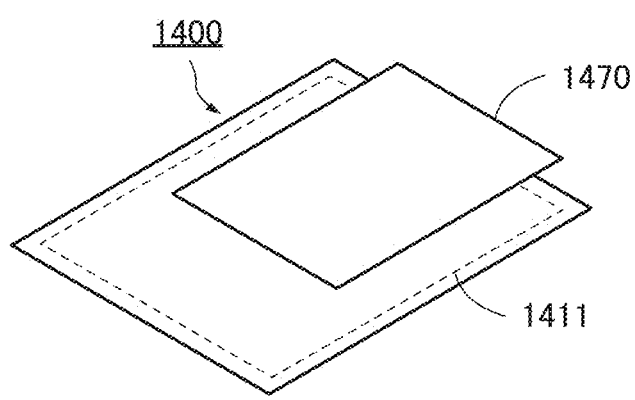

Note that FIG. 15(A) shows an example in which the peripheral circuit 1411 and the memory cell array 1470 are formed on the same plane; however, this embodiment is not limited thereto. For example, as shown in FIG. 15(B), the memory cell array 1470 may be provided over the peripheral circuit 1411 to partly overlap with the peripheral circuit 1411. For example, the sense amplifier may be provided below the memory cell array 1470 so that they overlap with each other.

FIG. 16 shows configuration examples of memory cells that can be used as the memory cells MC.
[DOSRAM]

Figure 16A:
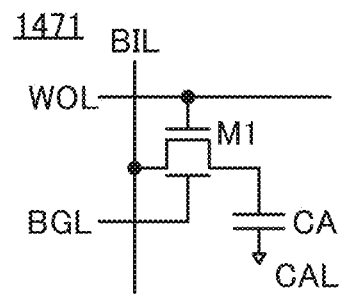
FIGS. 16A-16H Circuit diagrams showing configuration examples of a memory device of one embodiment of the present invention.
Figure 16B:
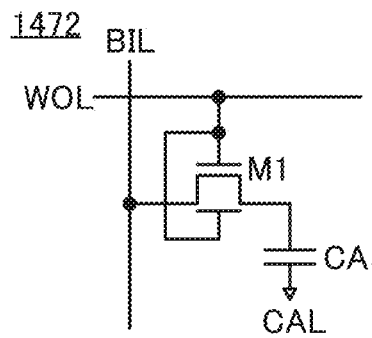
Figure 16C:
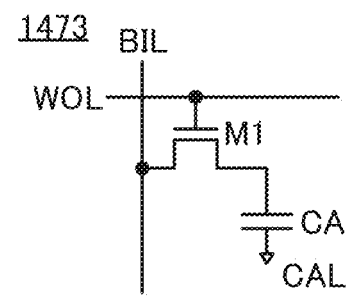
Figure 16D:
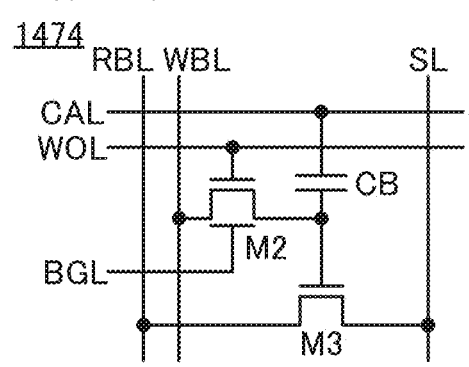
Figure 16E:
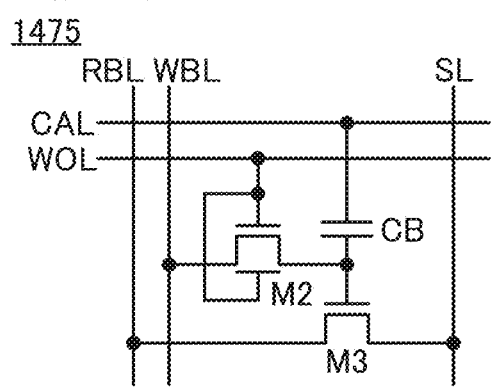
Figure 16F:
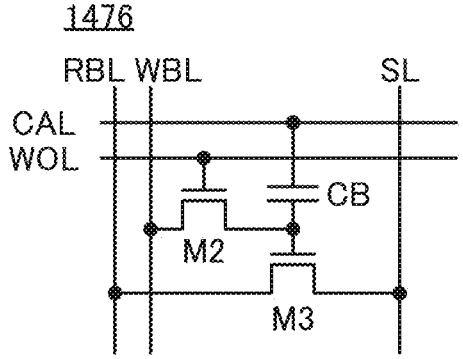
Figure 16G:
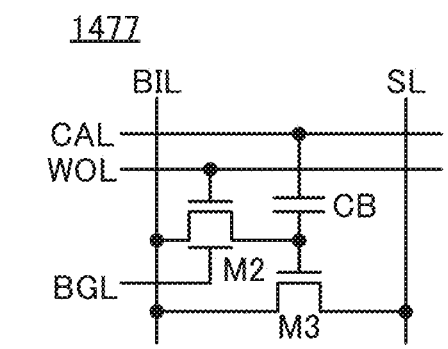

FIG. 16(A) to FIG. 16(C) show circuit structure examples of a DRAM memory cell. In this specification and the like, a DRAM using a memory cell including one OS transistor and one capacitor is referred to as a DOSRAM in some cases. A memory cell 1471 shown in FIG. 16(A) includes a transistor M1 and a capacitor CA. Note that the transistor M1 includes a gate (also referred to as a top gate in some cases) and a back gate.

A first terminal of the transistor M1 is connected to a first terminal of the capacitor CA, a second terminal of the transistor M1 is connected to a wiring BIL, the gate of the transistor M1 is connected to a wiring WOL, and the back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In data writing and reading, a low-level potential is preferably applied to the wiring CAL. The wiring BGL functions as a wiring for applying a potential to the back gate of the transistor M1. Applying a given potential to the wiring BGL can increase or decrease the threshold voltage of the transistor M1.

The memory cell MC is not limited to the memory cell 1471, and the circuit structure can be changed. For example, as in a memory cell 1472 shown in FIG. 16(B), the back gate of the transistor M1 may be connected not to the wiring BGL but to the wiring WOL in the memory cell MC. Alternatively, for example, the memory cell MC may be a memory cell including a single-gate transistor, that is, the transistor M1 without a back gate, as in a memory cell 1473 shown in FIG. 16(C).

In the case where the semiconductor device described in any of the above embodiments is used in the memory cell 1471 and the like, the transistor described in any of the above embodiments can be used as the transistor M1. When an OS transistor is used for the transistor M1, the leakage current of the transistor M1 can be extremely low. That is, with the use of the transistor M1, written data can be retained for a long time, and thus the refresh operation frequency for the memory cell can be decreased. Alternatively, the refresh operation of the memory cell can be omitted. In addition, since the transistor M1 has an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap with each other as described above, the bit line can be shortened. Thus, the bit line capacitance can be small, and the storage capacitance of the memory cell can be reduced.
[NOSRAM]

FIG. 16(D) to FIG. 16(G) show circuit structure examples of a gain-cell memory cell including two transistors and one capacitor. A memory cell 1474 shown in FIG. 16(D) includes a transistor M2, a transistor M3, and a capacitor CB. Note that the transistor M2 includes a gate (referred to as a top gate in some cases) and a back gate. In this specification and the like, a memory device including a gain-cell memory cell using an OS transistor as the transistor M2 is referred to as NOSRAM (registered trademark) (Nonvolatile Oxide Semiconductor RAM) in some cases.

A first terminal of the transistor M2 is connected to a first terminal of the capacitor CB; a second terminal of the transistor M2 is connected to a wiring WBL; a gate of the transistor M2 is connected to the wiring WOL; and a back gate of the transistor M2 is connected to the wiring BGL. A second terminal of the capacitor CB is connected to the wiring CAL. A first terminal of the transistor M3 is connected to a wiring RBL, a second terminal of the transistor M3 is connected to a wiring SL, and a gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In the time of data writing, data retaining, and data reading, a low-level potential is preferably applied to the wiring CAL. The wiring BGL functions as a wiring for applying a potential to the back gate of the transistor M2. Applying a given potential to the wiring BGL can increase or decrease the threshold voltage of the transistor M2.

The memory cell MC is not limited to the memory cell 1474, and the circuit structure can be changed as appropriate. For example, as in a memory cell 1475 shown in FIG. 16(E), the back gate of the transistor M2 may be connected not to the wiring BGL but to the wiring WOL in the memory cell MC. Alternatively, for example, the memory cell MC may be a memory cell including a single-gate transistor, that is, the transistor M2 not including a back gate, as in a memory cell 1476 shown in FIG. 16(F). For example, the memory cell MC may have a structure where the wiring WBL and the wiring RBL are combined into one wiring BIL as in a memory cell 1477 shown in FIG. 16(G).

In the case where the semiconductor device described in any of the above embodiments is used in the memory cell 1474 and the like, the transistor described in any of the above embodiments can be used as the transistor M2. When an OS transistor is used for the transistor M2, the leakage current of the transistor M2 can be extremely low. That is, with the use of the transistor M2, written data can be retained for a long time, and thus the refresh operation frequency for the memory cell can be decreased. Alternatively, the refresh operation of the memory cell can be omitted. In addition, since the transistor M2 has an extremely low leakage current, multi-level data or analog data can be retained in the memory cell 1474. The same applies to the memory cells 1475 to 1477.

Note that the transistor M3 may be a transistor containing silicon in a channel formation region (hereinafter, also referred to as a Si transistor in some cases). The conductivity type of the Si transistor may be of either an n-channel type or a p-channel type. The Si transistor has a higher field-effect mobility than the OS transistor in some cases. Therefore, a Si transistor may be used as the transistor M3 functioning as a reading transistor. Furthermore, the transistor M2 can be provided to be stacked over the transistor M3 when a Si transistor is used as the transistor M3; therefore, the area occupied by the memory cell can be reduced, leading to high integration of the memory device.

Alternatively, the transistor M3 may be an OS transistor. When the transistor M2 and the transistor M3 are OS transistors, the circuit of the memory cell array 1470 can be formed using only n-channel transistors.

Figure 16H:
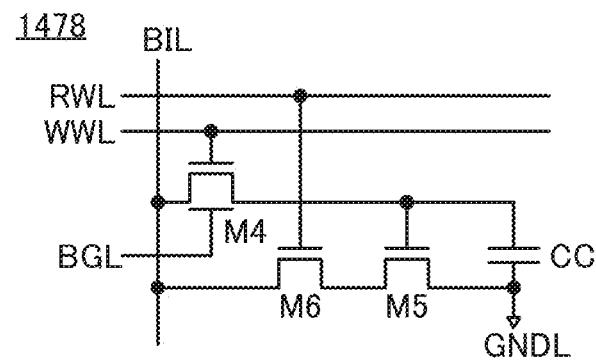

FIG. 16(H) shows an example of a gain-cell memory cell with three transistors and one capacitor. A memory cell 1478 shown in FIG. 16(H) includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor including a back gate that is electrically connected to the wiring BGL. Note that the back gate and the gate of the transistor M4 may be electrically connected to each other. Alternatively, the transistor M4 may not include the back gate.

Note that each of the transistor M5 and the transistor M6 may be an n-channel Si transistor or a p-channel Si transistor. Alternatively, the transistor M4 to the transistor M6 may be OS transistors. In this case, the memory cell array 1470 can be formed using only n-channel transistors.

In the case where the semiconductor device described in any of the above embodiments is used in the memory cell 1478, the transistors described in the above embodiments can be used for the transistor M4. When an OS transistor is used for the transistor M4, the leakage current of the transistor M4 can be extremely low.

Note that the structures of the peripheral circuit 1411, the memory cell array 1470, and the like described in this embodiment are not limited to the above. Positions and functions of these circuits, wirings connected to the circuits, circuit elements, and the like can be changed, deleted, or added as needed.

The structure described in this embodiment can be used in an appropriate combination with the structures described in the other embodiments, other examples, and the like.

Embodiment 4

In this embodiment, an example of a chip 1200 on which the semiconductor device of the present invention is mounted is described with reference to FIG. 17. A plurality of circuits (systems) are mounted on the chip 1200. The technique for integrating a plurality of circuits (systems) on one chip is referred to as system on chip (SoC) in some cases.

Figure 17A:
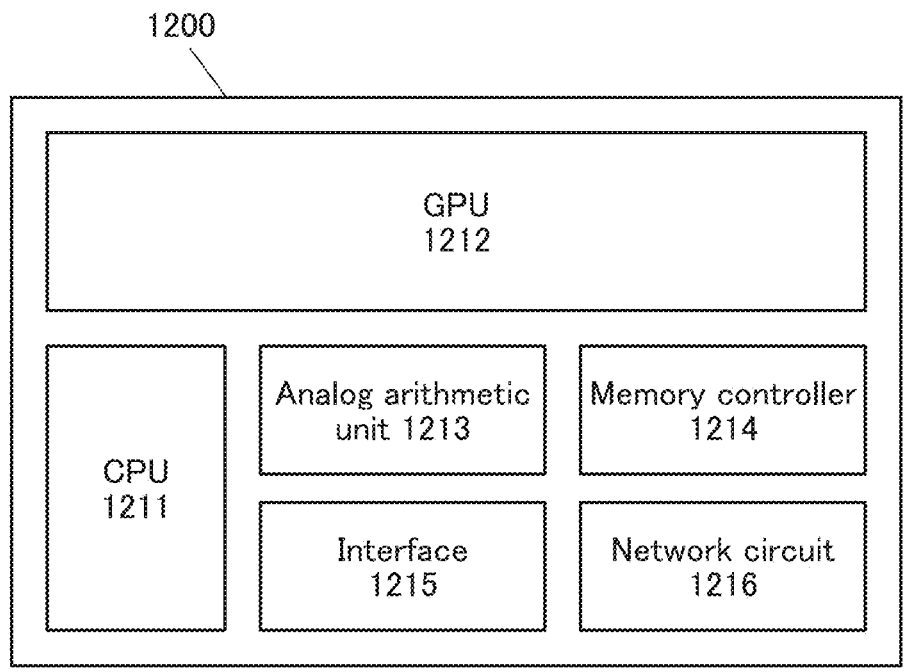
FIGS. 17A-17B Schematic views of a semiconductor device of one embodiment of the present invention.

As shown in FIG. 17(A), the chip 1200 includes a CPU (Central Processing Unit) 1211, a GPU (Graphics Processing Unit) 1212, one or more of analog arithmetic units 1213, one or more of memory controllers 1214, one or more of interfaces 1215, one or more of network circuits 1216, and the like.

Figure 17B:
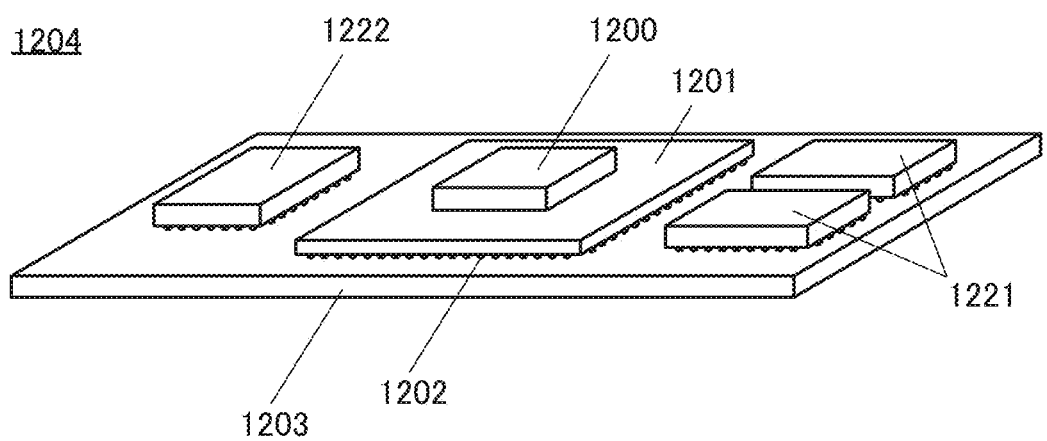

A bump (not illustrated) is provided on the chip 1200, and as shown in FIG. 17(B), the chip 1200 is connected to a first surface of a printed circuit board (PCB) 1201. A plurality of bumps 1202 are provided on the rear side of the first surface of the PCB 1201, and the PCB 1201 is connected to a motherboard 1203.

A memory device such as a DRAM 1221 or a flash memory 1222 may be provided over the motherboard 1203. For example, the DOSRAM described in the above embodiment can be used for the DRAM 1221. For example, the NOSRAM described in the above embodiment can be used for the flash memory 1222.

The CPU 1211 preferably includes a plurality of CPU cores. Furthermore, the GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used for the memory. The GPU 1212 is suitable for parallel computation of a number of data and thus can be used for image processing or product-sum operation. When an image processing circuit or a product-sum operation circuit including an oxide semiconductor of the present invention is provided in the GPU 1212, image processing and product-sum operation can be performed with low power consumption.

In addition, since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at a high speed.

The analog arithmetic unit 1213 includes one or both of an A/D (analog/digital) converter circuit and a D/A (digital/analog) converter circuit. Furthermore, the analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit for connection to an external connection device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

A network circuit 1216 includes a network circuit such as a LAN (Local Area Network). Furthermore, the network circuit 1216 may include a circuit for network security.

The circuits (systems) can be formed in the chip 1200 in the same manufacturing process. Therefore, even when the number of circuits needed for the chip 1200 is increased, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can be small. Furthermore, the GPU module 1204 is excellent in image processing, and thus is suitably used in a portable electronic device such as a smartphone, a tablet terminal, a laptop PC, or a portable (mobile) game console. Furthermore, the product-sum operation circuit using the GPU 1212 can implement a method such as a deep neural network (DNN), a convolutional neural network (CNN), a recurrent neural network (RNN), an autoencorder, a deep Boltzmann machine (DBM), or a deep belief network (DBN); thus, the chip 1200 can be used as an AI chip or the GPU module 1204 can be used as an A system module.

The structure described in this embodiment can be used in an appropriate combination with the structures described in the other embodiments, other examples, and the like.

Embodiment 5

In this embodiment, application examples of the memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, laptop computers, and desktop computers, but also to large computers such as server systems. Alternatively, the semiconductor device described in the above embodiment is applied to a variety of removable memory devices such as memory cards (e.g., SD cards), USB memories, and SSDs (solid state drives). FIG. 18 schematically shows some structure examples of removable memory devices. The semiconductor device described in the above embodiment is processed into a packaged memory chip and used in a variety of storage devices and removable memories, for example.

Figure 18A:
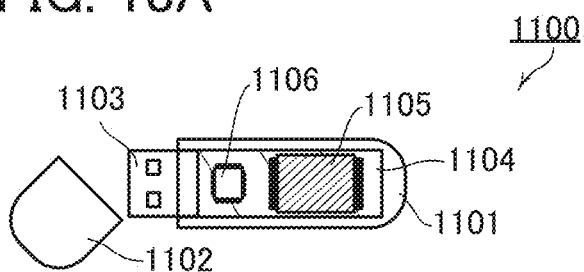
FIGS. 18A-18E Schematic views of memory devices of one embodiment of the present invention.

FIG. 18(A) is a schematic view of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like.

Figure 18B:
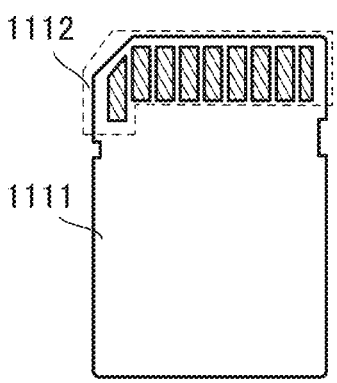
Figure 18C:
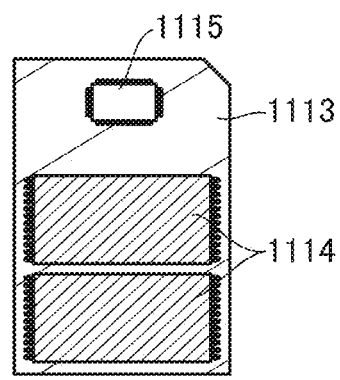

FIG. 18(B) is a schematic external view of an SD card, and FIG. 18(C) is a schematic view of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113, in which case data can be read from and written in the memory chip 1114 by radio communication between a host device and the SD card 1110. The semiconductor device described in the above embodiment can be incorporated in the memory chip 1114 or the like.

Figure 18D:
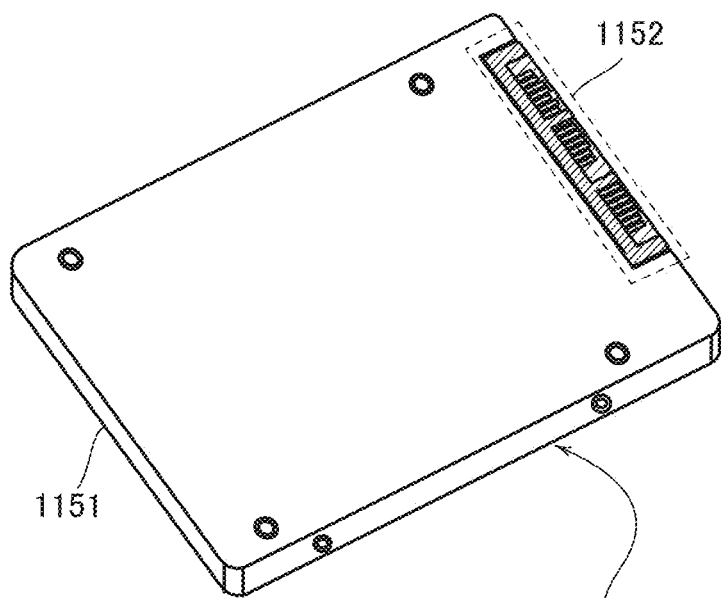
Figure 18E:
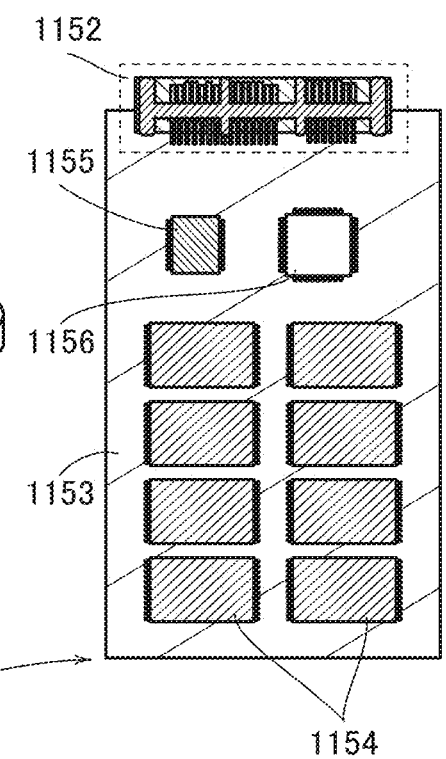

FIG. 18(D) is a schematic external view of an SSD, and FIG. 18(E) is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the above embodiment can be incorporated in the memory chip 1154 or the like.

This embodiment can be implemented in an appropriate combination with the structures described in the other embodiments, other examples, and the like.

Embodiment 6

The semiconductor device of one embodiment of the present invention can be used for processors such as CPUs and GPUs or chips. FIG. 19 shows specific examples of electronic devices including a processor such as a CPU or a GPU or a chip of one embodiment of the present invention.

<Electronic Device and System>

The GPU or the chip of one embodiment of the present invention can be incorporated into a variety of electronic devices. Examples of electronic devices include a digital camera, a digital video camera, a digital photo frame, a mobile phone, a portable game machine, a portable information terminal, and an audio reproducing device in addition to electronic devices provided with a relatively large screen, such as a television device, a desktop or laptop personal computer, a monitor for a computer and the like, digital signage, and a large game machine like a pachinko machine. When the integrated circuit or the chip of one embodiment of the present invention is provided in an electronic device, the electronic device can include artificial intelligence.

The electronic device of one embodiment of the present invention may include an antenna. When a signal is received by the antenna, the electronic device can display a video, data, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radioactive rays, flow rate, humidity, gradient, oscillation, smell, or infrared rays).

The electronic device of one embodiment of the present invention can have a variety of functions. For example, the electronic device in this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 19 shows examples of electronic devices.

[Mobile Phone]

Figure 19A:
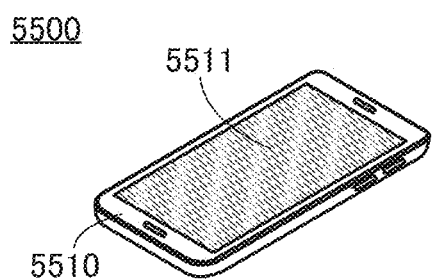

FIG. 19(A) shows a mobile phone (smartphone), which is a type of an information terminal. An information terminal 5500 includes a housing 5510 and a display portion 5511; as input interfaces, a touch panel is provided in the display portion 5511 and a button is provided in the housing 5510.

The information terminal 5500 can execute an application utilizing artificial intelligence, with the use of the chip of one embodiment of the present invention. Examples of the application utilizing artificial intelligence include an application for interpreting a conversation and displaying its content on the display portion 5511; an application for recognizing letters, figures, and the like input to the touch panel of the display portion 5511 by a user and displaying them on the display portion 5511; and an application for biometric authentication using fingerprints, voice prints, or the like.

[Information Terminal]

Figure 19B:
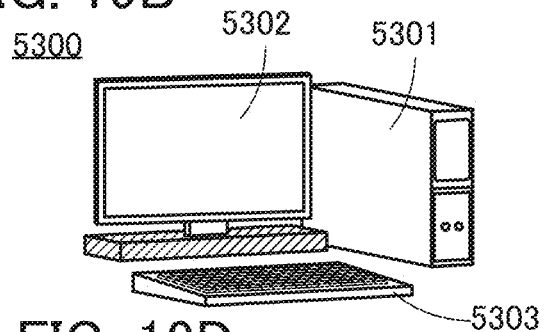

FIG. 19(B) shows a desktop information terminal 5300. The desktop information terminal 5300 includes a main body 5301 of the information terminal, a display 5302, and a keyboard 5303.

Like the information terminal 5500 described above, the desktop information terminal 5300 can execute an application utilizing artificial intelligence, with the use of the chip of one embodiment of the present invention. Examples of the application utilizing artificial intelligence include design-support software, text correction software, and software for automatic menu generation. Furthermore, with the use of the desktop information terminal 5300, novel artificial intelligence can be developed.

Although a smartphone and a desktop information terminal are shown as examples of electronic devices in FIG. 19(A) and FIG. 19(B) in the above, an information terminal other than a smartphone and a desktop information terminal can be used. Examples of an information terminal other than a smartphone and a desktop information terminal include a PDA (Personal Digital Assistant), a laptop information terminal, and a workstation.

[Household Appliance]

Figure 19C:
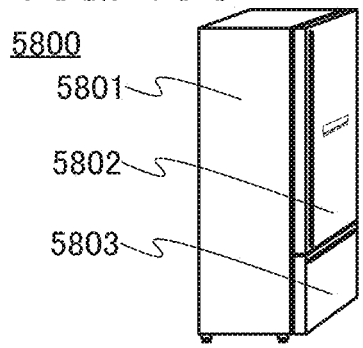

FIG. 19(C) shows an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is used in the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800 and food expiration dates, for example, a function of automatically adjusting the temperature to be appropriate for the foods stored in the electric refrigerator-freezer 5800, and the like.

Although the electric refrigerator-freezer is described here as an example of a household appliance, other examples of a household appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machine]

Figure 19D:
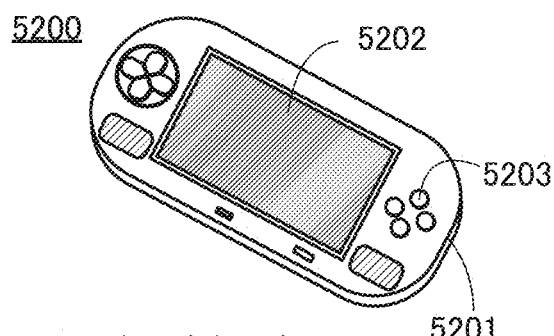
Figure 19D:
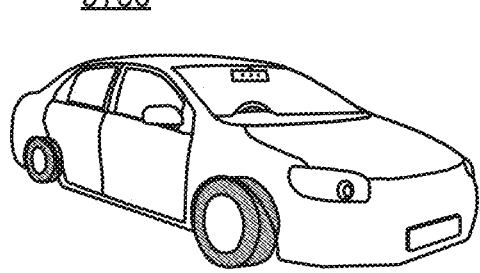
Figure 19D:
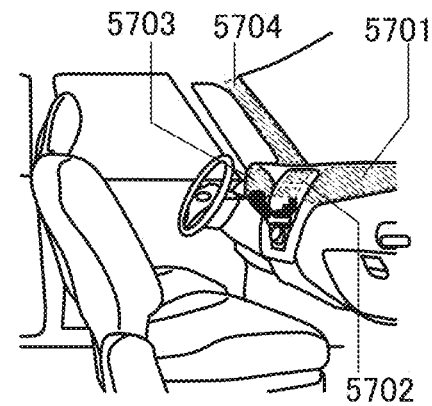

FIG. 19(D) shows a portable game machine 5200 as an example of a game machine. The portable game machine includes a housing 5201, a display portion 5202, a button 5203, and the like.

With the use of the GPU or the chip of one embodiment of the present invention in the portable game machine 5200, the portable game machine 5200 with low power consumption can be obtained. Moreover, heat generation from a circuit can be reduced owing to low power consumption; thus, the influence of heat generation on the circuit, the peripheral circuit, and the module can be reduced.

Furthermore, when the GPU or the chip of one embodiment of the present invention is used in the portable game machine 5200, the portable game machine 5200 including artificial intelligence can be obtained.

In general, the progress of a game, the actions and words of game characters, and expressions of a phenomenon and the like in the game are programed in the game; however, the use of artificial intelligence in the portable game machine 5200 enables expressions not limited by the game program. For example, questions posed by the player, the progress of the game, time, and actions and words of game characters can be changed for various expressions.

When a game requiring a plurality of players is played on the portable game machine 5200, the artificial intelligence can create a virtual game player; thus, the game can be played alone with the game player created by the artificial intelligence as an opponent.

Although the portable game machine is shown as an example of a game machine in FIG. 19(D), the game machine using the GPU or the chip of one embodiment of the present invention is not limited thereto. Examples of the game machine using the GPU or the chip of one embodiment of the present invention include a home stationary game machine, an arcade game machine installed in entertainment facilities (a game center, an amusement park, and the like), and a throwing machine for batting practice installed in sports facilities.

[Moving Vehicle]

The GPU or the chip of one embodiment of the present invention can be used in an automobile, which is a moving vehicle, and around a driver's seat in the automobile.

FIG. 19(E1) shows an automobile 5700 as an example of a moving vehicle, and FIG. 19(E2) is a diagram showing the periphery of a windshield inside the automobile. FIG. 19(E2) shows a display panel 5701, a display panel 5702, and a display panel 5703 that are attached to a dashboard and a display panel 5704 that is attached to a pillar.

The display panel 5701 to the display panel 5703 can provide various kinds of information by showing a speedometer, a tachometer, a mileage, a fuel meter, a gearshift indicator, air-condition setting, or the like. The content, layout, or the like of the display on the display panels can be changed as appropriate to suit the user's preference, so that the design can be improved. The display panel 5701 to the display panel 5703 can also be used as lighting devices.

The display panel 5704 can compensate for the view obstructed by the pillar (a blind spot) by showing an image taken by an imaging device (not illustrated) provided for the automobile 5700. That is, displaying an image taken by the imaging device provided on the outside of the automobile 5700 leads to compensation for the blind spot and enhancement of safety. In addition, showing an image for compensating for the area which a driver cannot see makes it possible for the driver to confirm safety more easily and comfortably. The display panel 5704 can also be used as a lighting device.

Since the GPU or the chip of one embodiment of the present invention can be used as a component of artificial intelligence, the chip can be used in an automatic driving system of the automobile 5700, for example. The chip can also be used for a system for navigation, risk prediction, or the like. The display panel 5701 to the display panel 5704 may display information regarding navigation, risk prediction, and the like.

Although an automobile is described above as an example of a moving vehicle, a moving vehicle is not limited to an automobile. Examples of a moving vehicle include a train, a monorail train, a ship, and a flying object (a helicopter, an unmanned aircraft (a drone), an airplane, and a rocket), and these moving vehicles can include a system utilizing artificial intelligence when equipped with the chip of one embodiment of the present invention.

[Broadcasting System]

The GPU or the chip of one embodiment of the present invention can be used in a broadcasting system.

Figure 19F:
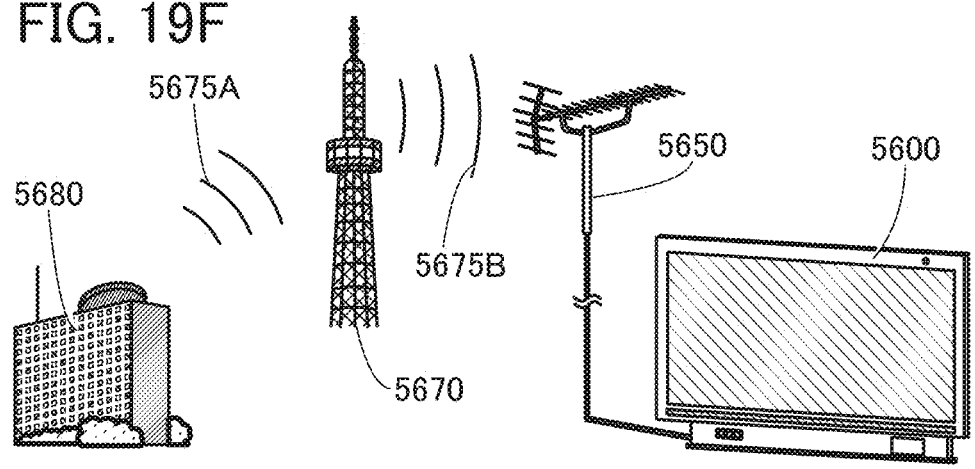

FIG. 19(F) schematically shows data transmission in a broadcasting system. Specifically, FIG. 19(F) shows a path in which a radio wave (a broadcasting signal) transmitted from a broadcast station 5680 is delivered to a television receiver (TV) 5600 of each household. The TV 5600 includes a receiving device (not illustrated), and the broadcast signal received by an antenna 5650 is transmitted to the TV 5600 through the receiving device.

Although a UHF (Ultra High Frequency) antenna is shown as the antenna 5650 in FIG. 19(F), a BS/110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting shown in FIG. 19(F) and may be satellite broadcasting using an artificial satellite, data broadcasting using an optical line, or the like.

The above-described broadcasting system may utilize artificial intelligence by using the chip of one embodiment of the present invention. When the broadcast data is transmitted from the broadcast station 5680 to the TV 5600 of each household, the broadcast data is compressed by an encoder; when the antenna 5650 receives the compressed broadcast data, the compressed broadcast data is decompressed by a decoder of the receiving device in the TV 5600. With the use of artificial intelligence, for example, a display pattern included in an image to be displayed can be recognized in motion compensation prediction, which is one of the compressing methods for the encoder. In-frame prediction utilizing artificial intelligence, for example, can also be performed. For another example, when the broadcast data with low resolution is received and displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K, 8K) broadcasting, which needs a large amount of broadcast data.

As an application of artificial intelligence in the TV 5600, a recording device including artificial intelligence may be provided in the TV 5600, for example. With such a structure, the artificial intelligence in the recording device can learn the user's preference, so that TV programs that suit the user's preference can be recorded automatically.

The electronic devices, the functions of the electronic devices, application examples of artificial intelligence, its effects, and the like described in this embodiment can be combined as appropriate with the description of another electronic device.

This embodiment can be implemented in an appropriate combination with the structures described in the other embodiments, other examples, and the like.

Example 1

In this example, an example of processing the insulating layer BGI3 by etching, which is described in Embodiment 1, will be described. Specifically, bird's-eye views of a sample subjected to etching were obtained using SEM (scanning electron microscope).

A sample 1D fabricated will be described below.

A hafnium oxide film with a thickness of 10 nm was deposited using an ALD method as the insulating layer BGI2 over a first silicon oxynitride film, which was deposited over the substrate; over the hafnium oxide film, a second silicon oxynitride film with a thickness of 15 nm was deposited using a CVD method as the insulating layer BGI3; over the second silicon oxynitride film, a first In—Ga—Zn oxide with a thickness of 5 nm was deposited using a sputtering method as a semiconductor layer to be the semiconductor layer SEM1; over the first In—Ga—Zn oxide, a second In—Ga—Zn oxide with a thickness of 15 nm was deposited using a sputtering method as a semiconductor layer to be the semiconductor layer SEM2.

Next, over the second In—Ga—Zn oxide, a first tantalum nitride film with a thickness of 20 nm was deposited using a sputtering method as a conductive layer to be the conductive layer SE or the conductive layer DE; over the first tantalum nitride film, an aluminum oxide film with a thickness of 5 nm was deposited using an ALD method; over the aluminum oxide film, a second tantalum nitride film with a thickness of 15 nm was deposited using a sputtering method.

Next, the second tantalum nitride film was processed by a lithography method, so that a hard mask was formed. Then, using the hard mask, the second tantalum nitride film, the aluminum oxide film, the first tantalum nitride film, the second In—Ga—Zn oxide, and the first In—Ga—Zn oxide were processed. This processing yielded the conductive layer SE, the conductive layer DE, the semiconductor layer SEM2 and the semiconductor layer SEM1.

Next, oxygen plasma treatment was performed. The oxygen plasma treatment was performed by exposing for 10 seconds to plasma which was generated using a reaction gas with oxygen of 200 sccm, an ICP power source of 2000 W, a bias power of 50 W, and a pressure was 0.67 Pa in a CVD apparatus. Then, the second silicon oxynitride film and the first tantalum nitride film were processed by etching.

Through the above steps, the sample 1D was fabricated.

Next, a bird's eye view of the sample 1D observed using SEM was obtained, so that the shape of the sample 1D was confirmed. The SEM observation image was obtained using a scanning electron microscope SU8030, manufactured by Hitachi High-Technologies Corporation with an acceleration voltage of 5.0 kV.

Figure 20:
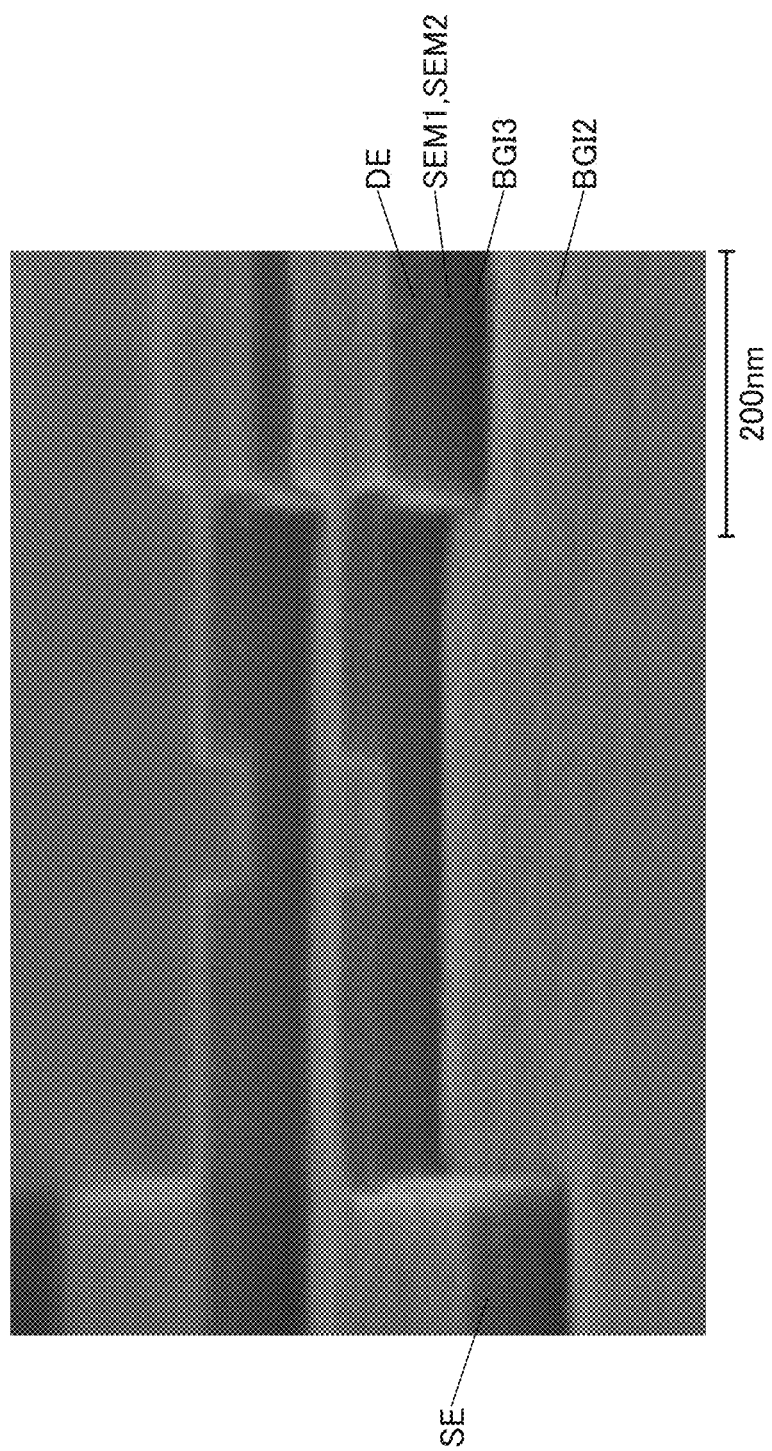
FIG. 20 A bird's-eye view image of a sample 1D observed with SEM.

A bird's-eye view of the sample 1D using SEM is shown in FIG. 20. FIG. 20 is a 200,000-times-magnified SEM image. As shown in FIG. 20, the surface of the hafnium oxide film of the insulating layer BGI2 is exposed; thus, it is confirmed that the second silicon oxynitride film of the insulating layer BGI3 over the hafnium oxide film was removed.

At least part of this example can be implemented in combination with any of the other embodiments and the other example described in this specification as appropriate.

Example 2

In this example, the transistor 200A (referred to as a sample 1E) of one embodiment of the present invention was fabricated, and the shape of the sample 1E was evaluated. Note that a scanning transmission electron microscope (STEM) was used for the evaluation of the sample 1E shape.

The sample 1E is described below.

As the insulating layer 214, an aluminum oxide film was used. As the insulating layer 216, a silicon oxynitride film was used. As the conductive layer 205, a stacked-layer structure of tantalum nitride, titanium nitride, and tungsten was used.

As the insulating layer 220, a 10-nm-thick silicon oxynitride film was used. As the insulating layer 222, a 20-nm-thick hafnium oxide film was used. As the insulating layer 224, a 30-nm-thick silicon oxynitride film was used.

As the oxide 230a, a 5-nm-thick metal oxide was used, which was formed by a sputtering method using an In—Ga—Zn oxide target with In:Ga:Zn=1:3:4 [atomic ratio]. As the oxide 230b, a 15-nm-thick metal oxide was used, which was formed by a sputtering method using an In—Ga—Zn oxide target with In:Ga:Zn=4:2:4.1 [atomic ratio].

As the conductive layer 242a and the conductive layer 242b, tantalum nitride was used. As a barrier layer over the conductive layer 242, an aluminum oxide film was used.

As the oxide 230c, a 5-nm-thick metal oxide was used, which was formed by a sputtering method using an In—Ga—Zn oxide target with In:Ga:Zn=4:2:4.1 [atomic ratio].

As the insulating layer 250, a 10-nm-thick silicon oxynitride was used. As the conductive layer 260a, a 10-nm-thick titanium nitride was used. As the conductive layer 260b, a 30-nm-thick tungsten was used.

As the insulating layer 274, an aluminum oxide film was used.

The above is the description of the sample 1E.

Next, results of cross-sectional observation of the Sample 1E will be described. As an apparatus for the observation, HD-2300 manufactured by Hitachi High-Technologies Corporation was used.

Figure 21:
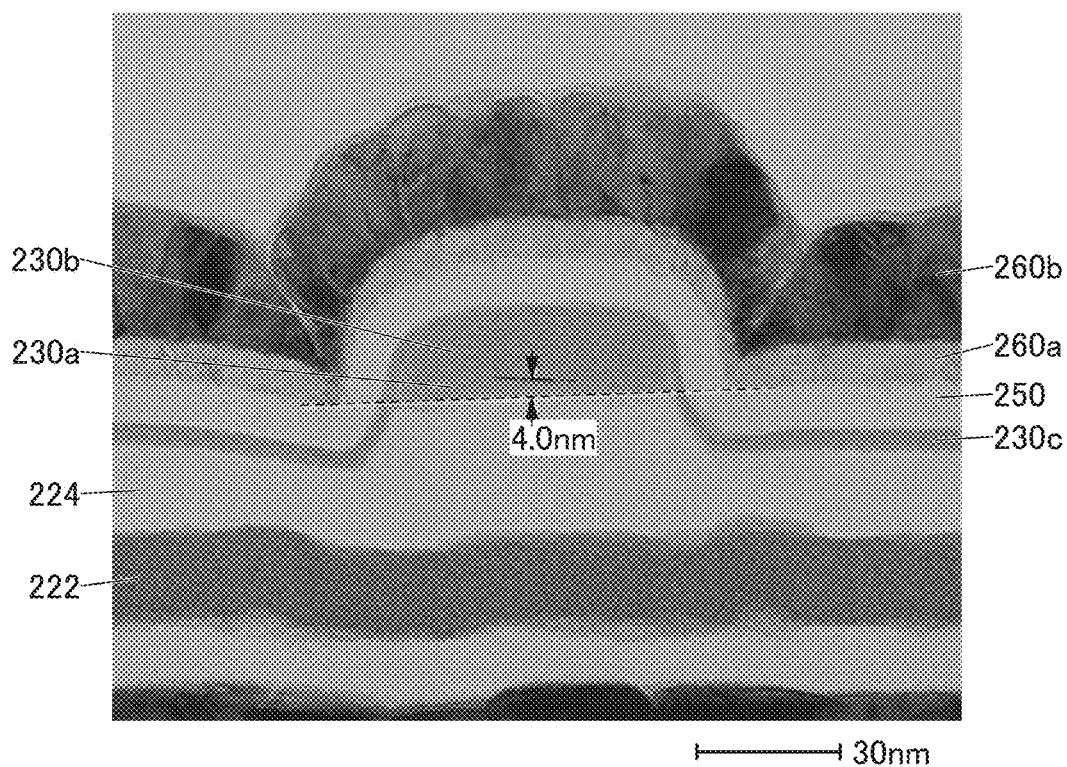
FIG. 21 A cross-sectional STEM image of Example of the present invention.

FIG. 21 is a cross-sectional STEM image in the channel width direction of the sample 1E. The dashed line in FIG. 21 indicates the level of the region of the bottom surface of the conductive layer 260a which does not overlap with the conductive layer 230b. A dashed-dotted line in FIG. 21 indicates the level of the bottom surface of the oxide 230b.

As shown in FIG. 21, the bottom surface of the oxide 230b is positioned above the region of the bottom surface of the conductive layer 260a which does not overlap with the oxide 230b. When the level of the region of the bottom surface of the conductive layer 260a which does not overlap with the oxide 230b is regarded as a reference, the level of the bottom surface of the oxide 230b was 4.0 nm.

This embodiment can be implemented in an appropriate combination with the structures described in the other embodiments, examples, and the like.

REFERENCE NUMERALS

BGE: conductive layer, BGI1: insulating layer, BGI2: insulating layer, BGI3: insulating layer, DE: conductive layer, SE: conductive layer, SEM1: semiconductor layer, SEM2: semiconductor layer, SEM3: semiconductor layer, TGE: conductive layer, TGI: insulating layer, 200A: transistor, 200B: transistor, 200C: transistor, 200D: transistor, 200E: transistor, 203: conductive layer, 205: conductive layer, 205a: conductive layer, 205b: conductive layer, 210: insulating layer, 212: insulating layer, 214: insulating layer, 216: insulating layer, 220: insulating layer, 222: insulating layer, 224: insulating layer, 230: oxide, 230a: oxide, 230b: oxide, 230c: oxide, 231: region, 231a: region, 231b: region, 242: conductive layer, 242a: conductive layer, 242b: conductive layer, 244: insulating layer, 245: insulating layer, 246: conductive layer, 246a: conductive layer, 246b: conductive layer, 247: conductive layer, 247a: conductive layer, 247b: conductive layer, 250: insulating layer, 252: metal oxide, 260: conductive layer, 260a: conductive layer, 260b: conductive layer, 270: insulating layer, 271: insulating layer, 273: insulating layer, 274: insulating layer, 275: insulating layer, 276: insulating layer, 276a: insulating layer, 276b: insulating layer, 280: insulating layer, 282: insulating layer, 284: insulating layer, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 1200: chip, 1201: PCB, 1202: bump, 1203: motherboard, 1204: GPU module, 1211: CPU, 1212: GPU, 1213: analog arithmetic unit, 1214: memory controller, 1215: interface, 1216: network circuit, 1221: DRAM, 1222: flash memory, 1400: memory device, 1411: peripheral circuit, 1420: row circuit, 1430: column circuit, 1440: output circuit, 1460: control logic circuit, 1470: memory cell array, 1471: memory cell, 1472: memory cell, 1473: memory cell, 1474: memory cell, 1475: memory cell, 1476: memory cell, 1477: memory cell, 1478: memory cell, 5200: portable game machine, 5201: housing, 5202: display portion, 5203: button, 5300: desktop information terminal, 5301: main body, 5302: display, 5303: keyboard, 5500: information terminal, 5510: housing, 5511: display portion, 5600: TV, 5650: antenna, 5670: radio wave tower, 5675A: radio wave, 5675B: radio wave, 5680: broadcast station, 5700: automobile, 5701: display panel, 5702: display panel, 5703: display panel, 5704: display panel, 5800: electric refrigerator-freezer, 5801: housing, 5802: refrigerator door, 5803: freezer door

The invention claimed is:

1. A semiconductor device comprising a transistor, and the transistor comprising:
a first conductive layer;
a first insulating layer over the first conductive layer;
a second insulating layer over the first insulating layer;
a first oxide over the second insulating layer;
a second oxide over the first oxide;
a third oxide over the second oxide;
a third insulating layer over the third oxide;

a second conductive layer over the third insulating layer; and a fourth insulating layer, wherein the first conductive layer and the second conductive layer overlap with the second oxide, wherein side surfaces of the second conductive layer, the third insulating layer, and the third oxide are substantially aligned, wherein the fourth insulating layer is in contact with the side surfaces of the second conductive layer, the third insulating layer, and the third oxide, and wherein in a channel width direction of the transistor, a bottom surface of the second oxide is below a region of a bottom surface of the second conductive layer, wherein the region of the bottom surface of the second conductive layer does not overlap with the second oxide and the first oxide, and wherein when a level of the region of the bottom surface of the second conductive layer is regarded as a reference, a level of the bottom surface of the second oxide from the reference is more than or equal to −5 nm to less than 0 nm.

2. The semiconductor device according to claim 1, wherein a side surface of the second insulating layer is substantially aligned with side surfaces of the first oxide and the second oxide, and wherein the third oxide is in contact with a top surface of the second insulating layer.

3. The semiconductor device according to claim 1, wherein, when a level of a bottom surface of the first insulating layer is regarded as a reference, a level of a first region of a top surface of the second insulating layer which overlaps with the second oxide is higher than a level of a second region of the top surface of the second insulating layer which does not overlap with the second oxide.

4. A semiconductor device comprising a transistor, and the transistor comprising:
a first conductive layer;
a first insulating layer over the first conductive layer;
a second insulating layer over the first insulating layer;
a first oxide over the second insulating layer;
a second oxide over the first oxide;
a third oxide over the second oxide;
a third insulating layer over the third oxide;
a second conductive layer over the third insulating layer;
a third conductive layer and a fourth conductive layer over the second oxide;
a fifth conductive layer over the third conductive layer; and
a sixth conductive layer over the fourth conductive layer, wherein the first conductive layer and the second conductive layer overlap with the second oxide, wherein the fifth conductive layer is in contact with a side surface of the third conductive layer on a second conductive layer side, and in contact with a top surface of the second oxide, wherein the sixth conductive layer is in contact with a side surface of the fourth conductive layer on the second conductive layer side, and in contact with the top surface of the second oxide, wherein, in a channel width direction of the transistor, a bottom surface of the second oxide is below a first region of a bottom surface of the second conductive layer, wherein the first region of the bottom surface of the second conductive layer does not overlap with the second oxide and the first oxide, and wherein, when a level of the first region of the bottom surface of the second conductive layer is regarded as a reference, a level of the bottom surface of the second oxide from the reference is more than or equal to −5 nm to less than 0 nm.

5. The semiconductor device according to claim 4, wherein in a cross section in a channel length direction of the transistor, when a level of a bottom surface of the first insulating layer is regarded as a reference, a level of a second region of the bottom surface of the second conductive layer which overlaps with the second oxide is less than or equal to a level of a top surface of the third conductive layer.

6. The semiconductor device according to claim 4,
wherein a side surface of the second insulating layer is substantially aligned with side surfaces of the first oxide and the second oxide, and wherein the third oxide is in contact with a top surface of the first insulating layer.

7. The semiconductor device according to claim 4,
wherein when a level of a bottom surface of the first insulating layer is regarded as a reference, a level of a first region of a top surface of the second insulating layer which overlaps with the second oxide is higher than a level of a second region of the top surface of the second insulating layer which does not overlap with the second oxide.

8. A semiconductor device comprising a transistor, and the transistor comprising:
a first gate electrode;
a first insulating layer over the first gate electrode;
a second insulating layer over the first insulating layer;
a first oxide semiconductor layer over the second insulating layer;
a second oxide semiconductor layer over the first oxide semiconductor layer;
a third oxide semiconductor layer over the second oxide semiconductor layer;
a third insulating layer over the third oxide semiconductor layer; and
a second gate electrode over the third insulating layer, wherein in a channel width direction of the transistor, a bottom surface of the second oxide semiconductor layer is below a region of a bottom surface of the second gate electrode, wherein the region of the bottom surface of the second gate electrode does not overlap with the second oxide semiconductor layer and the first oxide semiconductor layer, and wherein when a level of the region of the bottom surface of the second gate electrode is regarded as a reference, a level of the bottom surface of the second oxide semiconductor layer from the reference is more than or equal to −10 nm to less than 0 nm.

9. The semiconductor device according to claim 8,
wherein a side surface of the second insulating layer is substantially aligned with side surfaces of the first oxide semiconductor layer and the second oxide semiconductor layer, and wherein the third oxide semiconductor layer is in contact with a top surface of the second insulating layer.

10. The semiconductor device according to claim 8,
wherein, when a level of a bottom surface of the first insulating layer is regarded as a reference, a level of a first region of a top surface of the second insulating layer is higher than a level of a second region of the top surface of the second insulating layer, and wherein the first region of the top surface of the second insulating layer overlap with the second oxide semiconductor layer and the second region of the top surface of the second insulating layer does not overlap with the second oxide semiconductor layer.

* * * * *